(12) United States Patent
Snyder

(10) Patent No.: US 9,286,254 B2
(45) Date of Patent: Mar. 15, 2016

(54) MICROCONTROLLER PROGRAMMABLE SYSTEM ON A CHIP WITH PROGRAMMABLE INTERCONNECT

(71) Applicant: Cypress Semiconductor Corporation, San Jose, CA (US)

(72) Inventor: Warren S. Snyder, Snohomish, WA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 144 days.

(21) Appl. No.: 13/966,028

(22) Filed: Aug. 13, 2013

(65) Prior Publication Data

US 2014/0095757 A1 Apr. 3, 2014

Related U.S. Application Data

(63) Continuation of application No. 13/169,656, filed on Jun. 27, 2011, now Pat. No. 8,555,032, which is a continuation of application No. 10/033,027, filed on Oct. 22, 2001, now Pat. No. 8,176,296.

(60) Provisional application No. 60/243,708, filed on Oct. 26, 2000.

(51) Int. Cl.
*G06F 15/78* (2006.01)
*G06F 13/40* (2006.01)
(Continued)

(52) U.S. Cl.
CPC *G06F 13/40* (2013.01); *G06F 1/08* (2013.01); *G06F 1/32* (2013.01); *G06F 15/7867* (2013.01); *G06G 7/06* (2013.01); *H03B 5/364* (2013.01); *H03H 19/004* (2013.01); *H03K 3/012* (2013.01); *H03K 3/014* (2013.01); *H03K 3/02315* (2013.01)

(58) Field of Classification Search
None
See application file for complete search history.

(56) References Cited

U.S. PATENT DOCUMENTS

| 4,138,671 A | 2/1979 | Comer et al. |
| 4,608,502 A | 8/1986 | Dijkmans et al. |

(Continued)

FOREIGN PATENT DOCUMENTS

| WO | 9532478 A | 11/1995 |
| WO | 9532481 A | 11/1995 |

OTHER PUBLICATIONS

Fasang. P.P. et al., Design for Testability for Mixed Analog/Digital ASICs, 1988, IEEE. 4 pages.

(Continued)

*Primary Examiner* — Eric Coleman

(57) ABSTRACT

Embodiments of the present invention are directed to a microcontroller device having a microprocessor, programmable memory components, and programmable analog and digital blocks. The programmable analog and digital blocks are configurable based on programming information stored in the memory components. Programmable interconnect logic, also programmable from the memory components, is used to couple the programmable analog and digital blocks as needed. The advanced microcontroller design also includes programmable input/output blocks for coupling selected signals to external pins. The memory components also include user programs that the embedded microprocessor executes. These programs may include instructions for programming the digital and analog blocks "on-the-fly," e.g., dynamically. In one implementation, there are a plurality of programmable digital blocks and a plurality of programmable analog blocks.

20 Claims, 40 Drawing Sheets

(51) Int. Cl.

| | | |
|---|---|---|
| *G06F 1/08* | (2006.01) | |
| *G06F 1/32* | (2006.01) | |
| *G06G 7/06* | (2006.01) | |
| *H03B 5/36* | (2006.01) | |
| *H03H 19/00* | (2006.01) | |
| *H03K 3/012* | (2006.01) | |
| *H03K 3/014* | (2006.01) | |
| *H03K 3/0231* | (2006.01) | |

(56) References Cited

U.S. PATENT DOCUMENTS

| | | |
|---|---|---|
| 4,794,558 A | 12/1988 | Thompson |
| 4,802,119 A | 1/1989 | Heene et al. |
| 5,107,146 A | 4/1992 | El-Ayat |
| 5,196,740 A | 3/1993 | Austin |
| 5,202,687 A | 4/1993 | Distinti |
| 5,248,843 A | 9/1993 | Billings |
| 5,276,890 A | 1/1994 | Arai |
| 5,426,378 A | 6/1995 | Ong |
| 5,457,410 A | 10/1995 | Ting |
| 5,481,471 A | 1/1996 | Naglestad et al. |
| 5,563,526 A | 10/1996 | Hastings et al. |
| 5,600,262 A | 2/1997 | Kolze |
| 5,633,766 A | 5/1997 | Hase et al. |
| 5,642,295 A | 6/1997 | Smayling |
| 5,703,871 A | 12/1997 | Pope et al. |
| 5,712,969 A | 1/1998 | Zimmermann et al. |
| 5,748,875 A | 5/1998 | Tzori |
| 5,754,826 A | 5/1998 | Gamal et al. |
| 5,815,505 A * | 9/1998 | Mills ............................ 370/522 |
| 5,826,093 A * | 10/1998 | Assouad et al. ................ 712/43 |
| 5,894,565 A | 4/1999 | Furtek et al. |
| 5,900,780 A | 5/1999 | Hirose et al. |
| 5,939,949 A | 8/1999 | Olgaard et al. |
| 5,973,368 A | 10/1999 | Pearce et al. |
| 6,018,559 A | 1/2000 | Azegami et al. |
| 6,051,772 A | 4/2000 | Cameron et al. |
| 6,079,985 A | 6/2000 | Wohl et al. |
| 6,144,327 A | 11/2000 | Distinti et al. |
| 6,148,441 A | 11/2000 | Woodward |
| 6,157,270 A | 12/2000 | Tso |
| 6,166,367 A | 12/2000 | Cho |
| 6,185,450 B1 | 2/2001 | Seguine et al. |
| 6,188,381 B1 | 2/2001 | van der Wal et al. |
| 6,191,660 B1 | 2/2001 | Mar et al. |
| 6,304,101 B1 | 10/2001 | Nishihara |
| 6,373,954 B1 | 4/2002 | Malcolm, Jr. et al. |
| 6,460,172 B1 | 10/2002 | Insenser Farre et al. |
| 6,701,340 B1 | 3/2004 | Gorecki et al. |
| 6,724,220 B1 | 4/2004 | Snyder et al. |
| 6,774,644 B2 | 8/2004 | Eberlein |
| 6,788,521 B2 | 9/2004 | Nishi |
| 6,850,117 B2 | 2/2005 | Weber et al. |
| 6,903,402 B2 | 6/2005 | Miyazawa |
| 6,904,570 B2 | 6/2005 | Foote et al. |
| 6,949,811 B2 | 9/2005 | Miyazawa |
| 6,969,978 B2 | 11/2005 | Dening |
| 6,971,004 B1 | 11/2005 | Pleis et al. |
| 6,975,123 B1 | 12/2005 | Malang et al. |
| 6,981,090 B1 | 12/2005 | Kutz et al. |
| 7,017,409 B2 | 3/2006 | Zielinski et al. |
| 7,023,215 B2 | 4/2006 | Steenwyk |
| 7,026,861 B2 | 4/2006 | Steenwyk |
| 7,030,513 B2 | 4/2006 | Caldwell |
| 7,030,782 B2 | 4/2006 | Ely et al. |
| 7,109,978 B2 | 9/2006 | Gillespie et al. |
| 7,133,140 B2 | 11/2006 | Lukacs et al. |
| 7,133,793 B2 | 11/2006 | Ely et al. |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,151,528 B2 | 12/2006 | Taylor et al. |
| 7,212,189 B2 | 5/2007 | Shaw et al |
| 7,287,112 B1 | 10/2007 | Pleis et al. |
| 7,288,977 B2 | 10/2007 | Stanley |
| 7,298,124 B2 | 11/2007 | Kan et al. |
| 7,466,307 B2 | 12/2008 | Trent, Jr. et al. |
| 8,358,150 B1 | 1/2013 | Snyder et al. |
| 8,487,655 B1 | 7/2013 | Kutz et al. |
| 2002/0063688 A1 | 5/2002 | Shaw et al. |
| 2002/0191029 A1 | 12/2002 | Gillespie et al. |
| 2003/0062889 A1 | 4/2003 | Ely et al. |
| 2003/0080755 A1 | 5/2003 | Kobayashi |
| 2005/0024341 A1 | 2/2005 | Gillespie et al. |
| 2006/0032680 A1 | 2/2006 | Elias et al. |
| 2006/0097991 A1 | 5/2006 | Hotelling et al. |

OTHER PUBLICATIONS

Milor, Linda S., A Tutorial Introduction to Research on Analog and Mixed-Signal Circuit Testing., 1998, IEEE, 19 pages.
USPTO Advisory Action for U.S. Appl. No. 11/799,439 dated Mar. 20, 2009; 3 pages.
USPTO Final Rejection for U.S. Appl. No. 10/033,027 dated Jun. 8, 2007; 8 pages.
USPTO Final Rejection for U.S. Appl. No. 10/033,027 dated Aug. 9, 2006; 6 pages.
USPTO Final Rejection for U.S. Appl. No. 10/033,027 dated Oct. 31, 2005; 24 pages.
USPTO Final Rejection for U.S. Appl. No. 11/799,439 dated Dec. 18, 2008; 6 pages.
USPTO Non Final Rejection for U.S. Appl. No. 10/033,027 dated Apr. 20, 2005; 20 pages.
USPTO Non Final Rejection for U.S. Appl. No. 10/033,027 dated Oct. 18, 2004; 17 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Non-Final Rejection for U.S. Appl. No. 10/033,027 dated Mar. 15, 2011; 6 pages.
USPTO Non-Final Rejection for U.S. Appl. No. 10/033,027 dated Apr. 26, 2006; 26 pages.
USPTO Non-Final Rejection for U.S. Appl. No. 10/033,027 dated Dec. 18, 2008; 5 pages.
USPTO Non-Final Rejection for U.S. Appl. No. 10/033,027 dated Dec. 21, 2006; 31 pages.
USPTO Non-Final Rejection for U.S. Appl. No. 11/799,439 dated May 29, 2008; 8 pages.
USPTO Non-Final Rejection for U.S. Appl. No. 11/799,439 dated Nov. 2, 2007; 7 pages.
USPTO Non-Final Rejection for U.S. Appl. No. 12/902,137 dated Mar. 11, 2011; 9 pages.
USPTO Non-Final Rejection for U.S. Appl. No. 13/169,656 dated Sep. 13, 2012; 11 pages.
USPTO Notice of Allowance for U.S. Appl. No. 09/893,048 dated Jul. 25, 2006; 4 pages.
USPTO Notice of Allowance for U.S. Appl. No. 09/924,734 dated Feb. 5, 2003; 4 pages.
USPTO Notice of Allowance for U.S. Appl. No. 10/033,027 dated Feb. 18, 2010; 4 pages.
USPTO Notice of Allowance for U.S. Appl. No. 10/033,027 dated Mar. 31, 2009; 7 pages.
USPTO Notice of Allowance for U.S. Appl. No. 10/033,027 dated Jun. 29, 2010; 4 pages.
USPTO Notice of Allowance for U.S. Appl. No. 10/033,027 dated Aug. 18, 2011; 5 pages.
USPTO Notice of Allowance for U.S. Appl. No. 10/033,027 dated Sep. 2, 2009; 4 pages.
USPTO Notice of Allowance for U.S. Appl. No. 10/033,027 dated Oct. 15, 2010; 4 pages.
USPTO Notice of Allowance for U.S. Appl. No. 10/033,027 dated Dec. 13, 2011; 5 pages.
USPTO Notice of Allowance for U.S. Appl. No. 11/799,439 dated Feb. 5, 2012; 4 pages.

(56) References Cited

OTHER PUBLICATIONS

USPTO Notice of Allowance for U.S. Appl. No. 11/799,439 dated Jun. 1, 2010; 4 pages.
USPTO Notice of Allowance for U.S. Appl. No. 11/799,439 dated Jun. 25, 2009; 6 pages.
USPTO Notice of Allowance for U.S. Appl. No. 11/799,439 dated Sep. 13, 2010; 4 pages.
USPTO Notice of Allowance for U.S. Appl. No. 11/799,439 dated Oct. 13, 2009; 4 pages.
USPTO Notice of Allowance for U.S. Appl. No. 12/902,137 dated Aug. 5, 2011; 7 pages.
USPTO Notice of Allowance for U.S. Appl. No. 13/169,656 dated Mar. 25, 2013; 6 pages.
USPTO Notice of Allowance for U.S. Appl. No. 13/169,656 dated Jul. 9, 2013; 9 pages.
USPTO Notice of Allowance for U.S. Appl. No. 13/169,656, dated Jan. 17, 2013; 7 pages.
U.S. Appl. No. 12/773,801 "Debug Through Power Down," Amsby Richardson Jr et al., filed May 4, 2010; 120 pages.
USPTO Final Rejection for U.S. Appl. No. 13/328,385 dated Jul. 2, 2013; 5 pages.
USPTO Non Final Rejection for U.S. Appl. No. 13/328,385 dated Apr. 2, 2013; 8 pages.
USPTO Non-Final Rejection for U.S. Appl. No. 09/924,734 dated May 8, 2002; 6 pages.
USPTO Non-Final Rejection for U.S. Appl. No. 09/924,734 dated Jun. 11, 2003; 7 pages.
USPTO Non-Final Rejection for U.S. Appl. No. 10/803,030 dated Jun. 8, 2005; 4 pages.
USPTO Notice of Allowance for U.S. Appl. No. 09/924,734 dated Jan. 31, 2003; 6 pages.
USPTO Notice of Allowance for U.S. Appl. No. 09/924,734 dated Nov. 17, 2003; 6 pages.
USPTO Notice of Allowance for U.S. Appl. No. 10/803,030 dated Jan. 8, 2007; 6 pages.
USPTO Notice of Allowance for U.S. Appl. No. 13/328,385 dated Sep. 23, 2013; 8 pages.
USPTO Notice of Allowance for U.S. Appl. No. 14/283,888 dated May 7, 2015; 9 pages.

* cited by examiner

MICROCONTROLLER PROGRAMMABLE SYSTEM ON A CHIP WITH PROGRAMMABLE INTERCONNECT

RELATED APPLICATIONS

This application is a continuation of U.S. patent application Ser. No. 13/169,656, filed Jun. 27, 2011, which is a continuation of U.S. patent application Ser. No. 10/033,027, filed Oct. 22, 2001, now U.S. Pat. No. 8,176,296, issued May 8, 2012, which claims the benefit of U.S. Provisional Patent Application No. 60/243,708, filed Oct. 26, 2000, all of which are incorporated by reference herein in their entirety.

TECHNICAL FIELD

The present invention relates to the field of microcontrollers. Specifically, embodiments of the invention relate to a microcontroller system on a chip, with architecture effectuating both analog and digital programmable circuits.

BACKGROUND

Microcontrollers have become commonplace in the thirty years since their introduction. They have all but replaced mechanical and electromechanical components in the area of control over "real world" activities. For applications now controlled by microcontrollers, control functions therein are now much more functional, reliable, and economical.

Major improvements in microcontroller design since their introduction have made them nearly ubiquitous in modern control applications. The in-circuit emulator improved debugging and the integration of hardware and software. Embedded application development effectuated by C and other compilers has reduced software development time and allowed much larger programs and concomitantly more complex applications. One time programmability (OTP) of microcontrollers extended their utility, particularly for highly specialized and/or low volume applications. Programmability also improved the development cycle for users of microcontrollers.

Microcontrollers have embedded processors, memories, power sources, voltage references, voltage/power and temperature sensors, timers, oscillators, and other circuits. Various microcontrollers have differing features, including capacities. The 8-bit microcontrollers are an extremely useful, common, and well-populated class.

Contemporarily, there are thousands of different 8-bit microcontrollers from a number of sources. Nevertheless, selecting a microcontroller for a particular application and/or matching a particular microcontroller to a specific application remains a challenge. First, selecting a particular microcontroller from the many available can be confusing and tedious. After a selection is made, changing design requirements, engineering solutions, and/or unexpected higher capacity requirements often require scrapping the original selection and repeating the confusing and tedious selection process.

Conventionally, these problems may be addressed by custom designing a microcontroller with a "perfect," e.g., exact, particular combination of required peripheral functionalities, and no surplusage, incorporating all needed functions, and eliminating a requirement for any external chips. This is demanding of time and resources, because it requires custom design and manufacturing operations for each selected application. It is expensive, in as much as it can take no advantage of the usual electronics industry economies of scale, which otherwise typically hold electronic prices at reasonably low levels.

Microcontrollers effectuate a wide range of applications in modem electronic installations into which they are functionally integrated. One major microcontroller utilization is the embedded system application. Most embedded system applications interface to the "real world." This real world is analog in nature, and most microcontrollers interfacing with it offer an analog to digital (A/D) converter; true analog peripherals are rare. However, many microcontroller designs with real world interfacing embedded systems require that analog signals be multiplied, filtered, or otherwise conditioned before conversion to digital. While conventional analog functional components are available for use with microcontrollers, they are custom components and still require a separate microcontroller and an effective electrical coupling and signal synchronization and transfer modality to effectuate their use therewith. This is inefficient and costly.

Microcontrollers have a number of components to effectuate device application. Such components in conventional microcontrollers have fixed functions, which are disadvantageous in two major ways. First, in selecting a microcontroller for a particular application, it must be known in advance precisely which functions are required to effectuate that application and that this functional requirement is static. Second, specifying any particular function carries a cost, in as much as that function is static. The following example illustrates this second limitation.

A conventional microcontroller with "off the shelf" availability is selected for a particular application because it has a timer functionality, required by the application for which it is to be used. To effectuate this particular microcontroller's timer functionality, the microcontroller has two integrated timing components. However, the application at hand may be effectuated by the microcontroller if it had only a single timer component. This is wasteful of chip resources, power and computing demands, etc. Yet finding an exact, or even closer match from the finite supply of available microcontrollers with off the shelf availability is difficult and time consuming.

This limitation can be offset by negotiation with the microcontroller manufacturer for a custom designed and built chip, or the user, seeking the microcontroller for the particular application at hand may continue to search for another microcontroller with off the shelf availability, having components more closely matching the requirements of the application at hand. However, as discussed above, either of these solutions is also costly in terms of time, resources, and/or expense.

Further, microcontrollers employing conventional component technology have individual characteristic spectra of application, which are typically rather limited and static. Often, particular microcontrollers have rather precisely defined design functionalities, which are static and unchangeable, or changeable only in rather limited ways. Thus in this regard, conventional microcontrollers applications are inherently one dimensional and inflexible. This is also true of other circuits, such as an application specific integrated circuit (ASIC).

Conventional microcontrollers themselves are not reconfigurable to any convenient degree. A relatively small fraction of available conventional microcontrollers, and those implementing very general functions, have some degree of reconfigurability. However, the degree of reconfigurability is very limited. For example, one particular type of conventional microcontrollers implementing very general functions includes logic devices such as programmable gate arrays.

Programmable gate arrays typically are characterized by very fine grained logic architectures.

In so far as programmable gate arrays are reconfigurable at all, their reconfiguration is a static process, requiring a programmable gate array being so reconfigured to be out of service during the process, which takes an inordinate amount of time and requires a heavy price in computational resources. This is because the fine grain architecture of the programmable gate array being reconfigured demands thousands, for some common reconfigurations even millions of bits of information to be written, for each and every logic block requiring re-writing to effectuate the reconfiguration.

The conventional art is problematic because it generally fails to address the limitations of individual microcontroller and integrated circuit (IC) applicability and flexibility, and configurablity and programmability. Where reconfigurability is possible at all in conventional microcontrollers and ICs, it is typically achieved statically, with the microcontroller or IC out of service, to a very limited degree, and requires relatively long times and informational input to achieve. Custom designed analog-based devices are coupled with microcontrollers and/or ICs in such a way as to harmonize their operations in particular microcontroller/IC applications requiring analog functionality. Contemporary solutions to these problems using conventional resources are inadequate because of the time and effort required for custom choosing a particular conventional microcontroller/IC design for a certain application from a relatively limited field, resource costs of functionalities selected in the conventional microcontrollers/ICs selected, and the inordinate expense of custom chips, such as ASICs.

SUMMARY

What is needed is a method of integrating a system with a microcontroller and integrated circuits (IC) on a single chip to effectuate a system on a chip, including analog functionality, and/or a system so integrated with a microcontroller and/or other IC. What is also needed is a system on a chip, which has sufficient flexibility to function in a very wide range of multiple applications, including applications wherein integrated analog functionalities are required. Further, what is needed is a method of programming and dynamically reconfiguring a system on a chip, and a system on a chip which is so programmable and dynamically reconfigurable. Further still, what is needed is a system on a chip, which achieves the foregoing advantages and yet is relatively inexpensive and simple to configure, apply, use, and reconfigure.

Embodiments of the present invention provide an integrated system with a microcontroller and integrated circuits (IC), on a single chip to effectuate a system on a chip, including programmable analog and digital functionality and a microprocessor, and a method of configuring such an integrated system. The present invention also provides a system on a chip, which has sufficient flexibility to function in a very wide range of multiple applications, including applications wherein integrated analog functionalities are required. Further, the present invention provides a method of programming and dynamically reconfiguring a system on a chip, and a system on a chip, which is so programmable and dynamically reconfigurable. Further still, the present invention provides a system on a chip, which achieves the foregoing advantages and yet is relatively inexpensive and simple to configure, apply, use, and reconfigure.

Embodiments of the present invention are directed to a microcontroller device having a microprocessor, programmable memory components, and programmable analog and digital blocks. The programmable analog and digital blocks are configurable based on programming information stored in the memory components. Programmable interconnect logic, also programmable from the memory components, is used to couple the programmable analog and digital blocks as needed. The advanced microcontroller design also includes programmable input/output blocks for coupling selected signals to external pins. The memory components also include user programs that the embedded microprocessor executes. These programs may include instructions for programming the digital and analog blocks "on-the-fly," e.g., dynamically. In one implementation, there are a plurality of programmable digital blocks and a plurality of programmable analog blocks.

In one embodiment, the present invention provides a method of integrating a system with a microcontroller/IC on a single chip to effectuate a system on a chip, including programmable analog functionality. Another embodiment provides a system so integrated with a microcontroller/IC. In one embodiment, the present invention also provides a system on a chip which has sufficient flexibility to function in a very wide range of multiple applications, including applications wherein integrated analog functionalities are required. In the present embodiment, the system on a chip is capable of executing a wide range of applications requiring programmable mixed (analog and digital) signals. In the present embodiments, both digital and analog functionalities are effectuated in block components integrated with a microcontroller/IC on a single chip. These block components are complete functional units, each with a very large number of operations programmed within them.

In one embodiment, the present invention further provides a method of programming and dynamically reconfiguring a system on a chip, and a system on a chip, which is so programmable and dynamically reconfigurable. The programming is effectuated, in one embodiment, by firmware executing a series of instructions run by a microprocessor component of the microcontroller/IC. In one embodiment, a new microcontroller/IC programming paradigm is effectuated, wherein a user of the system on a chip loads a configuration into the functional blocks and/or programmable interconnects electrically coupling the functional blocks with each other, with other microcontroller components, and with the outside world.

In one embodiment, the programmable interconnects configure, not only the functional blocks, but also the way in which the functional blocks intercommunicate. In one embodiment, actual connection pins of the device can be configured to communicate with different internal resources, allow intercommunication via different methods and/or modalities, and actual reconfiguration of the internal structure of the device. In one embodiment, the reconfigurability features effectuate dynamic reconfiguring and programming, with no need to take the system on a chip out of service. The system on a chip can be dynamically reconfigured "on the fly," easily and in very little time. Advantageously, these features effectuate the ability to program microcontroller/IC sequences and simultaneously program unique hardware functions that are expressible via the newly configured system on a chip.

In one embodiment, the present invention provides a system on a chip, which achieves the foregoing advantages and yet is relatively inexpensive and simple to configure, apply, use, and reconfigure. The inherent great flexibility and widespread applicability of microcontroller systems on a chip of the present embodiments obviates searching, shopping, and research for the "right" microcontroller and mix of functionalities and/or design and manufacture of custom microcontroller and mix of system functionalities. Real savings in effort, time, and cost are effectuated by embodiments of the present invention.

These and other advantages of the present invention will become obvious to those of ordinary skill in the art after reading the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

In the following description of an embodiment of the present invention, reference is made to an exemplary microcontroller with an integrated system incorporated into a single functional device. It is appreciated that the exemplary microcontroller is illustrative only, and that embodiments of the present invention may be facilitated on any integrated circuit. The exemplary embodiments described herein do not, and are not meant to limit the application of embodiments of the present invention to microcontrollers, or to any specific integrated circuit device or type.

Figure 1A:
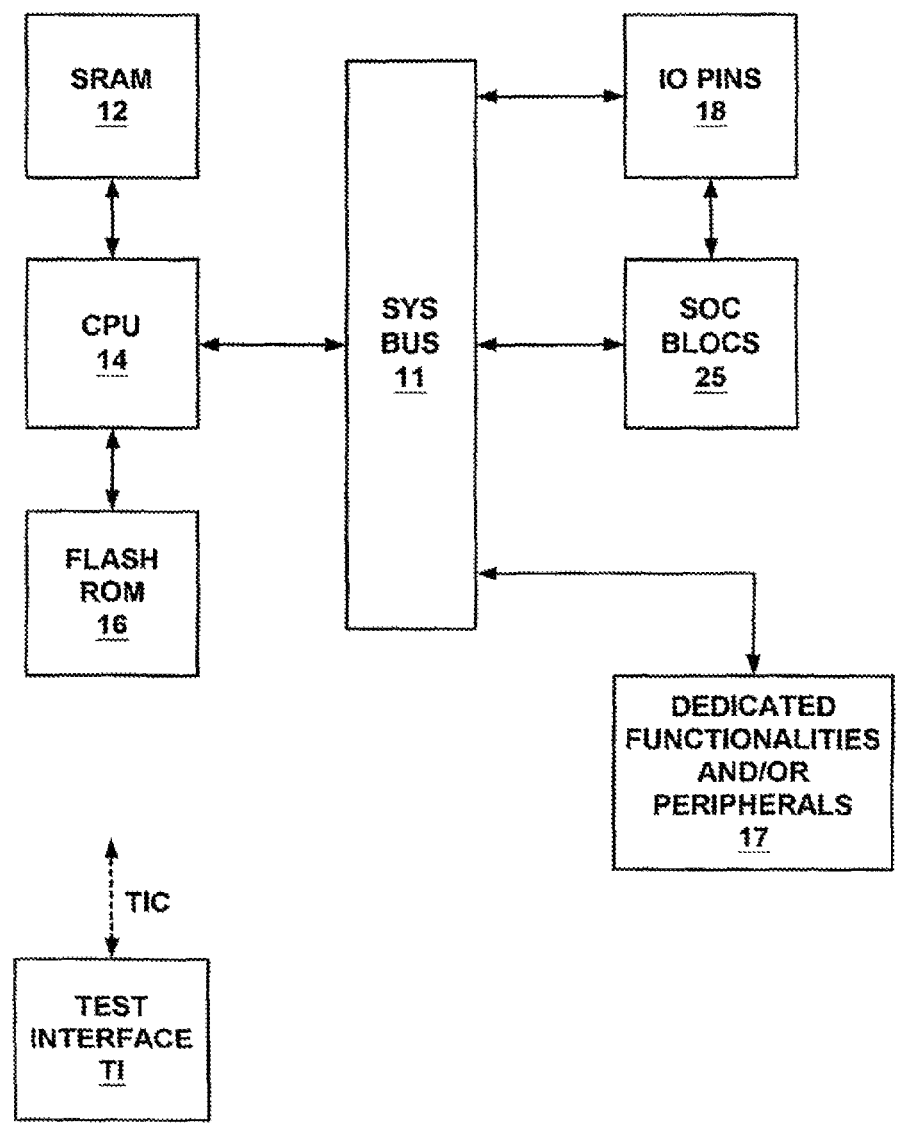
FIG. 1A is a high level block diagram showing an exemplary integrated circuit (or microcontroller) upon which embodiments of the present invention may be implemented.

FIG. 1A is a block diagram showing a high level view of an exemplary integrated circuit (or microcontroller) 10 upon which embodiments of the present invention may be implemented. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and system function blocks 25. The system function blocks 25 include both analog blocks 20, and digital blocks 100, which are further described below. A test interface TI may be coupled to integrated circuit 10 via a test interface coupler TIC, which may be detachable, to perform debugging operations during startup and initialization of the integrated circuit.

In the present embodiment, flash ROM 16 stores parameters describing microcontroller 10, allowing microcontroller 10 to be programmed during production, during system testing, or in the field. It is contemplated that microcontroller 10 may also be self-programmed remotely. System function blocks 25 are configurable system resources that can reduce the need for other microcontroller parts and external components.

Figure 1B:
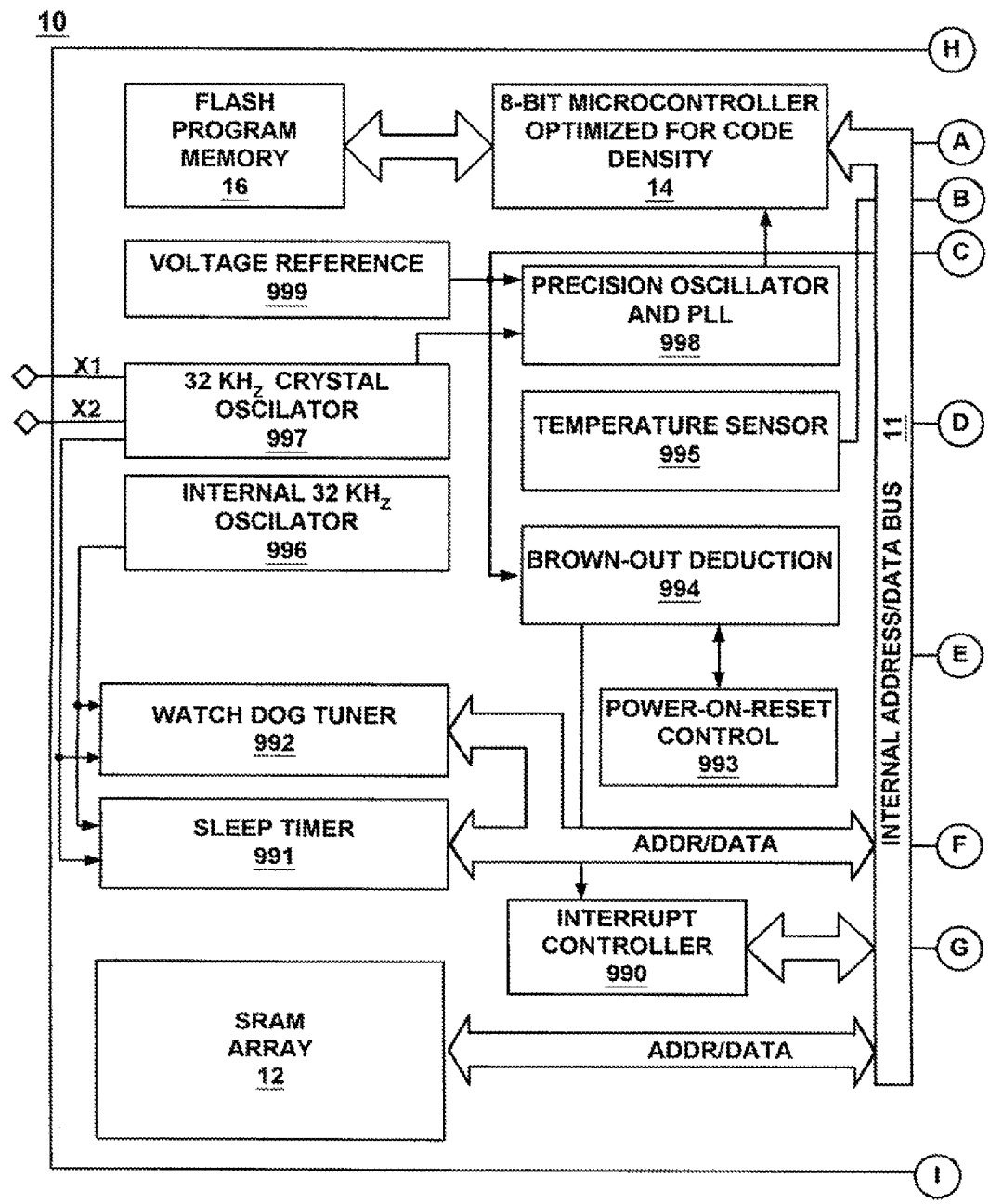
FIG. 1B is a block diagram showing in some greater detail an exemplary integrated circuit (or microcontroller) upon which embodiments of the present invention may be implemented.
Figure 1B:
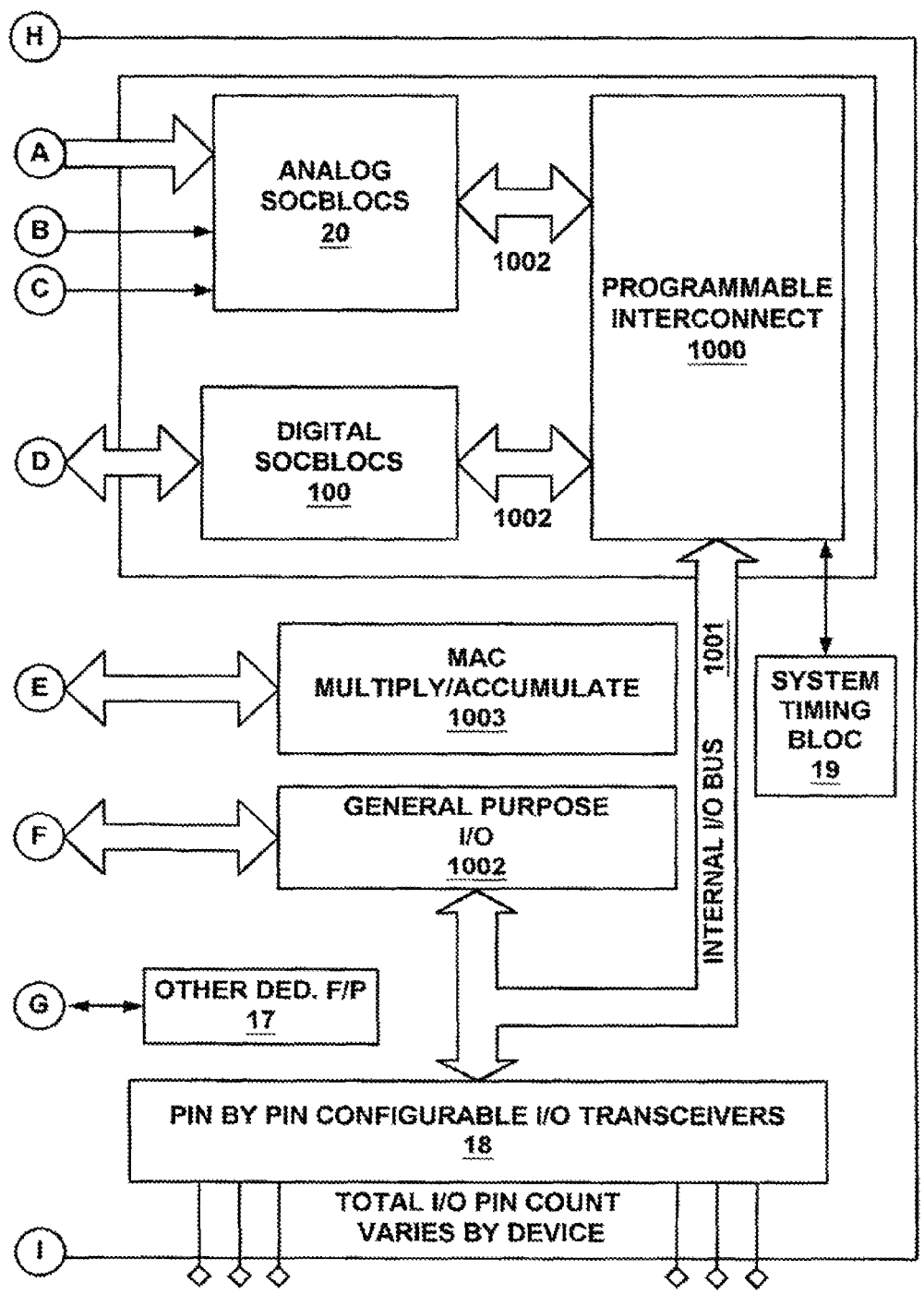

With reference to FIG. 1B, an exemplary integrated circuit (or microcontroller) 10 upon which embodiments of the present invention may be implemented is shown in greater detail. It is seen that system blocks (e.g., system on a chip, or "SoC" blocks) 25 are constituted by at least three (3) distinct functionalities. These functionalities include analog SoC blocks 20, digital SoC blocks 100, and programmable interconnects 1000. Further, it is seen that the digital SoC blocks 100 and the analog SoC blocks 20 are coupled to the programmable interconnect 1000 by intra-block routing channels 1002. The programmable interconnect 1000 is connected via an internal input/output (I/O) bus 1001 to pin by pin configurable I/O transceivers 18, which effectuate communicative coupling between system 10 and external modalities. The total pin count of pin by pin configurable 110 transceivers 18 may vary from one application to another, depending on the system device under consideration. A system timing block 19 is also coupled to programmable interconnect 19.

System timing block 19 system timing information used, among other things, for synchronizing and otherwise effectuating interfacing between system functionalities. System timing block 19, like SoC blocks 25, is programmable. Advantageously, this allows system timing block 19 to generate a myriad of different time bases, as required for any particular application the system is being configured to effectuate. These time bases may be fed into analog SoC blocks 20 and digital SoC blocks 1 DO, for use therein, via programmable interconnect 1000. Examples of analog functions requiring such time bases, executed by analog SoC blocks 20 include conversions, modulations, and the like. One striking example of a digital function requiring such time bases, executed by digital SoC blocks 100 is their universal asynchronous receiver transmitter (UART) functionality.

Figure 1C:
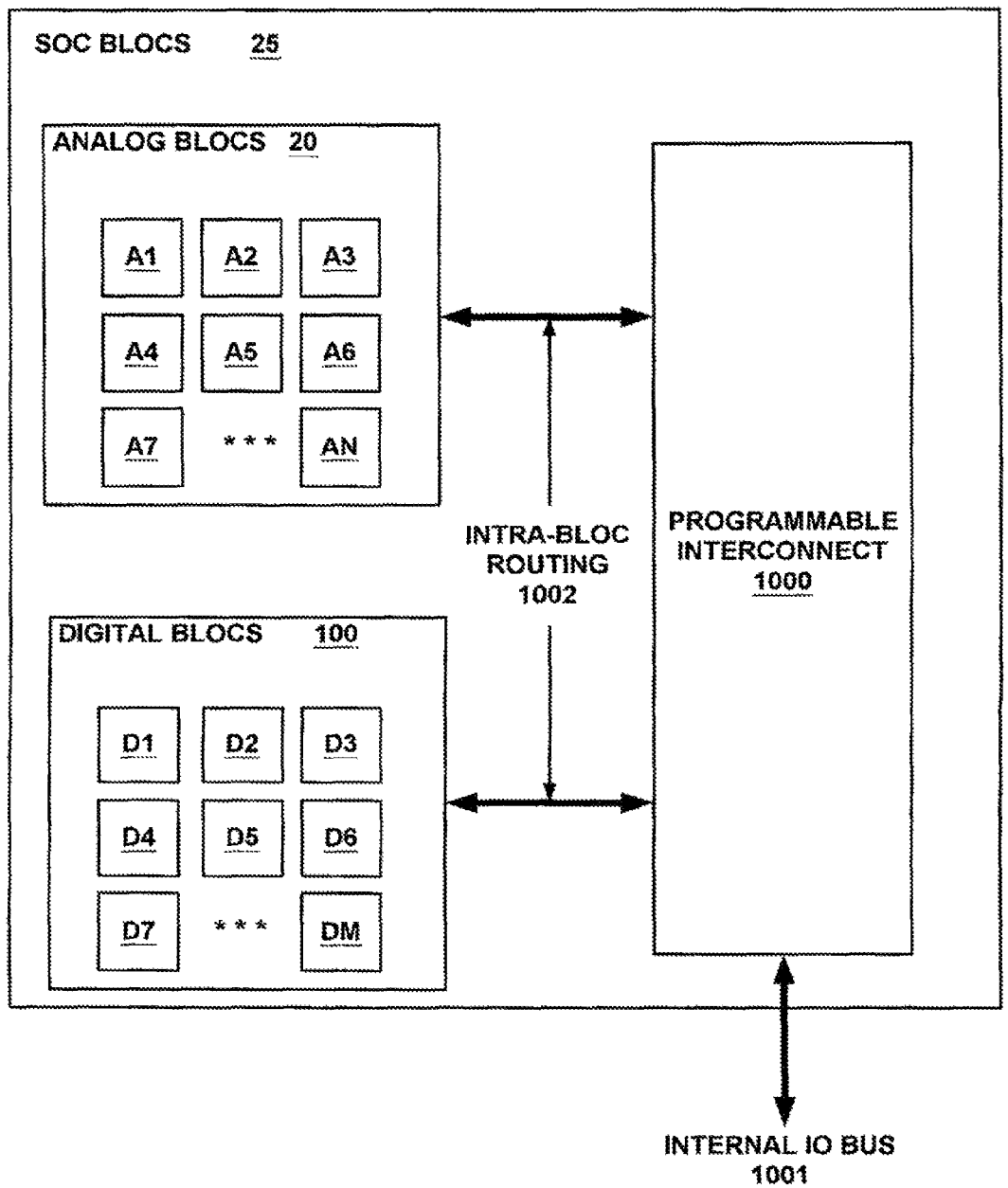
FIG. 1C is a block diagram showing in some greater detail the analog, digital, and timing blocs of an exemplary integrated circuit (or microcontroller) upon which embodiments of the present invention may be implemented.

Referring to FIG. 1C, SoC block 25 is depicted in greater detail. SoC block 25 is constituted, in one embodiment, by a distinct analog functional block 20, a distinct digital functional block 100, and a programmable interconnect 1000. Analog block 20 is seen to be constituted, in the present embodiment, by a matrix interconnecting internally N analog sub-blocks A1 through AN. The number N may be any number of analog sub-blocks required for a particular application. Likewise, digital block 100 is seen to be constituted, in the present embodiment, by a matrix interconnecting internally M digital sub-blocks D1 through DM. The number M may be any number of digital sub-blocks required for a particular application.

Figure 16:
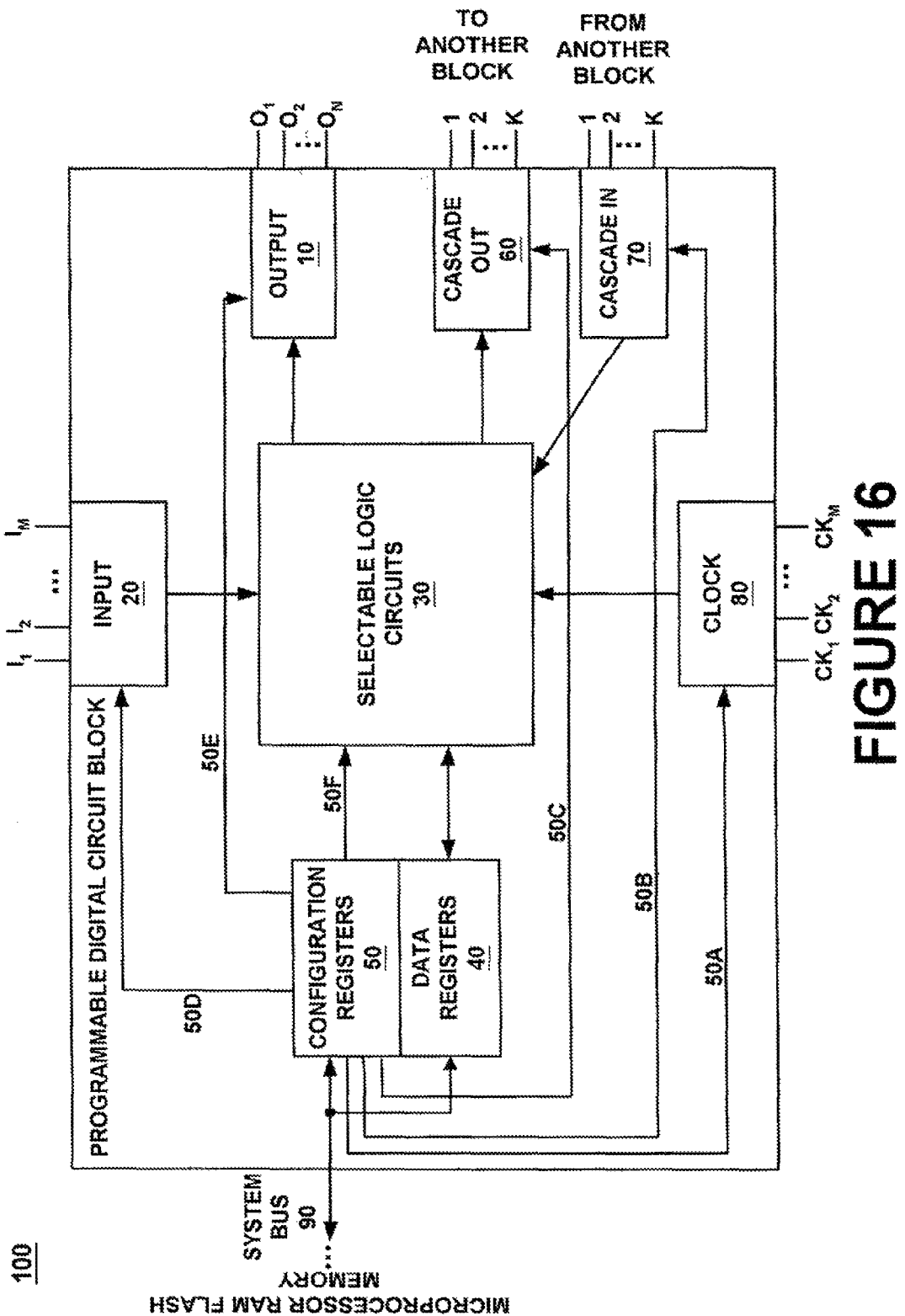
FIG. 16 illustrates a programmable digital circuit block in accordance with an embodiment of the present invention.
Figure 26:
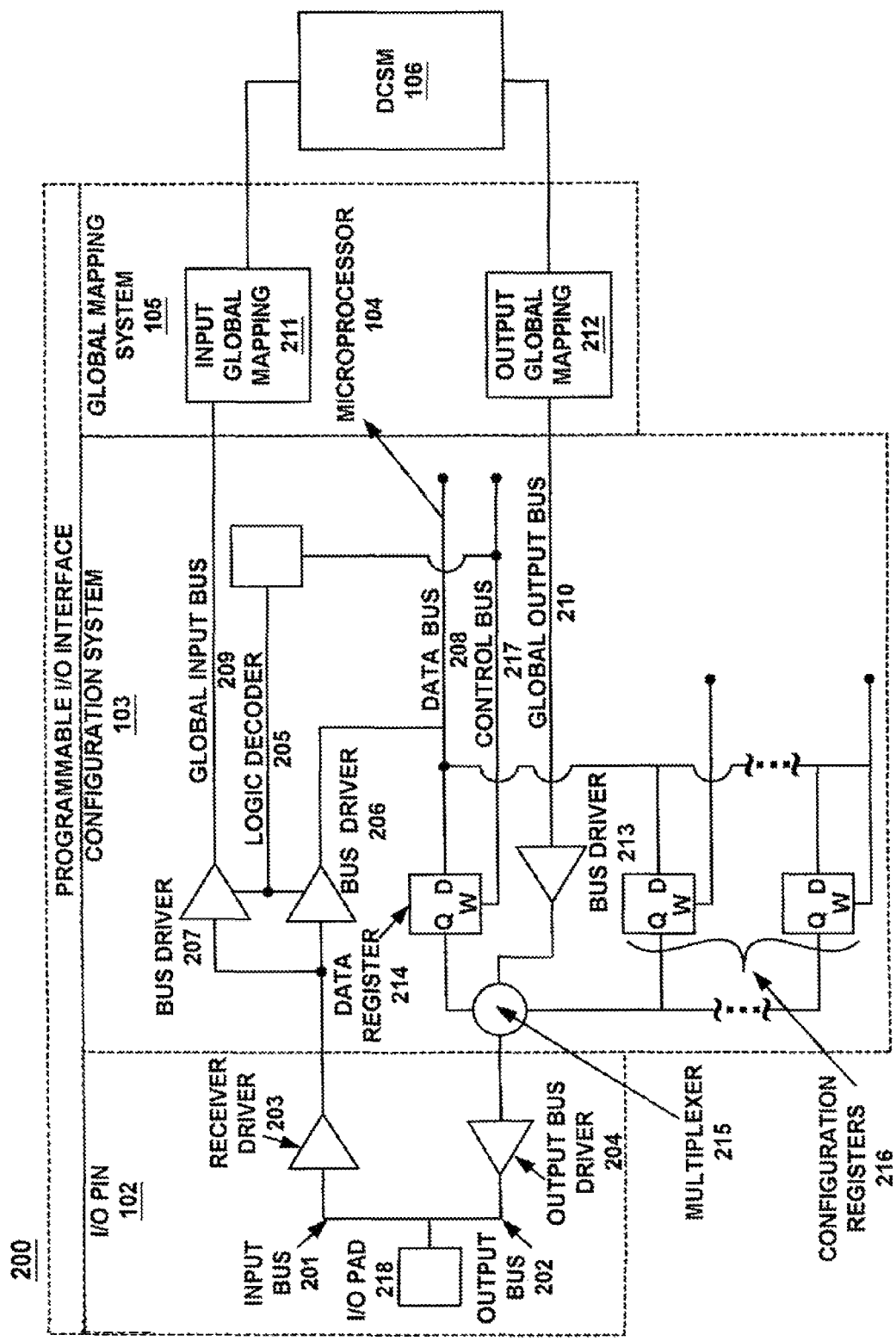
FIG. 26 is a block diagram of a configurable input/output interface as embodied by the present invention.

The internal matrices of analog blocks 20 and digital blocks 100 may be constituted, in one embodiment, partially by a routing matrix (e.g., global mapping system 105; FIG. 26). Any number of analog sub-blocks less than N may constitute registers (e.g., registers 50; FIG. 16), including configuration registers. Likewise, any number of digital sub-blocks less than M may constitute registers, including configuration registers. Configuration registers (e.g., configuration registers 50: FIG. 16), will be discussed in detail below. Analog blocks 20 and digital blocks 100 are electrically and/or communicatively coupled to programmable interconnect 1000, in the present embodiment, by intra-block routing 1002. Analog block 20 and digital block 100, having multiplicities N and M of respective sub-blocks, are effectively both pluralities of functional units with a communicatively coupling internal matrix constitution.

Thus, each individual functional unit, e.g., sub-blocks A1 through AN and D1 through DM, may communicate and interact with each and/or any other functional unit. Which functional unit communicates with which other functional unit is programmable, via the configurablity of the programmable interconnect 1000. Advantageously, this allows users to choose communicative interactions between functional units, further promoting system flexibility. It is seen that programmable interconnect 1000 has an input global mapping unit 211 and an output global mapping unit 212. The global mapping units 211 and 212 promote the configurability of the system 10 (FIGS. 1A, 1B) by mapping the communicative interaction between the functional units.

A hierarchy of programmable interconnectivity is effectuated within system 10. Pin by pin configurable I/O transceivers 18 and input and output global mapping units 211 and 212, respectively, on programmable interconnect 1000, effectuate configurable interconnectivity between the system 10 and the "outside world," as well as the microcontroller SRAM, ROM, and CPU components 12, 16, and 14, respectively (FIGS. 1A, 1B). These microcontroller components are communicated with via the system bus 11, and addressed via the programmable interconnect 1000 by the functional unit 25. Further, several sub-blocks within the analog and digital SoC blocks 20 and 100, respectively, are assigned addresses that are mapped onto system bus 11. Thus, the master computer system, e.g., the microcontroller, can re-write the blocks as memory functions, e.g., in SRAM 12.

Correspondingly, the memory function within each functional block 20 and 100 has specific functions allocated to them. These memory functionalities are registers (e.g., registers 50; FIG. 16) and will be discussed in detail below. To illustrate cursorily, one of the digital functional sub-blocks, e.g., DM, has a memory register location, which is that particular sub-block's assigned function. If the microcontroller writes into the functional register of a sub-block, it may change the function of the sub-block to another function. This is one mechanism of functional dynamic reconfigurability, and will be discussed in greater detail below.

Other blocks affect autonomous system operations, such as interrupts. Thus, it is determined by configuring it whether a block will generate an interrupt into the computer system (e.g., the microcontroller) or not. Other registers within a block determine whether a block may accept data from the I/O, or from a neighboring or distant other block. This is the function of the configuration registers (e.g., configuration registers 50: FIG. 16), to be discussed in detail below. Writing to configuration registers changes the functional operability of a block.

Analog blocks 20 and digital blocks 100 share some similarities. However, analog blocks 20 have an added parametric setting register among its sub-blocks A1 through AN. Parametric settings effectuate functionalities related to physical parameters, such as potential voltages, current amperages, and ratios which cause amperage and/or voltage transitions to occur. Parametric settings may be varied by writing into, e.g., programming the parametric setting registers. To illustrate, if a block is implementing an A/D conversion function, a voltage value that the block generates, e.g., a signal amplitude, is detected by a set of registers. Writing to, e.g., programming the appropriate parametric setting register may cause the block to change its output signal potential amplitude.

Typically, all of the configuration settings on a digital block 100 is within a small set of registers, in one embodiment four registers per block. The registers' capacity is eight bits. Special hardware within the microcontroller loads into block 100 from a table 16T within flash ROM 16 (FIG. 1A, 1B), a configuration for as many (or as few) sub-blocks D1 through DM as necessary. Thus, within a single instruction, a configuration may be transferred from flash ROM 16 to the functional block 100.

Typically, configuration is static, and all blocks can be loaded with all of the requisite configuration register data in one operation. To change a particular subset of blocks from one configuration to another, another instruction is transferred from flash ROM 16 to the appropriate blocks. This is effectuated by a hardware subsystem 14S within the microcontroller CPU 14 that directly reads from flash ROM 16, over the internal address/system data bus 11, to the appropriate locale within SoC block 25. Advantageously, this informational sequencing is quite rapid, conserving time and computational resources. This hardware 14S may be thought of as a morph transmogrifier, loading new state tables to SoC block 25 functional units designated for a new functionality.

Further, configuration registers exist for the programmable interconnect 1000, analog block 20, digital block 100, pin by pin configurable I/O transceiver 18, and routing. Thus, every function can be assigned a configuration state, loaded, and changed as required for an exceedingly wide range of applications.

FIG. 1B depicts a more detailed view, incorporating numerous other functionalities of the exemplary integrated circuit (or microcontroller) 10, which was discussed in overview above.

One possible functionality, which may be an application of a system incorporating features of the present embodiment, is analog to digital (A/D) conversion. In performing A/D conversion, it is necessary to get signals entering on certain of the pins constituting parts of pin by pin configurable I/O transceivers 18 into the SoC Block in the process. Owing to uncertainty in which block a user configuring the system 10 for A/D conversion will choose for performing the A/D conversion function, as well as uncertainty as to which pins the user will select for routing relevant signals, a mechanism is necessitated to achieve the requisite routing from the pin to the actual functional block inside the system; and vice versa, because a corresponding waveform will be generated in the functional block, which must be brought back out for use. Importantly, keeping in mind one advantageous feature of the present embodiment, that the design of embodiments of the present invention is not to dictate their applicability, but rather to effectuate implementation of the largest possible spectrum of applicability, the configurability of pin by pin configurable I/O transceivers 18, programmable interconnect 1000, and SoC blocks 25 may be crucial.

In as much as dictating a specific requisite pin locale from which a particular signal will emerge from system 10 is undesirable, a routing modality incorporating features of the present embodiment effectuate the redirection of signals to an almost arbitrary location on pin by pin configurable I/O transceivers 18. Advantageously, this simultaneously maximizes flexibility and greatly enhances user convenience and system applicability. In one embodiment, this designed inherent reconfigurability functions as an exceptionally flexible signal routing capability.

Referring again to both FIG. 1A and FIG. 1B, a fixed system bus 11 electrically and/or communicatively transfers instructions, including sequencing instructions, between the microcontroller/IC central processing unit 14 and the rest of the system. Included in these transfers are microcontroller instructions to interrogate and/or otherwise communicate with the system blocks 25.

Dedicated functionalities and/or peripherals 17 is interconnected with system bus 11. Dedicated functionalities and/or peripherals 17 may include a plethora of common functions of value to the function of system 10. A multiplier/accumulator (MAC) 1003 combines arithmetic logic functions of multiplication, counting, and storage of arithmetic results.

With reference to FIG. 1B, a clocking architecture is effectuated, in one embodiment, by a number of components of an IC/microcontroller 10, including a precision oscillator and phase locked loop (PLL) 998 which provides timing signals to CPU 14. PLL 998 receives a precision voltage reference signal from a voltage reference 999, and timing signals from a 32 kHz crystal oscillator 997. The 32 kHz crystal oscillator 997 may be coupled via external timing connection terminals X1 and X2 to a high-precision external timing reference Signal generator (not shown) for a variety of applications such as calibration and synchronization, etc. Also included in the microcontroller clocking architecture are a watch dog timer 992 and a sleep timer 991, which may, in one embodiment, address the system internal address/data bus 11 via a timing address/data sub-bus 11.2. An interrupt controller 990, in one embodiment, generates interrupt signals, as required.

A power on reset control unit 993 performs functions related to power supply stability, particularly on system startup. Power on reset control unit 993 works, in one embodiment, in conjunction with a brown-out detection unit 994, which detects substandard, subnominal power system parameters, which could have deleterious effects on system and/or microcontroller operation, and may generate interrupts and/or other warning and/or protective actions accordingly. The following co-pending US application is hereby incorporated by reference, Ser. No. 09/887,955, by Warren Snyder and Harold Kutz, entitled "Novel Power On Reset Circuit For A Microcontroller," filed Jun. 22, 2001, and which is assigned to the assignee of the present invention. Further, the following co-pending US application is also hereby incorporated by reference, Ser. No. 09/887,923, by Warren Snyder and Harold Kutz, entitled "Novel Method and System For Interaction Between A Processor and A Power On Reset Circuit To Dynamically Control Power States In A Microcontroller," filed Jun. 22, 2001, and which is also assigned to the assignee of the present invention.

Exemplary Programmable Analog Functionality

The following co-pending US application is hereby incorporated by reference, Ser. No. 09/909,047, by Monte Mar, entitled "An Analog Programmable System On A Chip Architecture," filed Jul. 18, 2001, and which is assigned to the assignee of the present invention.

The present invention provides, in one embodiment, a programmable analog system architecture that is suited for a variety of applications and that can reduce development time and expenses. The programmable analog system architecture is integrated with a microcontroller that provides sequencing and programming instructions. The present invention introduces a single chip solution that contains a set of tailored analog blocks and elements that can be dynamically configured and reconfigured in different ways to implement a variety of different analog functions.

The analog system architecture can be generally referred to as an analog "programmable system-on-a-chip," or PSoC, block. PSoC blocks can be used in those applications that typically require multiple chips that may be fabricated using different technologies. Implementation in embedded applications, including audio, wireless, handheld, data communications, Internet control, and industrial and consumer systems, is contemplated.

In the present embodiment, the analog blocks 20 are arranged on a single integrated circuit, or chip. The analog blocks 20 can be electrically coupled in different combinations to perform different analog functions. Each analog block 20 can also be configured according to the function to be performed. In the present embodiment, the analog blocks 20 include analog elements that have changeable characteristics that can be specified according to the function to be performed. Inputs received by an analog block are directed through the analog block according to the specified characteristics of the analog elements. The combination of analog blocks 20 and the characteristics of the analog elements, and hence the analog function to be performed, can be dynamically programmed. A number of registers are configurable to store programming data for the programmable digital circuit blocks.

In one embodiment, the analog blocks 20 include switched analog blocks that can be electrically coupled to and decoupled from one or more other analog blocks. That is, latches and switches can be dynamically configured so that signals can be passed from one block to another, while other blocks are bypassed. Accordingly, a set of analog blocks can be selectively combined to implement a particular analog function. Other analog functions can be implemented by selectively combining a different set of analog blocks. In one embodiment, the switched analog blocks are switched capacitor blocks. In another embodiment, two different types of switched capacitor blocks are used; the two types are distinguishable according to the type and number of inputs they receive and how those inputs are treated. In yet another embodiment, the analog blocks also include continuous time blocks.

In one embodiment, the continuous time blocks and the switched capacitor blocks are arranged in rows and columns in an array. In one such embodiment, the array includes a first row of continuous time blocks and multiple rows of switched capacitor blocks, where the first row of continuous time blocks is disposed between the switched capacitor blocks and an edge of the array. In one embodiment, the analog blocks in a column are each coupled to a respective digital bus (that is, there is a digital bus for each column of analog blocks).

The analog functions that can be performed using the system architecture and method of the present invention include (but are not limited to) an amplifier function, a digital-to-analog converter function, an analog-to-digital converter function, an analog driver function, a low band pass filter function, and a high band pass filter function. The programmable analog circuit blocks may, in one embodiment, be constituted by a matrix of n by m analog configurable system macros, n and m independently being an integer of at least two. Each of said analog configurable system macros is configured to provide one or more analog functions, which may also include gain functions, comparator functions, switched capacitor functions, filter functions, analog-to-digital conversion functions, digital-to-analog conversion functions, and amplifier functions, among others. The programmable analog circuit may, in one embodiment, be constituted by a matrix of n by m number of programmable analog circuit blocks, each coupled to an adjacent block and configured to provide at least one of a plurality of analog functions.

FIG. 1A is a block diagram showing an exemplary integrated circuit (or microcontroller) 10 upon which embodiments of the present invention may be implemented. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and analog blocks 20. The analog blocks 20 are further described below. A test interface (not shown) may be coupled to integrated circuit 10 to perform debugging operations during startup and initialization of the integrated circuit.

In the present embodiment, flash ROM 16 stores parameters describing microcontroller 10, allowing microcontroller 10 to be programmed during production, during system testing, or in the field. It is contemplated that microcontroller 10 may also be self-programmed remotely.

Analog blocks 20 are configurable system resources that can reduce the need for other microcontroller parts and external components. In the present embodiment, analog blocks 20 include an array of twelve blocks. A precision internal voltage reference provides accurate analog comparisons. A temperature sensor input is provided to the array of analog blocks to support applications like battery chargers and data acquisition without requiring external components.

In the present embodiment, there are three types of analog blocks: continuous time blocks, and two types of switched capacitor blocks (referred to herein as type A and type B).

Continuous time blocks provide continuous time analog functions. Continuous time blocks are described in further detail in conjunction with FIG. 4A.

Switched capacitor blocks provide discrete time analog functions such as analog-to-digital conversion (ADC) and digital-to-analog conversion (DAC) functions. The key difference between the type A and type B switched capacitor blocks is in generating biquad filters (see FIGS. 14A and 14B below). Both type A and type B blocks can implement basic switched capacitor functions (outside of filters), and the type A block can also function as a summing amplifier. Switched capacitor blocks are described in further detail in conjunction with FIGS. 9A and 10A, below.

Analog functions supported by integrated circuit 10 comprising analog blocks 20 include, but are not limited to: 14-bit multi-slope and 12-bit delta-sigma ADC, successive approximation ADCs up to nine bits, DACs up to nine bits, programmable gain stages, sample and hold circuits, filters (high band pass and low band pass) with programmable coefficients, amplifiers, differential comparators, and temperature sensors.

Figure 2:
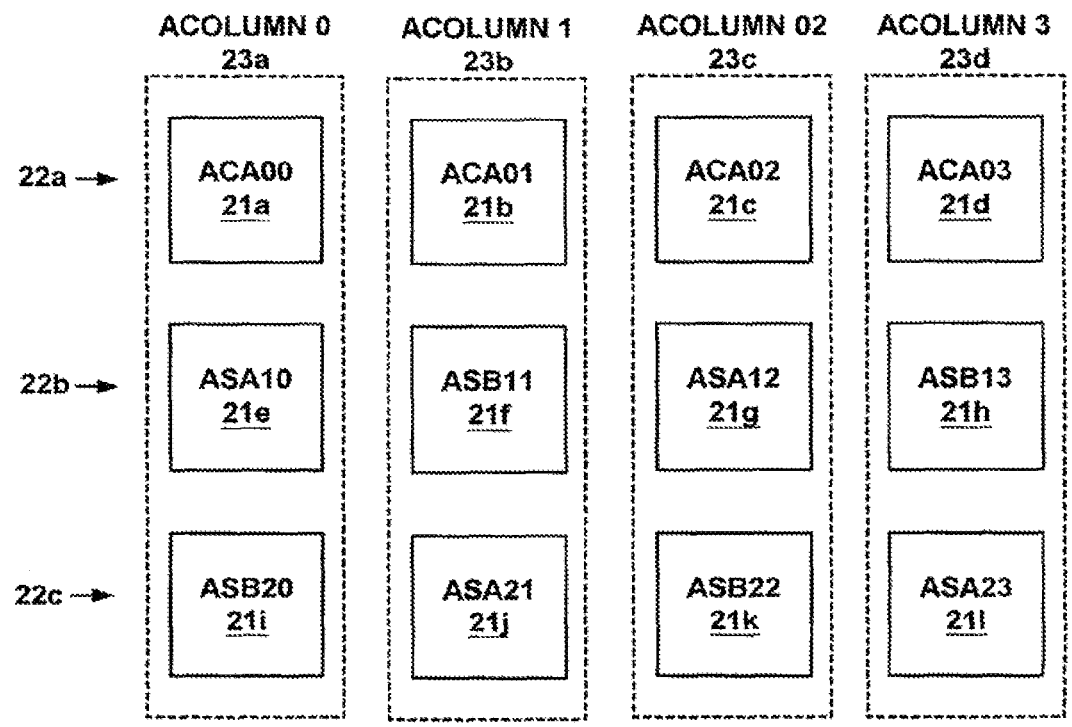
FIG. 2 shows an array of analog blocks in accordance with one embodiment of the present invention.

FIG. 2 shows an array of analog blocks 20 in accordance with one embodiment of the present invention. In this embodiment, there are twelve analog blocks 21a-21 l arranged in an array of three rows 22a-22c by four columns 23a-23d. Each column 23a-d includes one of each type of analog block, e.g., a continuous time block 21a-d (designated "ACAxx"); a type A switched capacitor block 21e, 21g, 21j and 21l (designated "ASAxx"): and a type B switched capacitor block 21f, 21h, 21i, and 21k (designated "ASBxx"). Note that, in this embodiment, the type A and type B switched capacitor blocks in rows 22b and 22c are arranged in an alternating, or checkerboard, pattern.

In the present embodiment, the analog blocks 21 a-l can be powered down individually to different power levels, so that it is not necessary for all of the blocks to be running at full power. In one embodiment, the analog blocks 21 a-l have four power levels.

Figure 3:
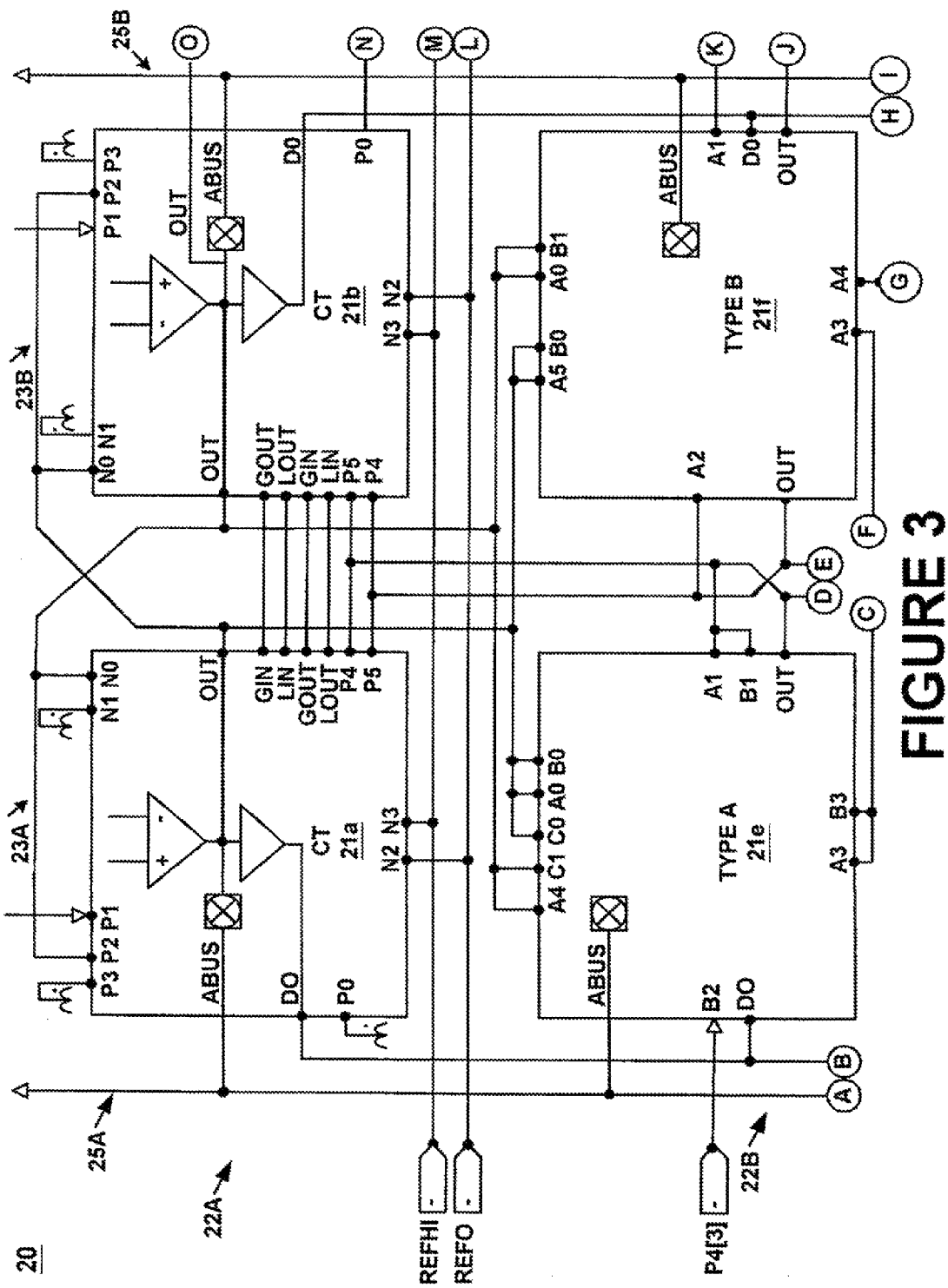
FIG. 3 shows the interconnects between analog blocks in an array in accordance with one embodiment of the present invention.
Figure 3:
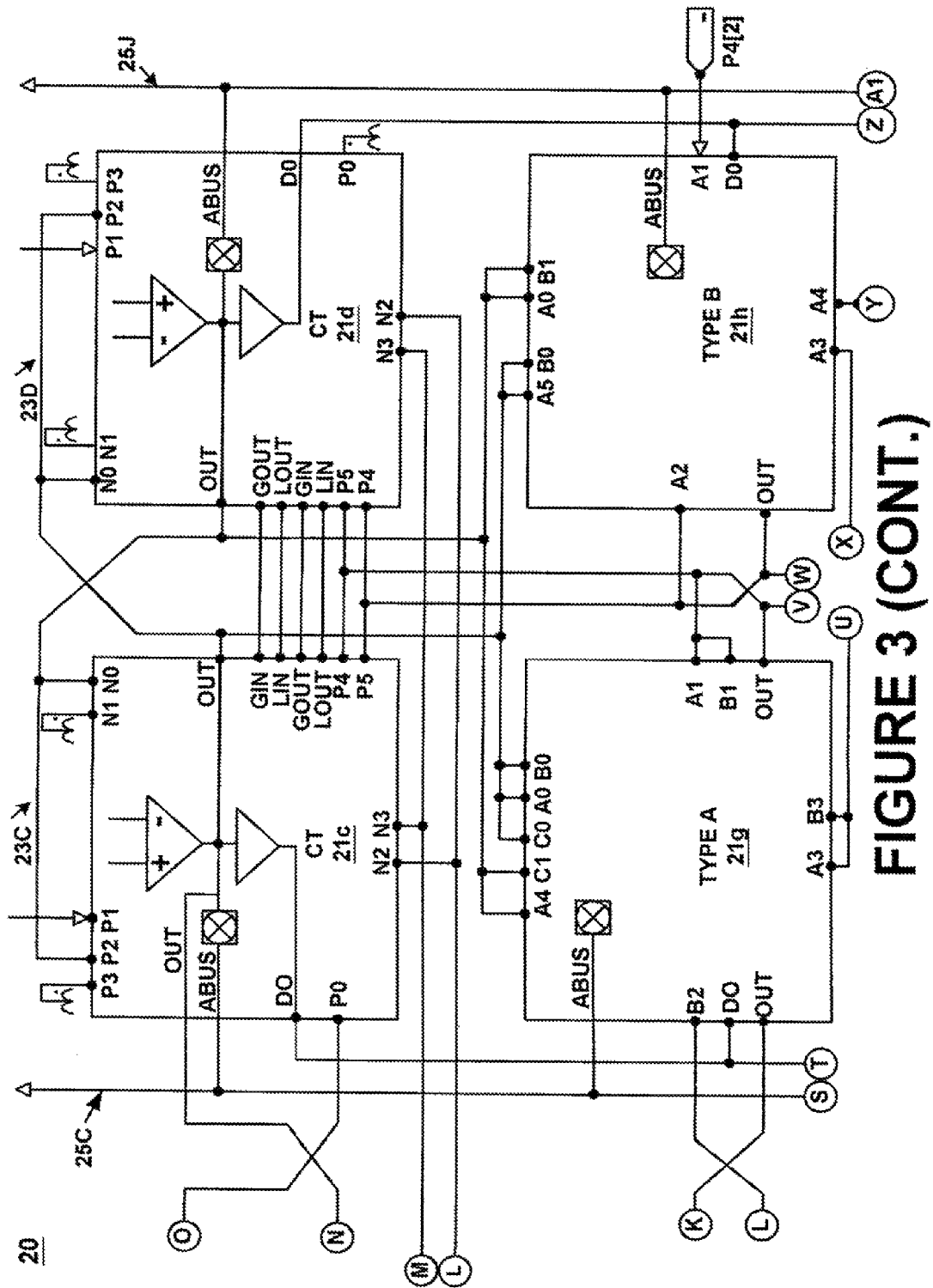
Figure 3:
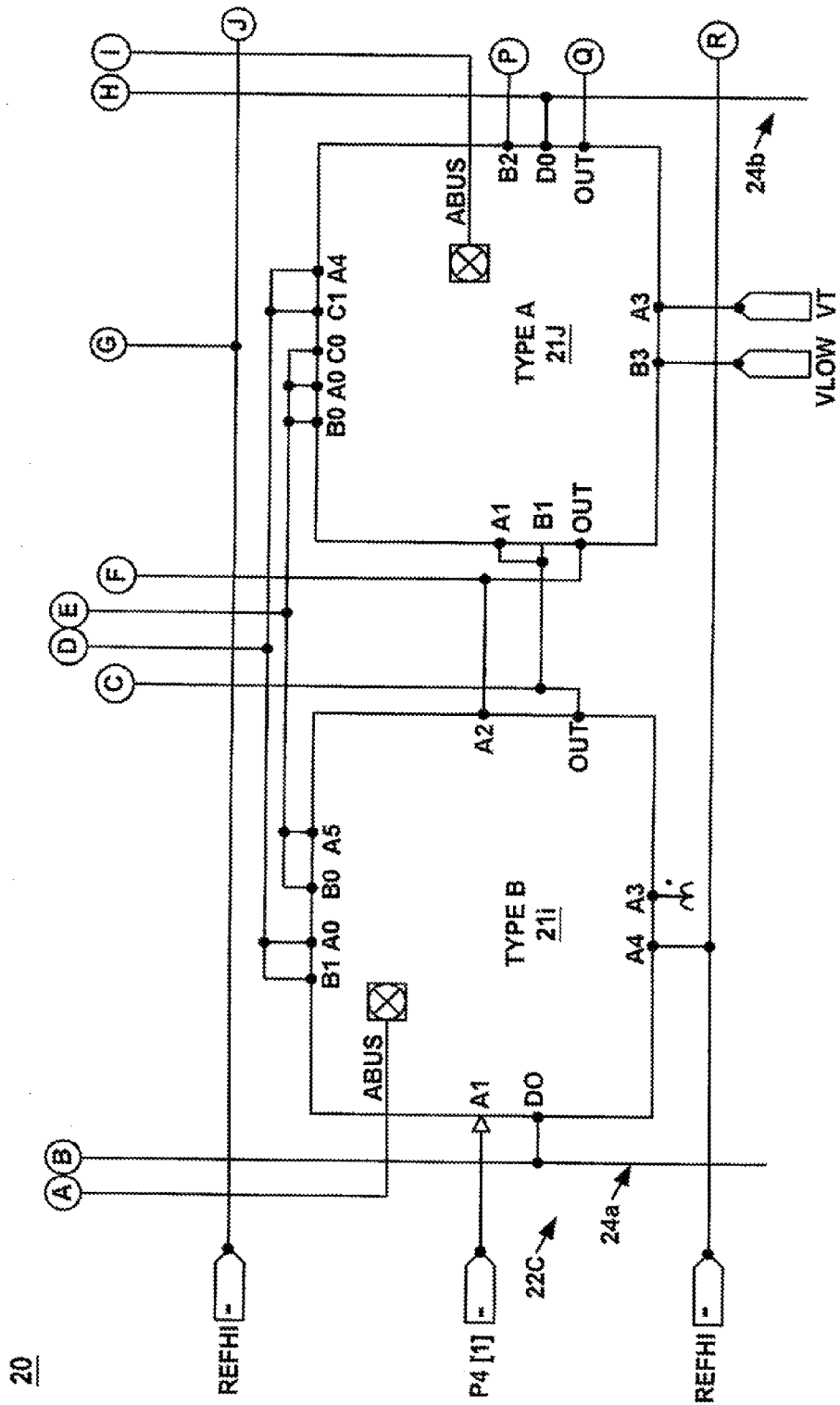
Figure 3:
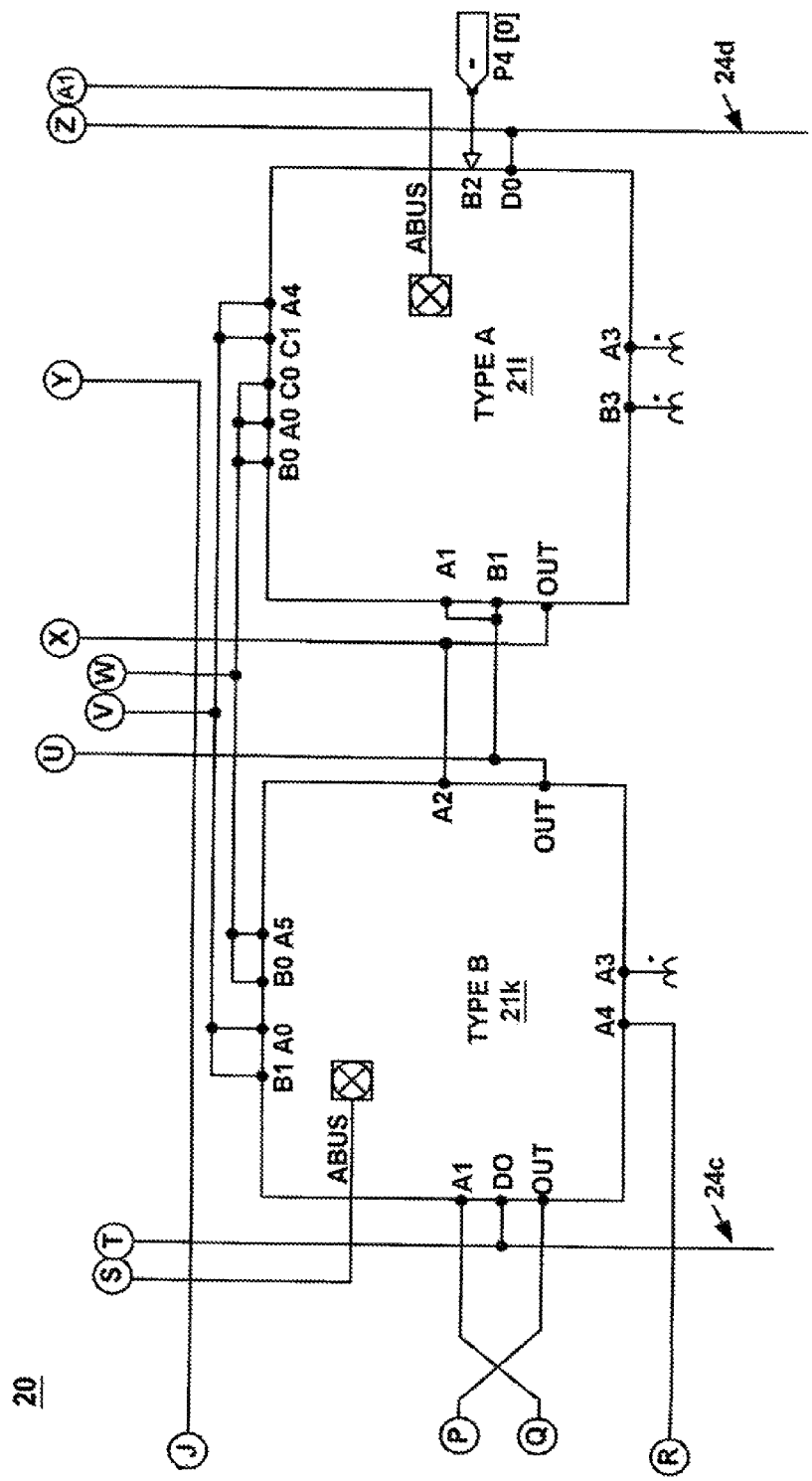

FIG. 3 shows the interconnects between analog blocks 20 in an array in accordance with one embodiment of the present invention. In this embodiment, each analog block 21 a-l is interconnected with its adjacent (e.g., nearest neighbor) analog block. Note that, although the analog blocks 21 a-l are interconnected, they may not be electrically coupled. The distinction between being connected and being electrically coupled is important because the analog functions performed by the analog blocks 20 are implemented by enabling certain analog blocks of the circuit and bypassing others according to user programming. That is, certain analog blocks in the array of analog blocks 20 are selectively and electrically coupled to other analog blocks according to the function to be performed. As will be seen, the analog functions are also implemented by setting characteristics of passive elements (e.g., capacitors and resistors) within each of the analog blocks 20.

In accordance with one embodiment of the present invention, different combinations of analog blocks 20 can be selected according to the user programming in order to perform different functions. In one embodiment, individual analog blocks can be enabled and bypassed, respectively, by enabling and closing appropriate switches in response to the programming. Signals are thereby routed through the analog blocks 20 by enabling and closing programmable switches, so that the signals are routed to the analog blocks necessary to accomplish the particular analog function selected. Mechanisms other than switches may be used to enable and bypass analog blocks.

In the present embodiment, for each column 23a-d, there is a respective digital bus 24a-d and a respective analog bus 25a-d coupled to each analog block in the column. Any analog block on these buses can have its output enabled to drive the buses. The analog buses 25a-d are each a gated operational amplifier (op-amp) output. The digital buses 24a-d are each a comparator output derived by buffering the operational amplifier output through an inverter. In one embodiment, reference buses (not shown) are also provided to provide a reference voltage for ADC and DAC functions.

The continuous time blocks 21a-21d can be programmed to serve as a first-order isolation buffer, if necessary. In that case, data essentially flow through the array of analog blocks 20 from top to bottom (e.g., from row 22a to row 22c). However, if the signals do not need to be buffered, then the signals can arrive directly at a switched capacitor block in one row (e.g., row 22c), then be switched to another row (e.g., row 22b).

In FIG. 3, output signals from each analog block include DO and those signals that include "out" in their designation (such as OUT, GOUT, and LOUT). Signals labeled otherwise are input signals to a block.

Figure 4A:
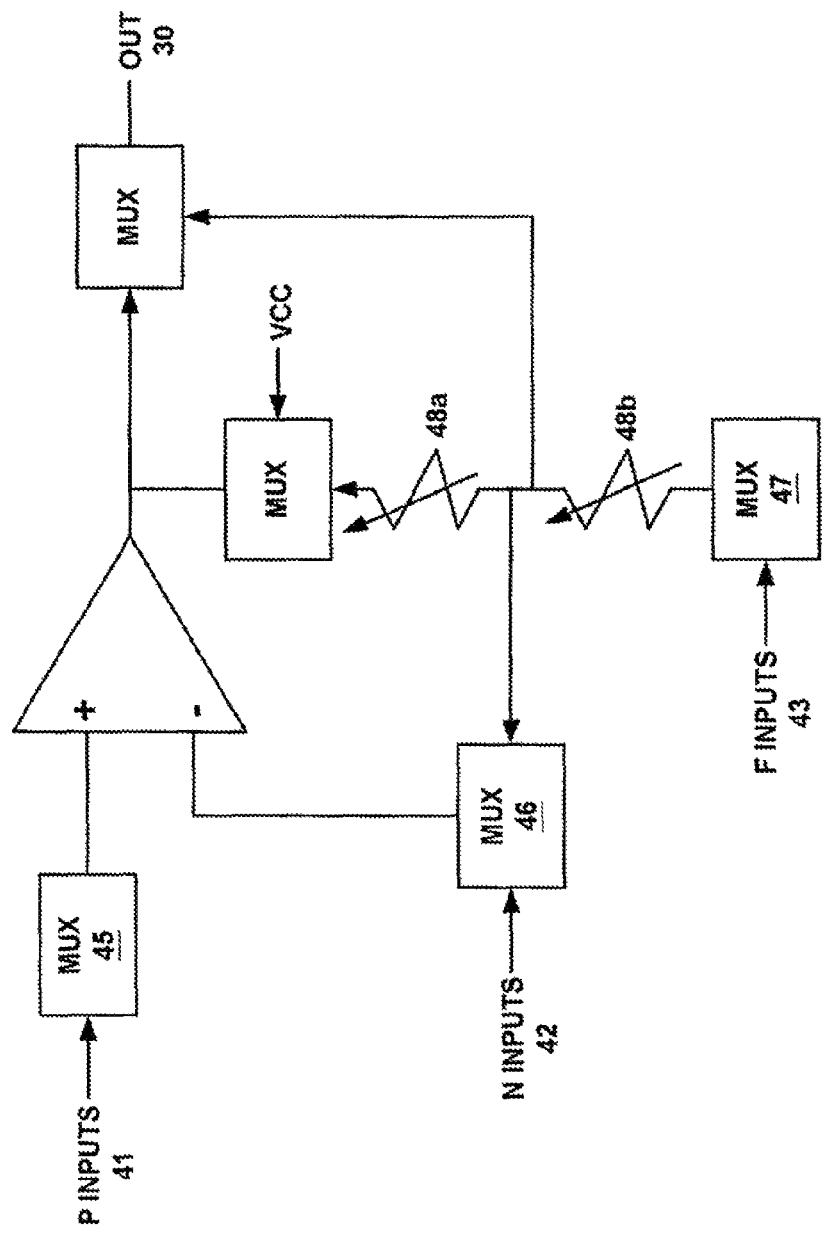
FIG. 4A is a functional block diagram of one embodiment of a continuous time block in accordance with the present invention.

FIG. 4A is a functional block diagram of one embodiment of a continuous time block 40 in accordance with the present invention. Continuous time block 40 exemplifies continuous time blocks 21 a-d of FIGS. 2 and 3. Continuous time block 40 is unclocked; that is, an analog signal input to continuous time block 40 may vary with time, and the output of continuous time block 40 will reflect that (instead of sampling the input as a clocked block would).

In the present embodiment, continuous time block 40 of FIG. 4A performs basic amplifier operations. In one embodiment, one function of continuous time block 40 is to amplify and isolate analog inputs to the array of analog blocks 20 (FIG. 3), although continuous time block 40 may not always be used in this manner. Continuous time block 40 also provides the means to convert differential input voltages into single-ended signals to drive other analog blocks 20.

In the present embodiment, continuous time block 40 of FIG. 4A-receives positive (P) inputs 41 at multiplexer (MUX) 45, negative (N) inputs 42 at MUX 46, and feedback (F) inputs at MUX 47. Multiplexers 45, 46 and 47 function as controlled switches for directing the inputs through continuous time block 40. It is appreciated that the inputs to continuous time block 40 are a function of the location of continuous time block 40 in the array of analog blocks 20 (FIGS. 2 and 3), and that the inputs received by continuous time block 40 depend on the particular analog function being implemented.

Continuous time block 40 also includes analog elements having characteristics that can be set and changed in response to the user's programming in accordance with the particular analog function to be implemented. In the present embodiment, continuous time block 40 includes programmable resistors 48a and 48b. In accordance with the present invention, the resistance of resistors 48a and 48b can be changed in response to the user's programming.

Figure 4B:
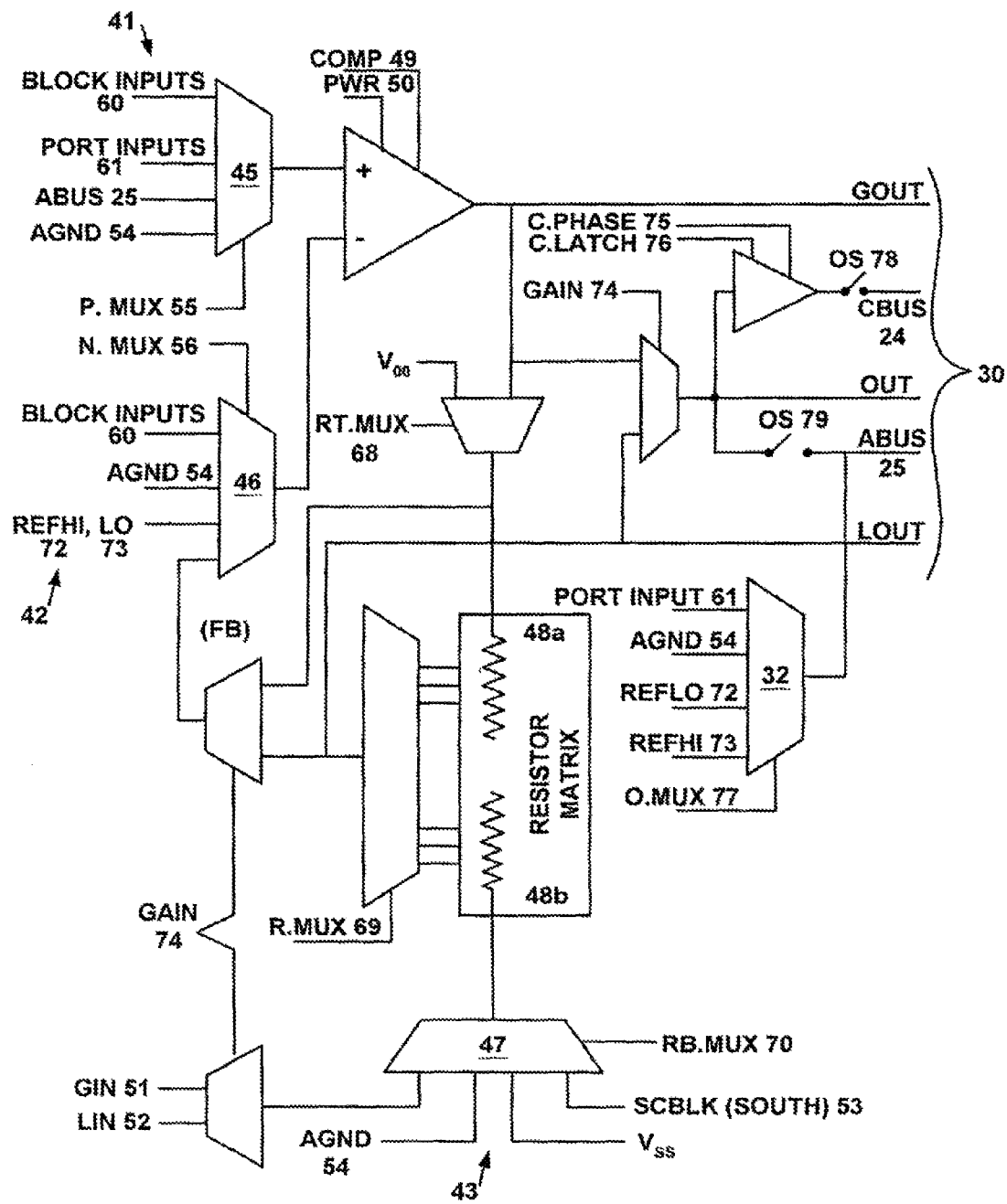
FIG. 4B is a schematic diagram of one embodiment of a continuous time block in accordance with the present invention.

FIG. 4B is a schematic diagram of one embodiment of a continuous time block 40 in accordance with the present invention. Block inputs 60 are inputs received from other analog blocks in the array of analog blocks 20 (FIG. 2). SCBLK (SOUTH) 53 is the input from a switched capacitor block below continuous time block 40 in a column 23a-d (FIG. 3). Port inputs 61 are inputs received from components and elements external to the array of analog blocks 20. ABUS 25 is the input from the analog bus (e.g., analog buses 25a-d of FIG. 3) and AGND 54 is the analog ground. CBUS 24 is the output to the digital bus (e.g., buses 24a-d of FIG. 3). Other outputs (OUT) 30.1 include GOUT, OUT and LOUT (see FIG. 3). When cascading two blocks, GOUT is used when trying to achieve a gain, and LOUT is used when trying to achieve a loss. REFLO 72 and REFHI 73 are reference voltages.

Continuing with reference to FIG. 4B, GAIN 74 controls whether the resistor string (48*a*, 48*b*) is connected around the op-amp for gain or loss (note that GAIN 74 does not guarantee a gain or loss block; this is determined by the routing of the other ends of the resistors 48*a-b*). GIN 51 and LIN 52 are inputs to continuous time block 40 (see also FIG. 3). P.MUX 55, N.MUX 56 and RB.MUX 70 are bit streams which control the non-inverting input MUX 45, the inverting input MUX 46, and MUX 47, respectively. R.MUX 69 is a bit stream controlling the center tap of the resistor string 48*a-b*. RT.MUX 68 is a bit stream controlling the connection of the two ends of the resistor string 48*a-b*. RT.MUX bits 68 control the top end of the resistor string 48*a-b*, which can either be connected to Vcc or to the op-amp output. RB.MUX bits 70 control the connection of the bottom end of the resistor string 48*a-b*.

With reference still to FIG. 4B, MUX 32 under control of bit stream O.MUX 77 provides a testability feature by feeding signals into continuous time block 40 that bypass the other portions of the block. COMP 49 is a bit controlling whether the compensation capacitor (not shown) is switched in or not in the op-amp. By not switching in the compensation capacitance, a fast response can be obtained if the amplifier is being used as a comparator.

PWR 50 is a bit stream for encoding the power level for continuous time block 40. C.PHASE 75 controls which internal clock phase the comparator data are latched on. C.LATCH 76 controls whether the latch is active or if it is always transparent. CS 78 controls a to-state buffer that drives the comparator logic. OS 79 controls the analog output bus (ABUS 25). A complementary metal oxide semiconductor (CMOS) switch connects the op-amp output to ABUS 25.

Figure 5:
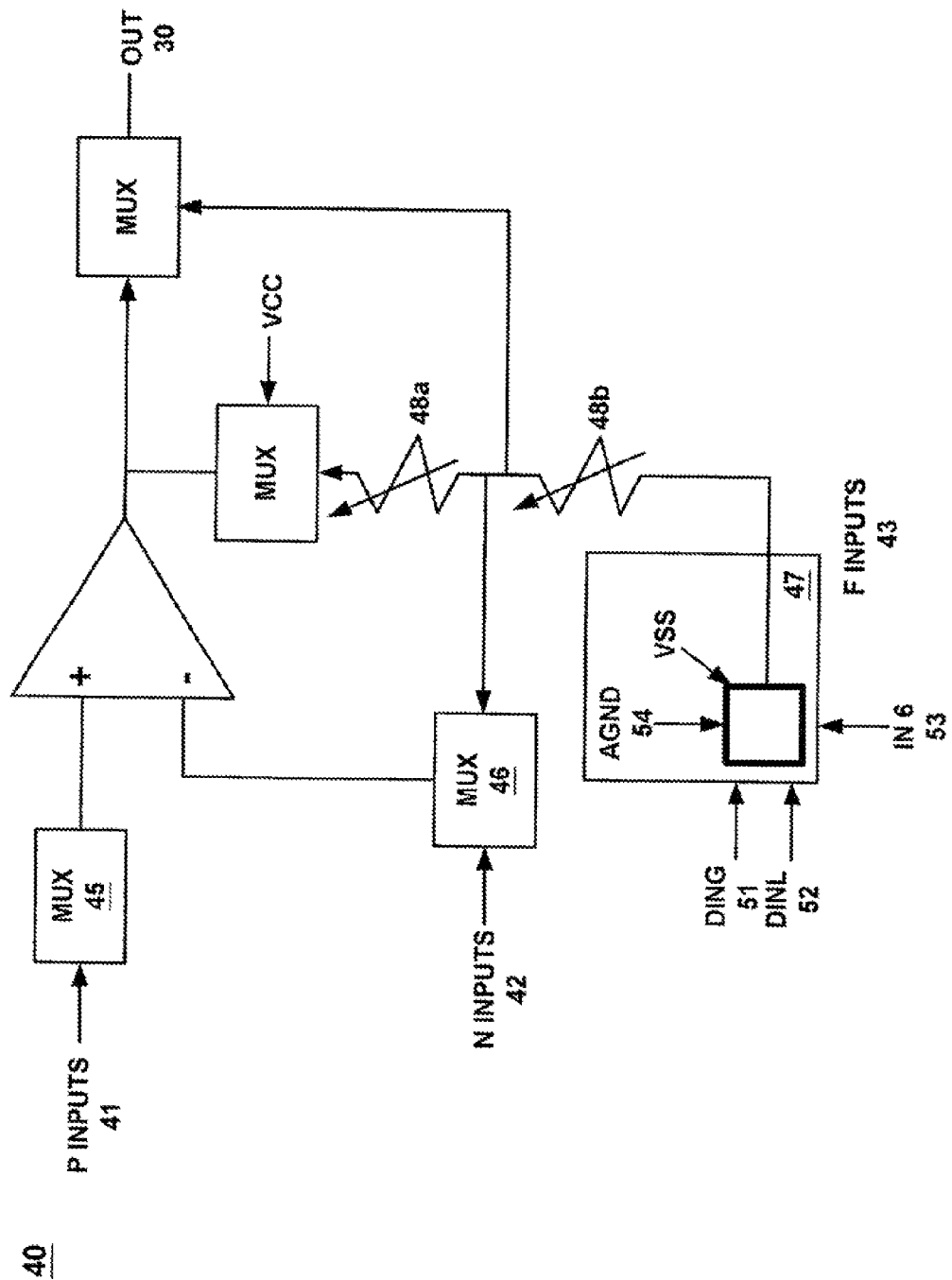
FIG. 5 illustrates the feedback inputs into a continuous time block in accordance with one embodiment of the present invention.

FIG. 5 illustrates the feedback inputs 43 into a continuous time block 40 in accordance with one embodiment of the present invention. DING 51 is GIN 51 of FIG. 4B, DINL 52 is LIN 52 of FIG. 4B, and AGND 54 is the analog (actual) ground. IN6 (SCBLK) 53 is the input from a switched capacitor block situated below continuous time block 40 in a column 23*a-d* in an array of analog blocks 20 (FIG. 3).

Figure 6:
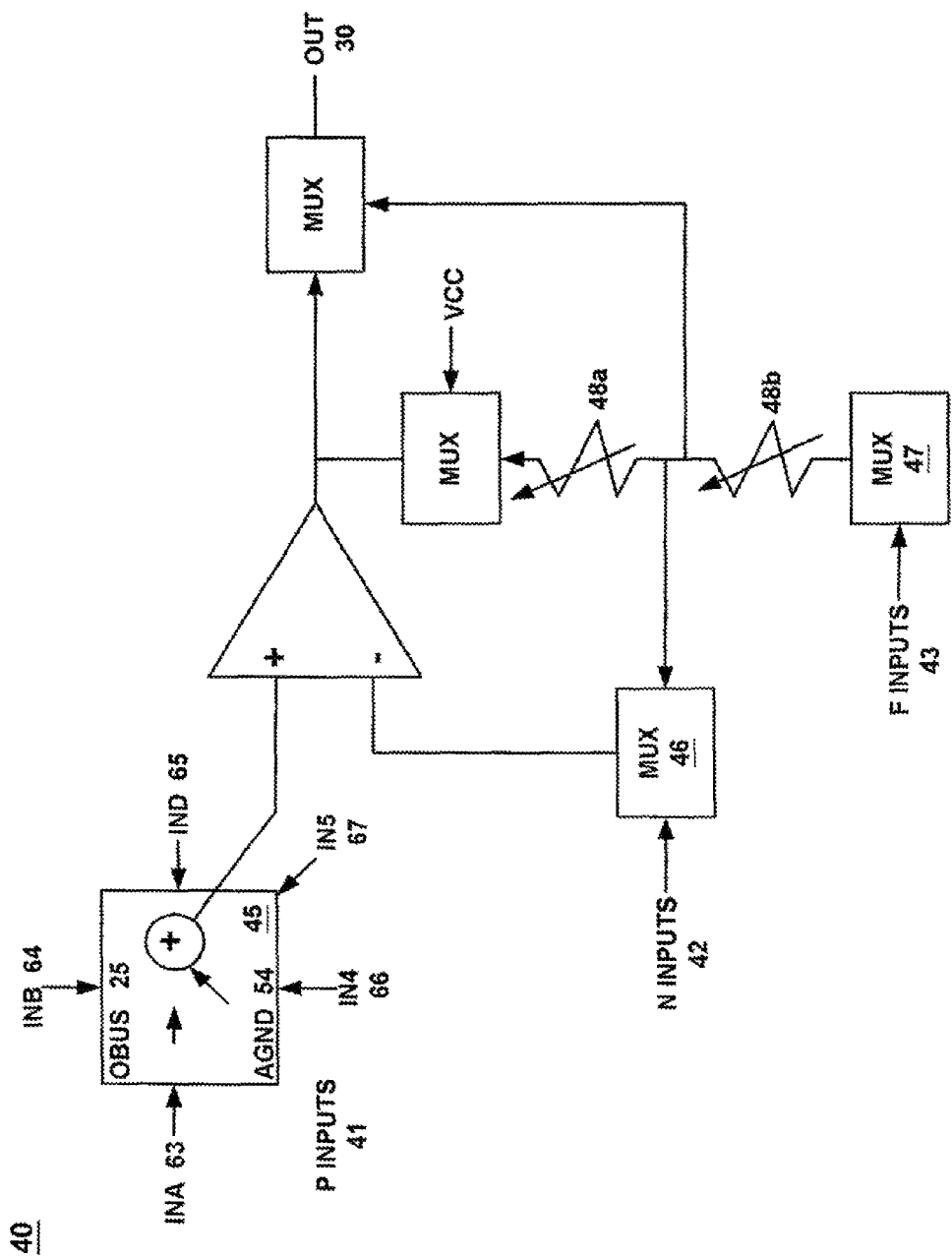
FIG. 6 illustrates the positive inputs into a continuous time block in accordance with one embodiment of the present invention.

FIG. 6 illustrates the positive inputs 41 into a continuous time block 40 in accordance with one embodiment of the present invention. AGND 54 is the analog ground, and OBUS (ABUS) 25 is the input from the analog bus (e.g., analog buses 25*a-d* of FIG. 3). INA 63 and IND 65 are the inputs from another continuous time block; that is, the continuous time blocks to either side of continuous time block 40. If continuous time block 40 is situated on the left or right edge of the array of analog blocks 20 (FIG. 3), such as in columns 23*a* or 23*d*, then only one of the inputs INA 63 or IND 65 would be present. INB 64 is the input from outside of the array of analog blocks 20. IN4 66 and IN5 67 are input from adjacent switched capacitor blocks, either in the same column as continuous time block 40 or from a switched capacitor block in an adjacent column.

Figure 7:
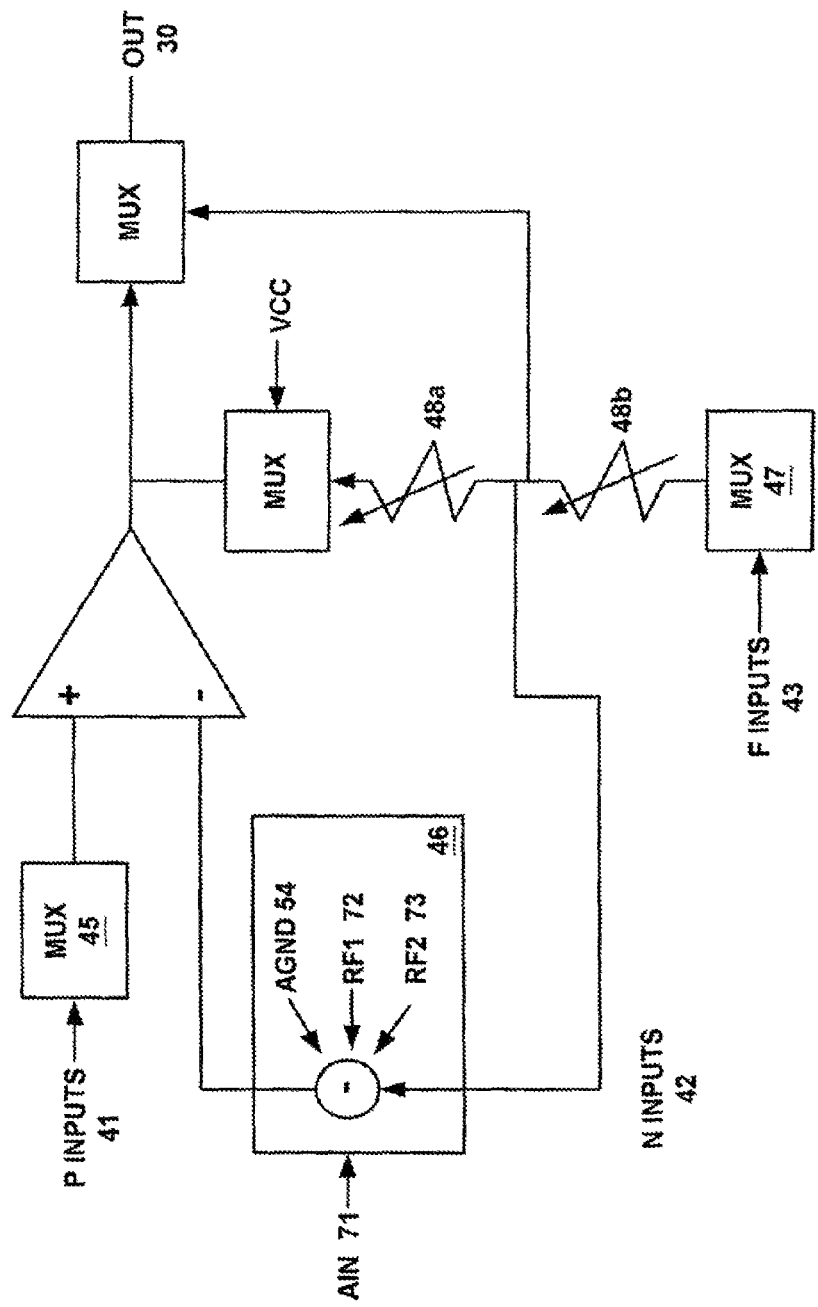
FIG. 7 illustrates the negative inputs into a continuous time block in accordance with one embodiment of the present invention.

FIG. 7 illustrates the negative inputs 42 into a continuous time block 40 in accordance with one embodiment of the present invention. AGND 54 is the analog ground, and AIN 71 is the input from an adjacent continuous time block (depending on the location of continuous time block 40 in the array of analog blocks 20 of FIG. 3, there may be more than one input from an adjacent continuous time block, as described in the preceding paragraph). RF1 (REFLO) 72 and RF2 (REFHI) 73 are reference voltages.

Figure 8A:
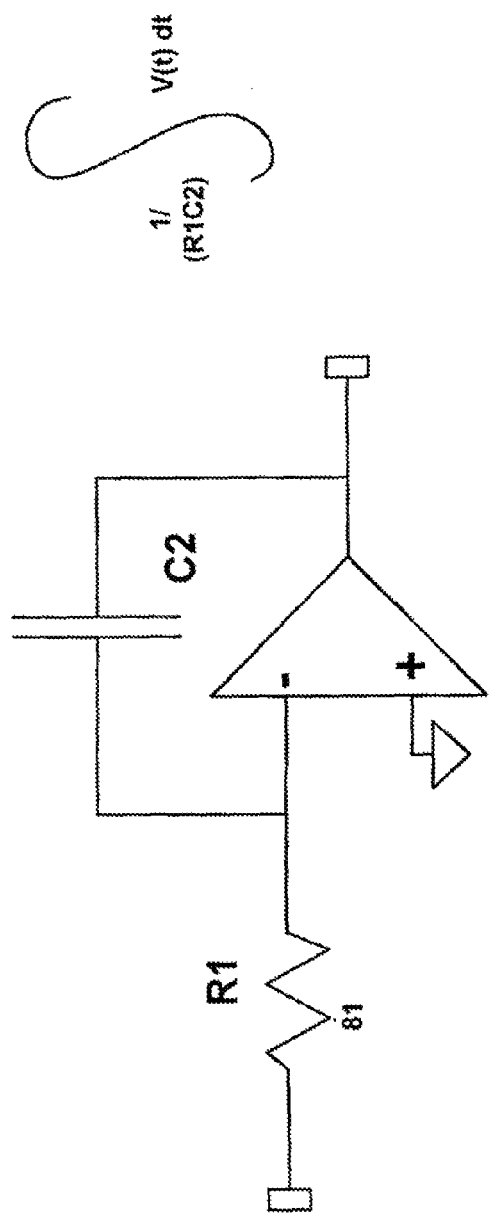
FIGS. 8A and 8B are circuit diagrams illustrating the functionality of a switched capacitor circuit by comparison to another circuit in accordance with one embodiment of the present invention.
Figure 8B:
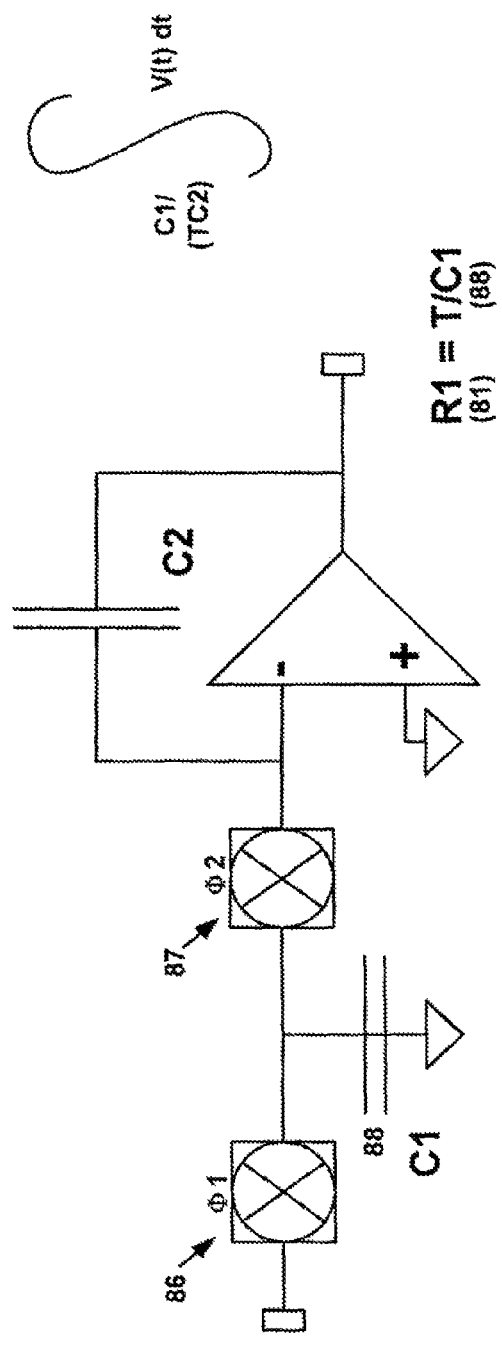

FIGS. 8A and 8B are circuit diagrams illustrating the functionality of a switched capacitor circuit 85 by comparison to another circuit 80 in accordance with one embodiment of the present invention. In FIG. 8A, an amount of current flows through resistor 81 in a time period T. Resistor 81 has a resistance value of R1. In FIG. 8B, switch 86 and switch 87 of switched capacitor circuit 85 are enabled and closed according to clock phases $\phi 1$ and $\phi 2$, respectively. Switched capacitor circuit 85 also includes a capacitor 88 with a capacitance of C1. An amount of charge will transfer through switches 86 and 87 in a time period T. In essence, the amount of charge transferred through switches 86 and 87 in time period T will appear like a current (current being charge per time). The resistance of switched capacitor circuit 85 equivalent to R1 is T/C1.

Figure 9A:
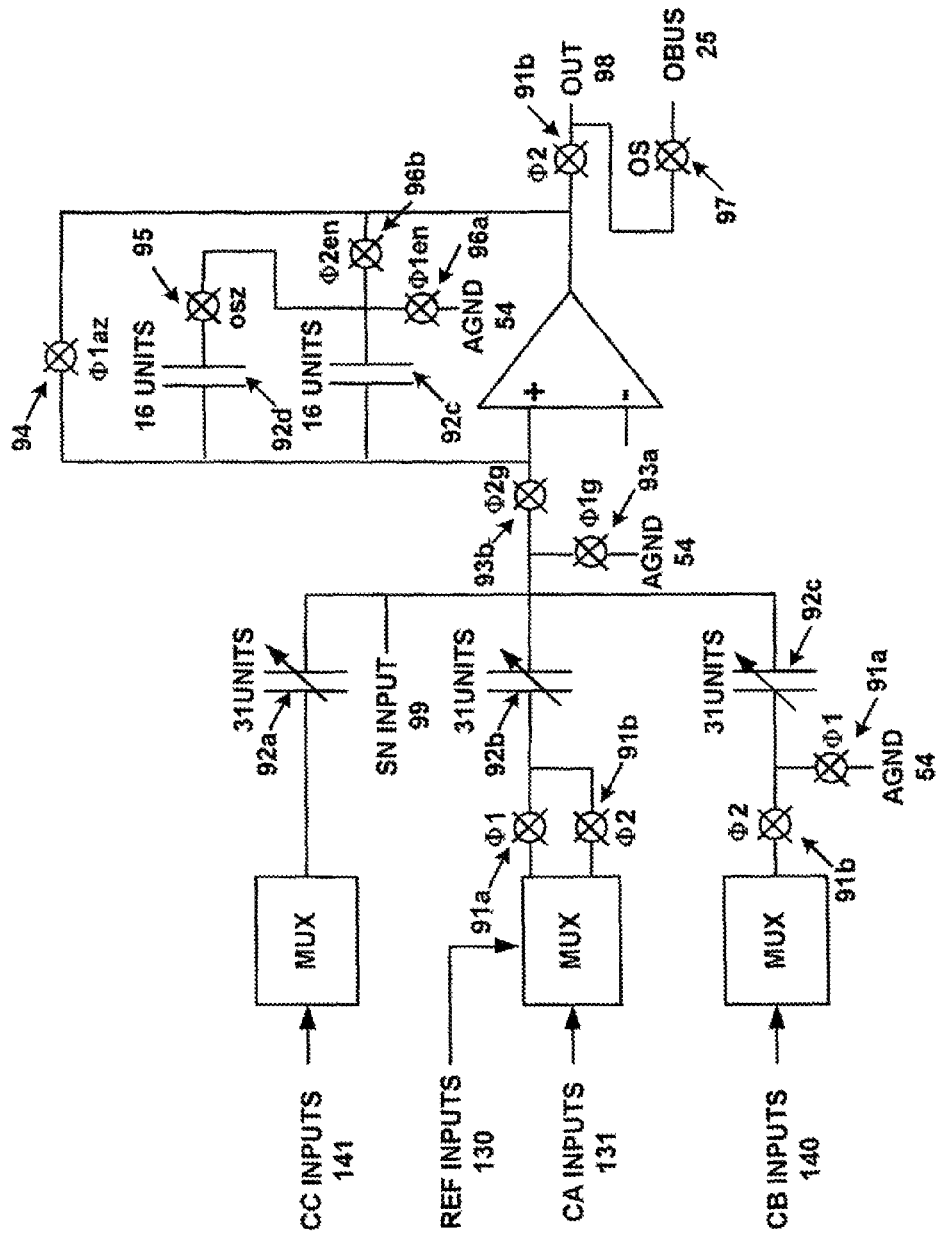
FIG. 9A is a block diagram of one embodiment of a switched capacitor block in accordance with the present invention.

FIG. 9A is a block diagram of one embodiment of a switched capacitor block 90 in accordance with the present invention. This embodiment of switched capacitor block 90 is referred to as a type A switched capacitor block. Switched capacitor block 90 exemplifies analog blocks 21*e*, 21*g*, 21*j* and 21*l* of FIGS. 2 and 3.

With reference to FIG. 9A, the present embodiment of switched capacitor block 90 receives reference (REF) inputs 130, SN input 99, and inputs from three different types of capacitor arrays, CA inputs 131, CB inputs 140 and CC inputs 141. The designations "CA," "CB" and "CC" are simply chosen to distinguish the three different types of capacitor arrays. REF inputs 130 and CA inputs 131 are described further in conjunction with FIG. 1A0, and CB inputs 140 and CC inputs 141 are described further in conjunction with FIG. 1A1. SN input 99 is a summary node of the array of analog blocks 20 (FIG. 3). It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Continuing with reference to FIG. 9A, AGND 54 is the analog ground, OBUS (ABUS) 25 is the output to the analog bus (e.g., analog buses 25*a-d* of FIG. 3), and OUT 98 is an output from switched capacitor block 90 that may serve as an input to an adjacent switched capacitor block (refer to FIG. 3).

In the present embodiment, switched capacitor block 90 includes a multiplicity of switches 91*a*, 91*b*, 93*a*, 93*b*, 94, 95, 96*a*, 96*b* and 97. Each of the switches 91 *a-b*, 93*a-b*, 94, and 96*a-b* is assigned to a clock phase $\phi 1$ or $\phi 2$; that is, they are enabled or closed depending on the clock phase. Switches 93*a-b*, 94, and 96*a-b* are assigned to gated clocks and function in a known manner. Switches 95 and 97 are not clocked but instead are enabled or closed depending on the user's programming.

Switched capacitor block 90 also includes analog elements having characteristics that can be set and changed in response to the user's programming in accordance with the particular analog function to be implemented. In the present embodiment, switched capacitor block 90 includes capacitors 92*a-92e*. In accordance with the present invention, the capacitance of capacitors 92*a-e* can be changed in response to the user's programming. In the present embodiment, the capacitors 92*a-c* are binarily weighted capacitors that allow the capacitor weights to be programmed by the user, while the capacitors 92*d-e* are either "in" or "auf" (that is, they are not binarily weighted) according to the user programming. In one embodiment, the binary encoding of capacitor size for capacitors 92a-c comprises 31 units (plus zero) each and the encoding of capacitor size for capacitors 92d-e is 16 units each.

Switched capacitor block 90 is configured such that it can be used for the input stage of a switched capacitor biquad filter. When followed by a type B switched capacitor block, the combination of blocks provides a complete switched capacitor biquad (see FIGS. 14A and 14B).

Figure 9B:
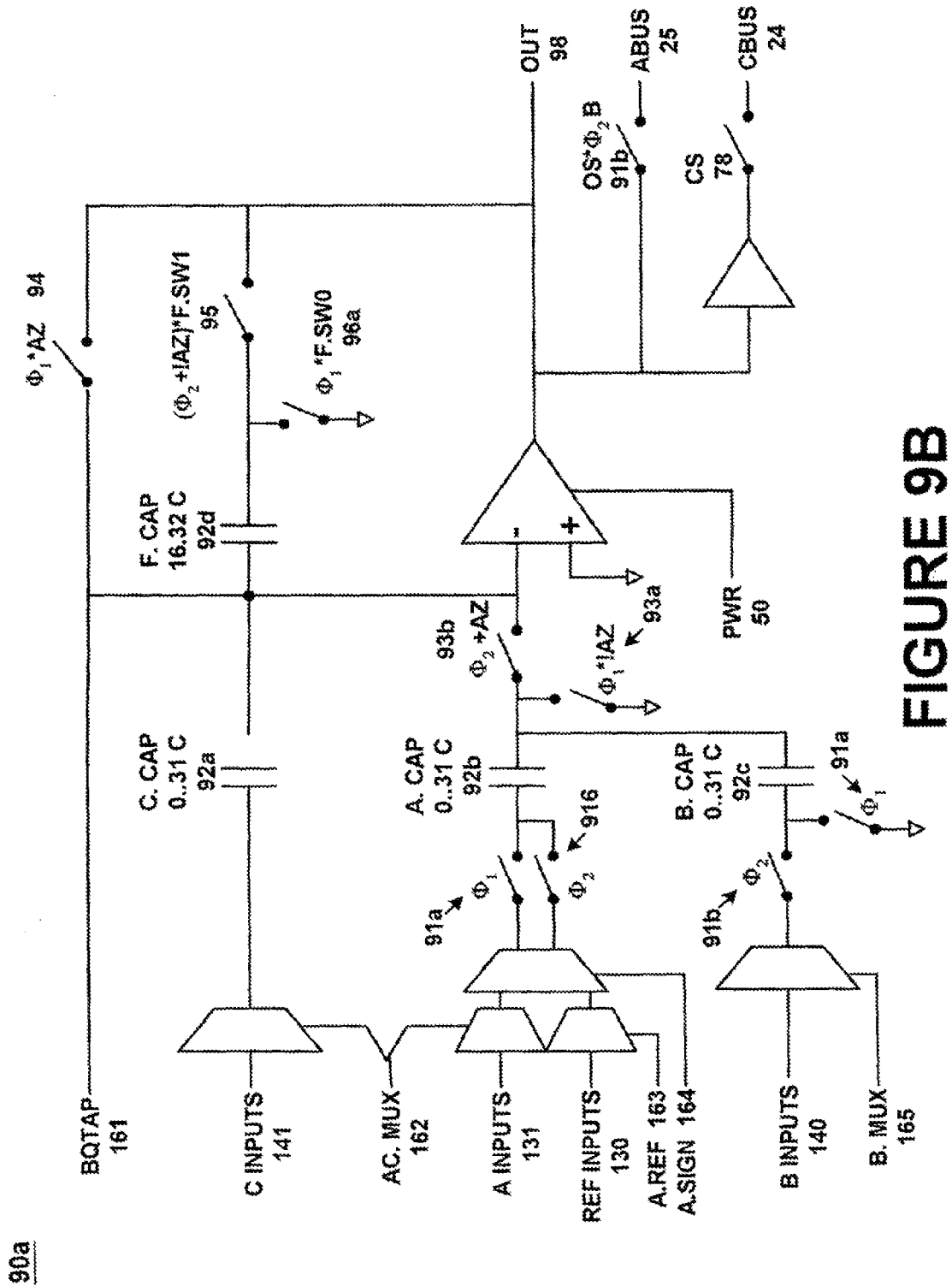
FIG. 9B is a schematic diagram of the switched capacitor block of FIG. 9A in accordance with one embodiment of the present invention.

FIG. 9B is a schematic diagram of a switched capacitor block 90a in accordance with one embodiment of the present invention. ABUS 25 is the output to the analog bus (e.g., buses 25a-d of FIG. 3). CBUS 24 is the output to the digital bus (e.g., buses 24a-d of FIG. 3). PWR 50 is a bit stream for encoding the power level for switched capacitor block 90a. CS 78 controls the output to CBUS 24.

Continuing with reference to FIG. 9B, BQTAP 161 is used when switched capacitor block 90a is used with a type B switched capacitor block to form a switched capacitor biquad (refer to FIGS. 14A and 148 below). AC.MUX 162 is for controlling the multiplexing of the inputs for both the C (CC) inputs 141 and the A (CA) inputs 131. A.REF 163 is for controlling the reference voltage inputs (REF 130). A.SIG N 164 controls the switch phasing of the switches on the bottom plate of the capacitor 92b. B.MUX 165 is for controlling the multiplexing of the inputs for the B (CB) inputs 140.

Figure 10:
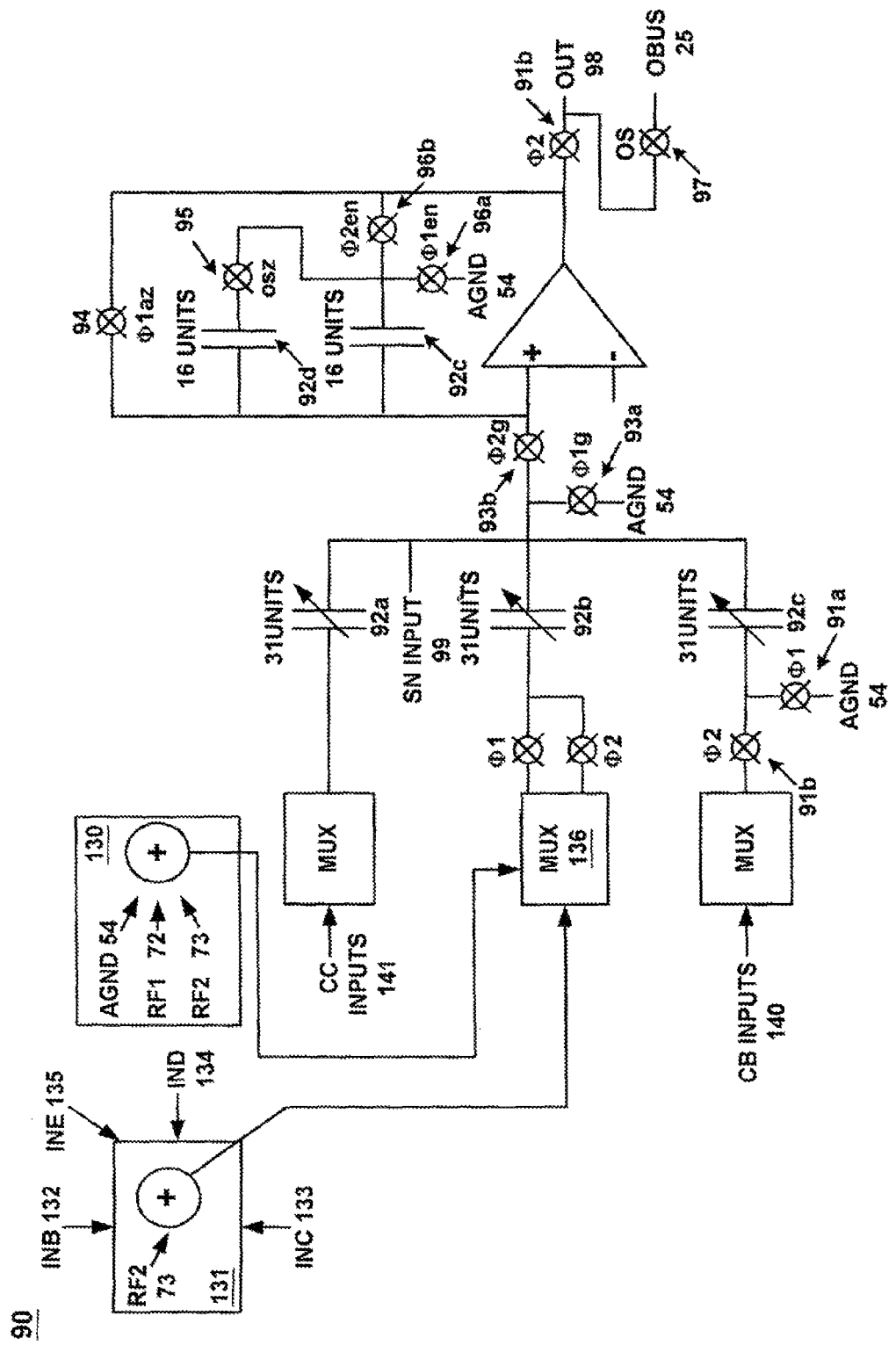
FIG. 10 shows one set of inputs into the switched capacitor block of FIG. 9A in accordance with one embodiment of the present invention.

FIG. 10 shows one set of inputs into one embodiment of a type A switched capacitor block 90 in accordance with the present invention. It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Referring to FIG. 10, REF inputs 130 includes the analog ground AGND 54 and reference voltages RF1 (REFLO) 72 and RF2 (REFHI) 73. CA inputs 131 can include inputs INB 132, INC 133, IND 134 and INE 135 from a continuous time block and/or switched capacitor block adjacent to switched capacitor block 90. CA inputs 131 can also include reference voltage RF2 (REFHI) 73 from a continuous time block and/or switched capacitor block adjacent to switched capacitor block 90. MUX 136 can be programmed so that either CA inputs 131 or REF inputs 130 are sampled on clock phase φ1, thereby allowing inverting or non-inverting configurations. The selection of RF1 (REFLO) 72 and RF2 (REFHI) 73 can be controlled by a comparator (not shown).

Figure 11:
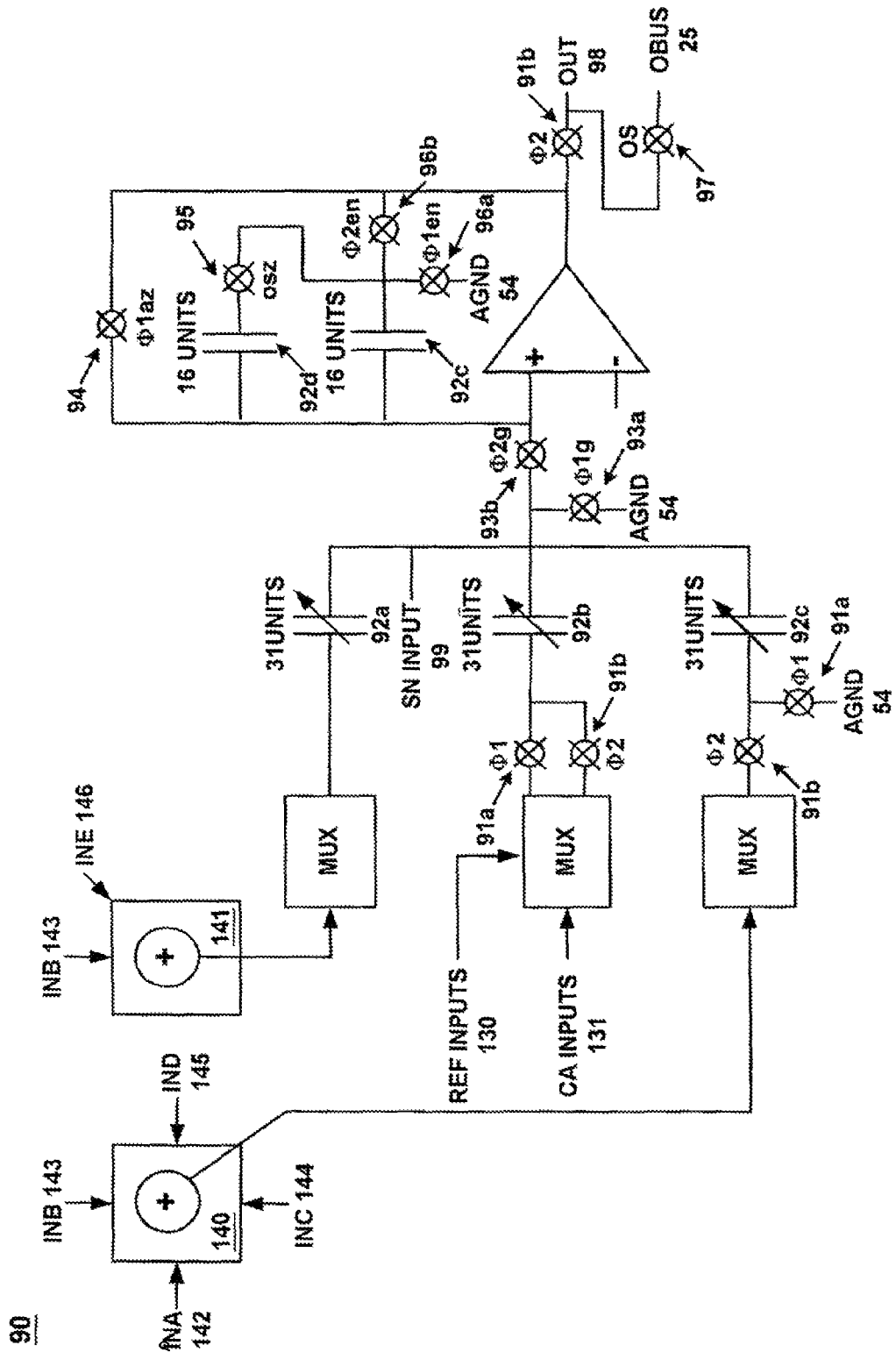
FIG. 11 shows the other set of inputs into the switched capacitor block of FIG. 9A in accordance with one embodiment of the present invention.

FIG. 11 shows the other set of inputs into the type A switched capacitor block 90 of FIG. 9A in accordance with the present invention. As previously mentioned, the inputs to switched capacitor block 90 are a function of the location of switched capacitor block 90 in the array of analog blocks 20 (FIGS. 2 and 3), and the inputs received by switched capacitor block 90 depend on the particular analog function being implemented.

With reference to FIG. 11, CS inputs 140 can include inputs INA 142, INB 143, INC 144 and IND 145 from a continuous time block and/or switched capacitor block adjacent to switched capacitor block 90. CC inputs 141 can include INB 143 and INE 146 from a continuous time block and/or switched capacitor block adjacent to switched capacitor block 90.

Figure 12A:
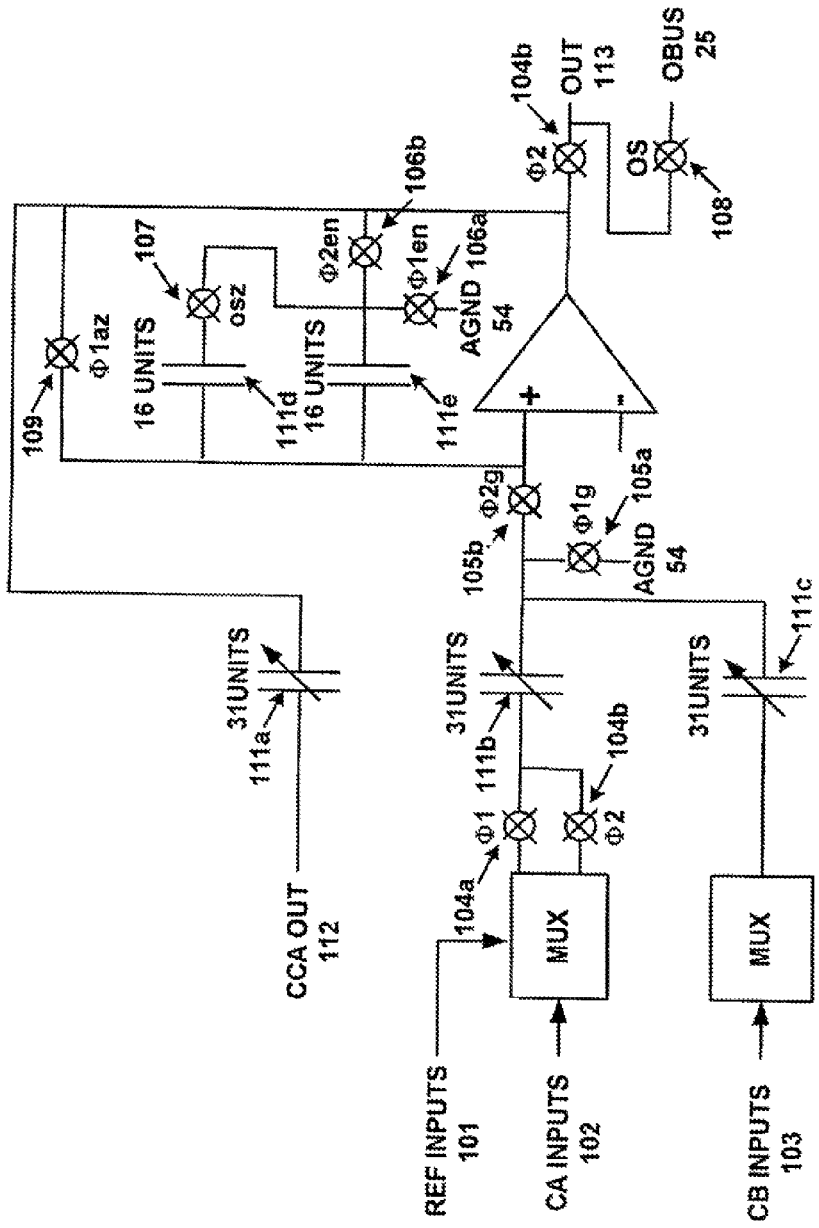
FIG. 12A is a block diagram of another embodiment of a switched capacitor block in accordance with the present invention.

FIG. 12A is a block diagram of another embodiment of a switched capacitor block 100 in accordance with the present invention. This embodiment of switched capacitor block 100 is referred to as a type B switched capacitor block. Switched capacitor block 100 exemplifies analog blocks 21f, 21h, 21i and 21k of FIGS. 2 and 3.

With reference to FIG. 12A, the present embodiment of switched capacitor block 100 receives reference (REF) inputs 101, CCAOUT outputs 112, and inputs from two different types of capacitor arrays, CA inputs 102 and CB inputs 103. The designations "CA" and "CB" are chosen to distinguish the two different types of capacitor arrays that are inputs to switched capacitor block 100, and they may be different from the CA inputs 131 and CB inputs 140 of FIG. 9A. REF inputs 101, CA inputs 102 and CB inputs 103 are described further in conjunction with FIG. 1A3. CCAOUT 112 is a non-switched capacitor feedback from the output. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

Continuing with reference to FIG. 12A, AGND S4 is the analog ground, OBUS (ABUS) 2S is the output to the analog bus (e.g., analog buses 25a-d of FIG. 3), and OUT 113 is an output from switched capacitor block 100 that may serve as an input to an adjacent switched capacitor block (refer to FIG. 3).

In the present embodiment, switched capacitor block 100 includes a multiplicity of switches 104a, 104b, 105a, 10Sb, 106a, 106b, 107, 108 and 109. Each of the switches 104a-b, 10Sa-b, 106a-b and 109 is assigned to a clock phase φ1 or φ2; that is, they are enabled or closed depending on the clock phase. Switches 105a-b, 106a-b and 109 are assigned to gated clocks and function in a known manner. Switches 107 and 108 are not clocked but instead are enabled or closed depending on the user's programming.

Switched capacitor block 100 also includes analog elements having characteristics that can be set and changed in response to the user's programming in accordance with the particular analog function to be implemented. In the present embodiment, switched capacitor block 100 includes programmable capacitors 111a-111 e. In accordance with the present invention, the capacitance of capacitors 111a-e can be changed in response to the user's programming. In the present embodiment, the capacitors 111 a-c are binarily weighted capacitors that allow the capacitor weights to be programmed by the user, while the capacitors 111 d-e are either "in" or "out" (that is, they are not binarily weighted) according to the user programming. In one embodiment, the binary encoding of capacitor size for capacitors 111 a-c comprises 31 units (plus zero) each and the encoding of capacitor size for capacitors 111 d-e is 16 units each.

Switched capacitor block 100 is configured such that it can be used for the output stage of a switched capacitor biquad filter. When preceded by a type A switched capacitor block, the combination of blocks provides a complete switched capacitor biquad (see FIGS. 14A and 148).

Figure 12B:
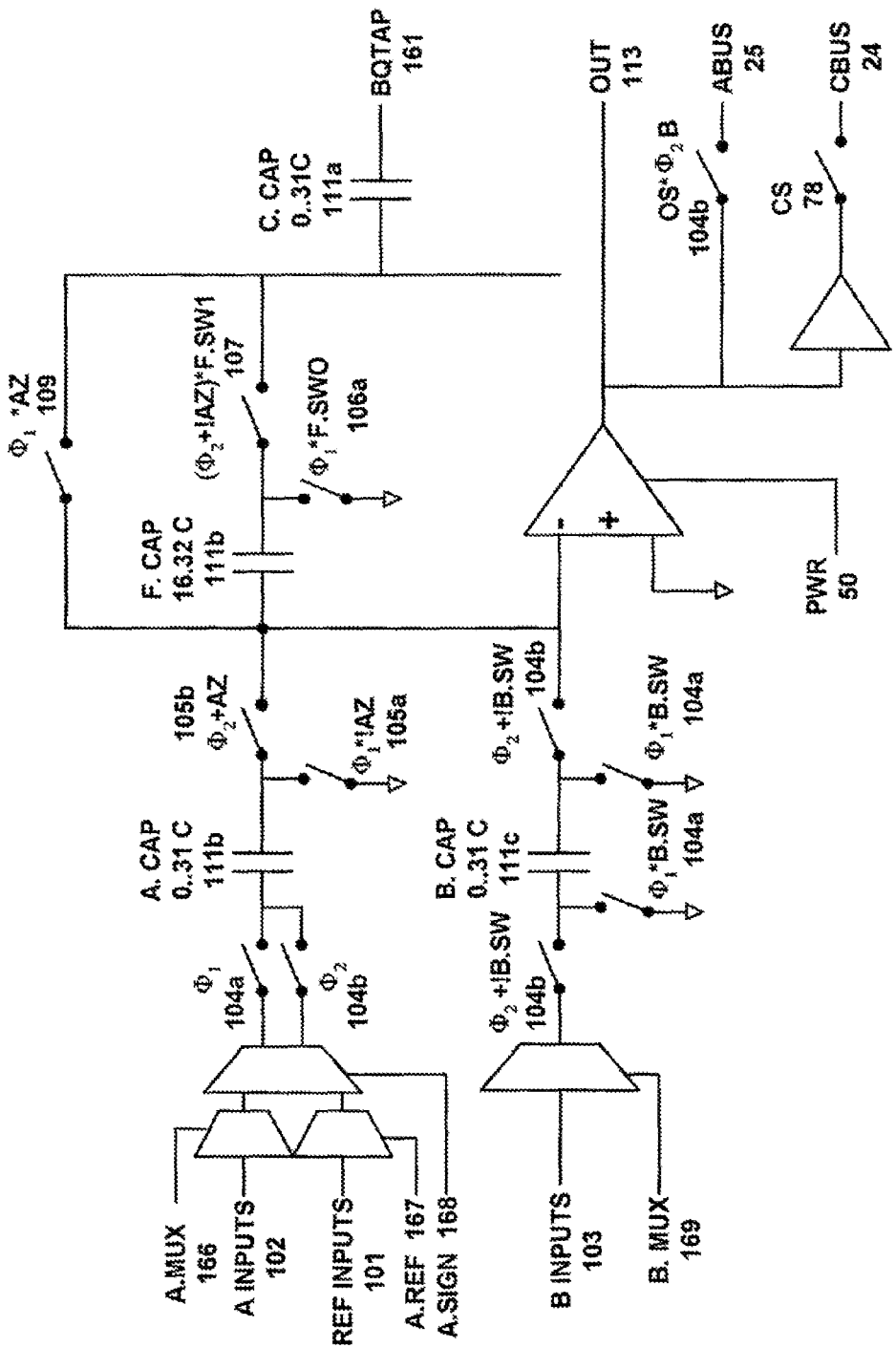
FIG. 12B is a schematic diagram of the switched capacitor block of FIG. 12A in accordance with one embodiment of the present invention.

FIG. 12B is a schematic diagram of a switched capacitor block 100a in accordance with one embodiment of the present invention. ABUS 25 is the output to the analog bus (e.g., buses 25a-d of FIG. 3). CBUS 24 is the output to the digital bus (e.g., buses 24a-d of FIG. 3). PWR 50 is a bit stream for encoding the power level for switched capacitor block 90a. CS 78 controls the output to CBUS 24.

Continuing with reference to FIG. 12B, BQTAP 161 is used when switched capacitor block 100a is used with a type A switched capacitor block to form a switched capacitor biquad (refer to FIGS. 14A and 14B below). A.MUX 166 is for controlling the multiplexing of the inputs for the A (CA) inputs 102. A.REF 167 is for controlling the reference voltage inputs (REF inputs 101). A.SIGN 168 controls the switch phasing of the switches on the bottom plate of the capacitor 111b; the bottom plate samples the input or the reference. B.MUX 169 is for controlling the multiplexing of the inputs for the B (CB) inputs 103.

Figure 13:
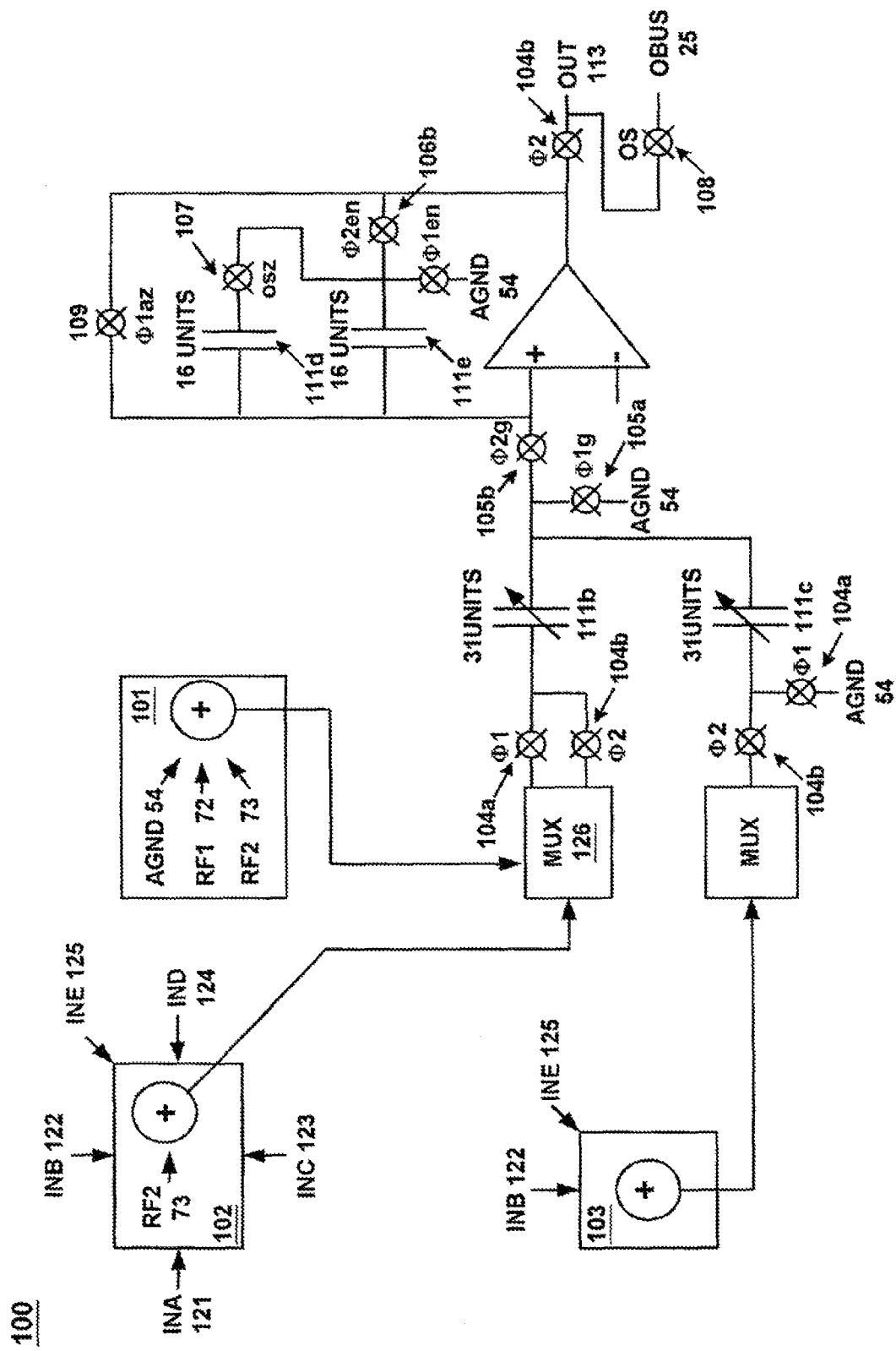
FIG. 13 shows the inputs into the switched capacitor block of FIG. 12A in accordance with one embodiment of the present invention.

FIG. 13 shows the inputs into one embodiment of a type B switched capacitor block 100 in accordance with the present invention. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

With reference to FIG. 13, REF inputs 101 includes the analog ground AGND 54 and reference voltages RF1 (REFLO) 72 and RF2 (REFHI) 73. CA inputs 102 can include inputs INA 121, INB 122, INC 123, IND 124 and INE 125 from a continuous time block and/or switched capacitor block adjacent to switched capacitor block 100. CS inputs 103 can include INB 122 and INE 125 from a continuous time block and/or switched capacitor block adjacent to switched capacitor block 100. MUX 126 can be programmed so that either CA inputs 102 or REF inputs 101 are sampled on clock phase φ1, thereby allowing inverting or non-inverting configurations.

Figure 14A:
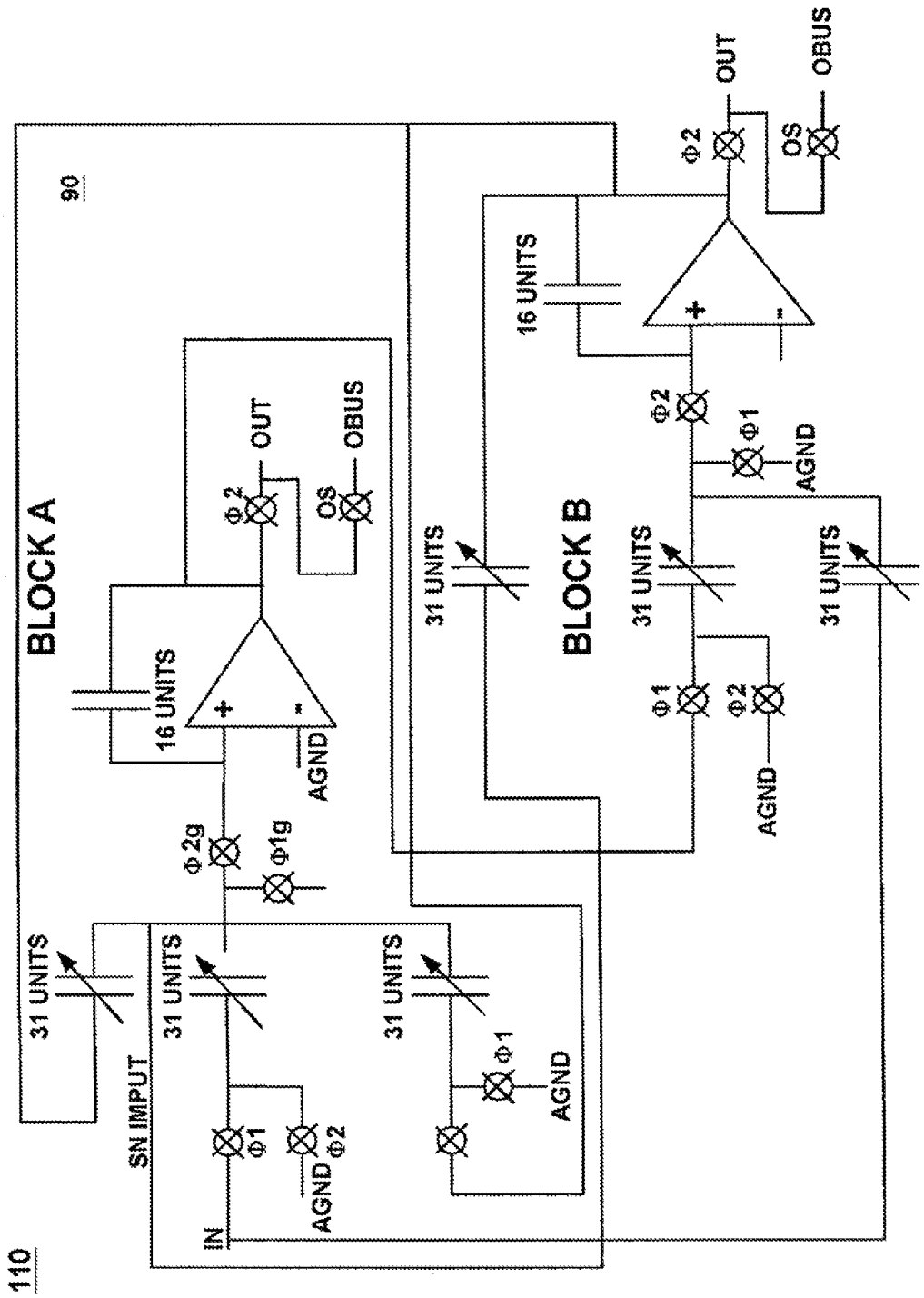
FIG. 14A is a block diagram showing one embodiment of a switched capacitor biquad in accordance with the present invention.
Figure 14B:
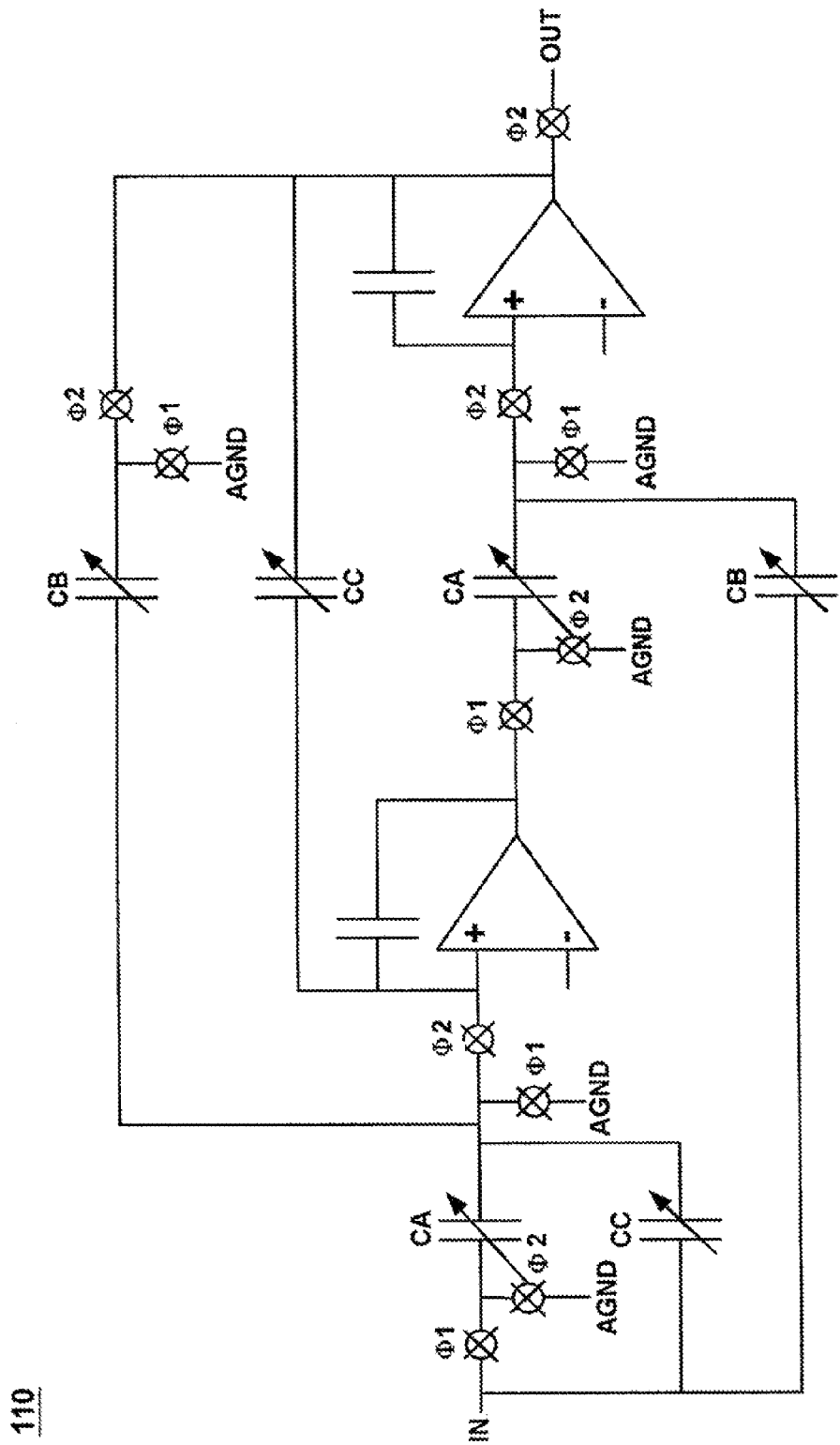
FIG. 14B is a schematic diagram showing one embodiment of a switched capacitor biquad in accordance with the present invention.

FIGS. 14A and 14B are diagrams showing one embodiment of a switched capacitor biquad 110 in accordance with the present invention. FIG. 14A shows the basic interconnection between a type A switched capacitor block 90 and a type B switched capacitor block 100. FIG. 14B is a schematic of a switched capacitor biquad 110 resulting from the interconnection of switched capacitor block 90 and switched capacitor block 100.

Figure 15:
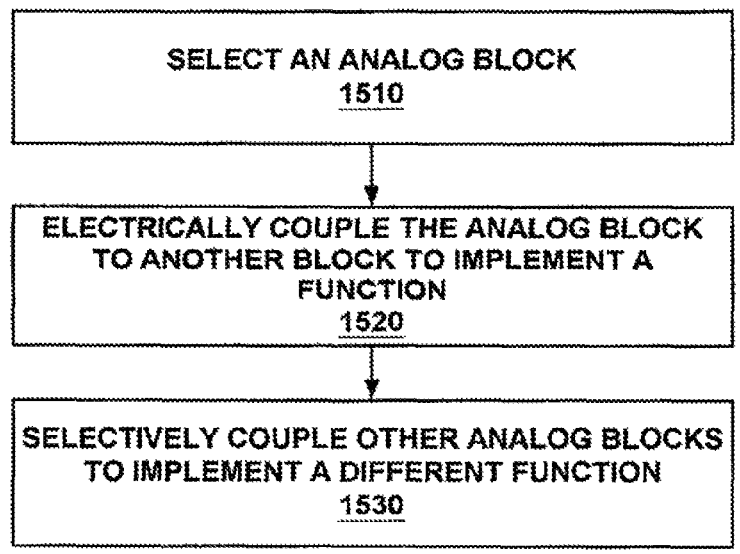
FIG. 15 is a flowchart of the steps in a process for implementing multiple functions using a single integrated circuit in accordance with one embodiment of the present invention.

FIG. 15 is a flowchart of the steps in a process 1500 for implementing multiple functions using a single integrated circuit (e.g., integrated circuit 10 of FIG. 1A) in accordance with one embodiment of the present invention.

As described above, integrated circuit 10 includes a plurality of analog blocks 20 (FIGS. 2 and 3) that can be electrically coupled in different combinations to perform different functions. In step 1510 of FIG. 15, according to the user's programming, an analog block is selected from analog blocks 20.

In step 1520, the selected analog block is selectively and electrically coupled to one or more of the other analog blocks 20, depending on the particular analog function to be implemented and according to the user's programming. Certain analog blocks may be bypassed (not used) in the resultant circuit. Characteristics of elements in the analog blocks 20 can also be specified according to the user's programming, also depending on the particular analog function to be implemented.

In step 1530, the analog blocks 20 are reconfigured to perform a different analog function (e.g., a different combination of the analog blocks 20 can be selectively and electrically coupled to perform another function).

Exemplary Programmable Digital Functionality

The following co-pending US application is hereby incorporated herein by reference, Ser. No. 09/909,045, by Warren Snyder, entitled "Digital Configurable Macro Architecture," filed Jul. 18, 2001, and which is assigned to the assignee of the present invention. Further, the following co-pending US application is also hereby incorporated herein by reference, Ser. No. 09/909,109, by Warren Snyder, entitled "Configuring Digital Functions In A Digital Configurable Macro Architecture," filed Jul. 18, 2001, and which is also assigned to the assignee of the present invention.

A new digital configurable macro architecture is described. The digital configurable macro architecture is well suited for microcontroller or controller designs. In particular, the foundation of the digital configurable macro architecture is a programmable digital circuit block. In an embodiment, programmable digital circuit blocks are 8-bit circuit modules that can be programmed to perform anyone of a variety of predetermined digital functions by changing the contents of a few registers therein, unlike a FPGA which is a generic device that can be programmed to perform any arbitrary digital function. Specifically, the circuit components of the programmable digital circuit block are designed for reuse in several of the predetermined digital functions such that to minimize the size of the programmable digital circuit block. The programmable digital circuit blocks can be configured, for example, as timers, counters, serial communication ports, cyclic redundancy generators/checkers (CRC), or pseudo random sequence generators (PRS). The user selects the digital function that is needed and configures the programmable digital circuit block accordingly.

The programmable digital circuit blocks can be configured to coupled in series or in parallel to handle more complex digital functions. For example, a 24-bit timer can be designed by coupling three 8-bit programmable digital circuit blocks that have been individually configured as 8-bit timers. Additionally, a first programmable digital circuit block that is configured as a CRC generator can feed a second programmable digital circuit block that is configured as a serial output communication port. A variety of mathematical functions such as addition, multiplication, exponential, logarithmic, arithmetic and floating point operations, and a plethora of other mathematical functions may be effectuated herein.

More importantly, the configuration of the programmable digital circuit block is determined by its small number of configuration registers. This provides much flexibility. In particular, the configuration of the programmable digital circuit block is fast and easy since changes in configuration are accomplished by changing the contents of the configuration registers, whereas the contents are generally a small number of configuration data bits. Thus, the programmable digital circuit block is dynamically configurable from one predetermined digital function to another predetermined digital function for real-time processing. The function of the registers described herein may be effectuated, in one embodiment, by latches.

FIG. 16 illustrates a programmable digital circuit block 100 in accordance with an embodiment of the present invention. The programmable digital circuit block 100 is the foundation of a new digital configurable macro architecture of the present invention. The digital configurable macro architecture is well suited for microcontroller or controller designs.

The design of the programmable digital circuit block 100 in the digital configurable macro architecture was developed after examining and studying conventional microcontrollers to determine the types of digital functions that were implemented within various conventional microcontrollers. It was discovered that there were not very many different types of digital functions demanded in microcontroller applications. Furthermore, it was determined that these different types of digital functions had many circuit components in common. Moreover, it was determined that the digital functions were generally implemented as 8-bit or multiples of 8-bits because their length was generally based on the length of standard buses. This led to the development of the programmable digital circuit blocks 100, the building block of the digital configurable macro architecture.

In an embodiment, the programmable digital circuit block 100 is an 8-bit circuit module that can be programmed to perform anyone of a variety of predetermined digital functions (which are useful in microcontroller applications) by changing the contents of a few configuration registers 50 therein, unlike a FPGA which is a generic device that can be programmed to perform any arbitrary digital function. Specifically, the circuit components of the programmable digital circuit block 100 are designed for reuse in several of the predetermined digital functions such that to minimize the size of the programmable digital circuit block 100. Hence, the programmable digital circuit block 100 is highly efficient in terms of die area. In an embodiment, the programmable digital circuit block 100 can be configured as a timer, a counter, a pulse width modulator (PWM), a cyclic redundancy generator/checker (CRC), a pseudo random sequence generator (PRS), a dead zone delay, a UART (universal asynchronous receiver-transmitter) transmitter, a UART (universal asynchronous receiver-transmitter) receiver, a SPI (serial peripheral interface) Master, or a SPI (serial peripheral interface) Slave.

In another embodiment, the programmable digital circuit block 100 can be configured as a timer, a counter, a pulse width modulator (PWM), a cyclic redundancy generator/checker (CRC), a pseudo random sequence generator (PRS), or a dead zone delay, whereas the digital communication functions (e.g., UART and SPI) are eliminated to further reduce the size of the programmable digital circuit block 100. In particular, the user selects the digital function that is needed and configures the programmable digital circuit block 100 accordingly. It should be understood that the programmable digital circuit block 100 can be designed to implement other digital functions.

In as much as a design can have an array of programmable digital circuit blocks 100, configurable to be coupled together in series or in parallel to handle more complex digital functions or to increase precision, a number of capabilities become achievable. As in the example recited above wherein a 24-bit timer can be designed by coupling three 8-bit programmable digital circuit blocks 100 that have been individually configured as 8-bit timers, other similar capabilities are achieved. For example, an 8-bit timer can be extended to 16- or 32-bit digital functions by similarly coupling multiple programmable digital circuit blocks 100 together. And in another example above, the capability of a first programmable digital circuit block configured as a CRC generator feeding a second programmable digital circuit block to configure a serial output communication port, illustrates achieving the advantages of reducing device programming and increasing its performance.

The configuration of the programmable digital circuit block 100 is determined by its configuration registers 50. The programmable digital circuit block 100 generally has one or more configuration registers 50. Importantly, a significant level of flexibility is thus achieved, in as much as the configuration of the programmable digital circuit block 100 may be made quickly, simply, and dynamically. It is achieved in one embodiment, by changing the contents of the configuration registers 50, which are generally a small number of configuration data bits. This dynamic configurability/reconfigurability between predetermined digital functions enables programmable digital circuit block 100 to effectuate, in one embodiment, real-time processing. In contrast, FPGAs need to have their look-up tables re-programmed in order to have them implement a new digital function, a time-consuming task that is not done in real-time processing.

Referring to FIG. 16, in an embodiment the programmable digital circuit block 100 includes one or more configuration registers 50, one or more data registers 40, a plurality of selectable logic circuits 30, one or more configurable inputs 20, one or more configurable outputs 10, one or more cascade outputs 60, one or more cascade inputs 70, a clock input 80, and a system input 90. It should be understood that the programmable digital circuit block 100 can have other designs including lengths other than 8-bits.

The configuration registers 50 are programmed via the system bus 90. Any device, such as a microprocessor using data stored in a RAM or flash memory, can program (or write to) the configuration registers. The configuration registers 50 receive and store a plurality of configuration data corresponding to anyone of the plurality of predetermined digital function described above. The programmed configuration registers 50 configure the programmable digital circuit block 100 to perform anyone of the predetermined digital functions based on the configuration data. Moreover, the configuration registers 50 can be dynamically programmed with the configuration data for real-time processing. In addition, the configuration data includes (1) bits for indicating one of the predetermined digital functions and configuring the selectable logic circuits 30, (2) bits for configuring and selecting the configurable inputs 20 and the configurable outputs 10 and the clock input 80, (3) bits for indicating the mode of the predetermined digital function (e.g., parity, no parity, etc.), (4) bits for indicating the length of the predetermine digital function if several programmable digital circuit block 100 are coupled together (e.g., 8-bit, 16-bit, 24-bit, etc.), and (5) bits for indicating and configuring the interface between adjacent programmable digital circuit blocks 100 that are coupled together (e.g., configuring and selecting the cascade inputs 70 and the cascade outputs 60 for serial or parallel interfacing).

In general, the number of bits in the configuration data is sufficiently small to enable the configuration registers 50 to be programmed on-the-fly so that the programmable digital circuit block 100 can be dynamically configured and interfaced. Thus, the programmable digital circuit blocks 100 can be configured as a timer for a first length of time, re-configured as a counter for a second length of time, re-configured as a PWM for a third length of time, and so on, for real-time processing. For example, it is possible for a single register write to configure the programmable digital circuit block 100 from a timer to a PWM or to a counter or to a CRC generator or etc. Some number of registers are configurable to store programming data for the programmable digital circuit blocks.

The connections 50A-50F between the configuration registers 50 and other components of the programmable digital circuit block 100 enable the configuration registers 50 to properly configure the programmable digital circuit block 100 to any one of the predetermined digital functions and to properly interface the programmable digital circuit block 100 with other programmable digital circuit blocks in series or in parallel.

Continuing with FIG. 16, the selectable logic circuits 30 are tailored such that they have a minimum set of circuit resources that can be programmed by the configuration registers 50 to implement anyone of a variety of predetermined digital functions, unlike the FPGA where a substantial amount of circuit resources may remain unused. In particular, the design and structure of the selectable logic circuits 30 are dependent on the predetermined digital functions such that to minimize the size of the programmable digital circuit block 100. The fixed number of digital functions for the programmable digital circuit block 100 substantially influences the design of the programmable digital circuit block 100, providing cost savings and improving performance. The configuration registers 50 configure and select any of the selectable logic circuits 30 to perform one of the predetermined digital functions based on the configuration data. More importantly, the selectable logic circuits 30 are reused in several of the predetermined digital functions as will be illustrated below, ensuring the size efficiency of the programmable digital circuit block 100. In an embodiment, the selectable logic circuits 30 include a plurality of logic gates.

Moreover, the selectable logic circuits 30 realize anyone of the variety of predetermined digital functions by using the data registers 40 to receive data, load data, capture data, etc. Thus, the data registers 40 are also reused in several of the predetermined digital functions as will be illustrated below.

Again referencing FIG. 16, the cascade outputs 60 and the cascade inputs 70 are selected and configured according to the configuration data. The cascade outputs 60 allow the programmable digital circuit block 100 to output signals for directly interfacing with adjacent or neighboring programmable digital circuit blocks. The cascade inputs 70 allow the adjacent or neighboring programmable digital circuit blocks to send signals that directly interface and are received by the programmable digital circuit block 100. Specifically, the cascade outputs 60 and the cascade inputs 70 enable multiple programmable digital circuit blocks to seamlessly interface to handle more complex digital functions or to increase precision as described above (e.g., 32-bit timer, CRC generator and SPI Master, 24-bit counter, etc.).

Figure 17:
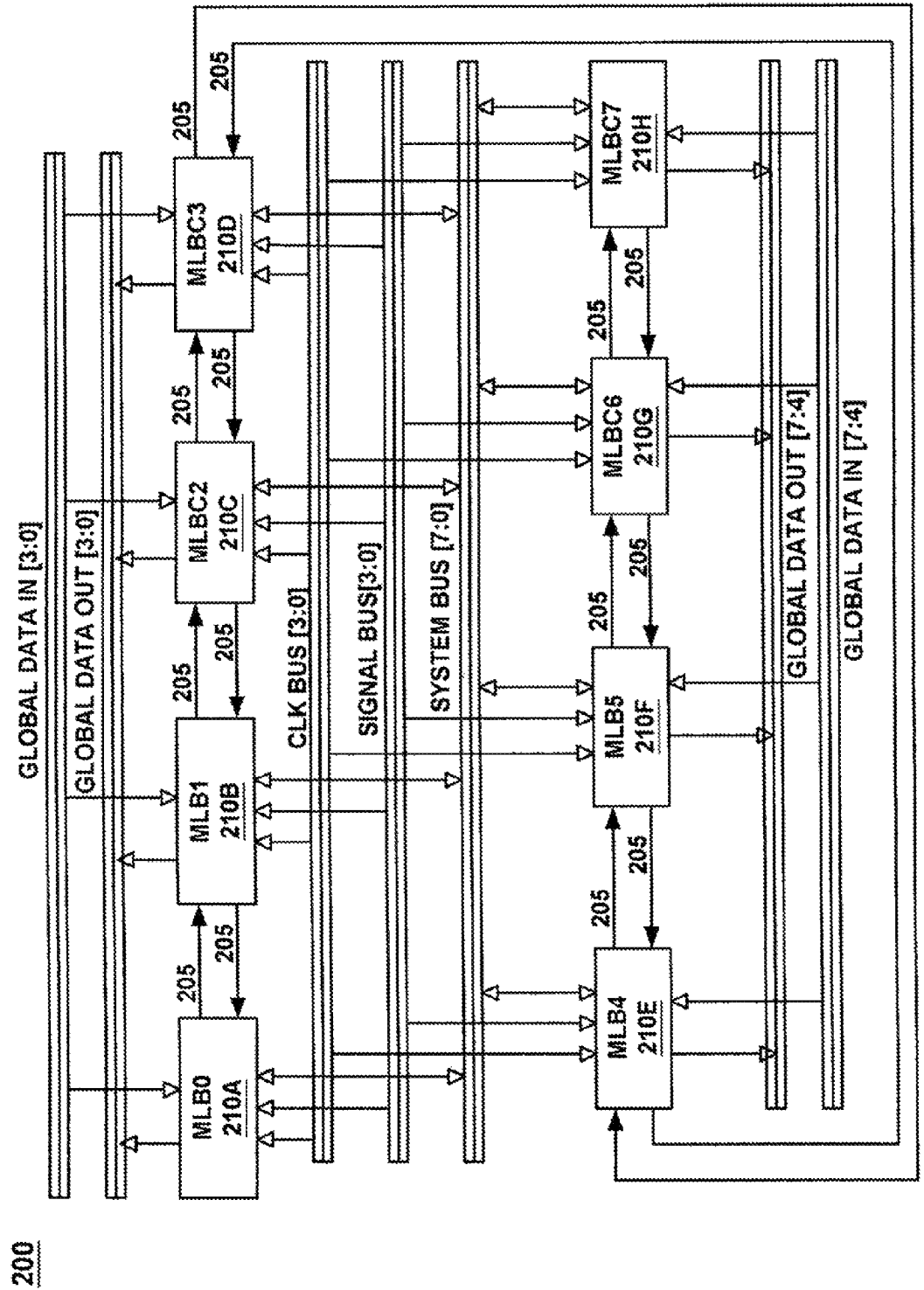
FIG. 17 illustrates a block diagram of an exemplary programmable digital device having a plurality of programmable digital circuit blocks in accordance with an embodiment of the present invention.

FIG. 17 illustrates a block diagram of an exemplary programmable digital device 200 having a plurality of programmable digital circuit blocks 210A-210H in accordance with an embodiment of the present invention. The plurality of programmable digital circuit blocks 210A-210H includes a first group and a second group. The first group includes the programmable digital circuit blocks 210A-210B and 210E-210F. Moreover, each programmable digital circuit block of the first group can be configured as a timer, a counter, a pulse width modulator (PWM), a cyclic redundancy generator/checker (CRC), a pseudo random sequence generator (PRS), or a dead zone delay. The second group includes the programmable digital circuit blocks 210C-210D and 210G-210H. Moreover, each programmable digital circuit block of the second group can be configured as a timer, a counter, a pulse width modulator (PWM), a cyclic redundancy generator/checker (CRC), a pseudo random sequence generator (PRS), a dead zone delay, a UART (universal asynchronous receiver-transmitter) transmitter, a UART (universal asynchronous receiver-transmitter) receiver, a SPI (serial peripheral interface) Master, or a SPI (serial peripheral interface) Slave.

As illustrated in FIG. 17, adjacent or neighboring programmable digital circuit blocks are interfaced via cascade lines 205 (input or output) as described above.

The cascade lines 205 enable the programmable digital circuit blocks 210A-210H to seamlessly interface to handle more complex digital functions or to increase precision. For example, a 32-bit counter can be designed by coupling four 8-bit programmable digital circuit blocks that have been individually configured as 8-bit counters. Similarly, the 8-bit counter can be extended to 16- or 24-bit digital functions by coupling multiple programmable digital circuit blocks together. Additionally, a first programmable digital circuit block that is configured as a CRC generator can feed a second programmable digital circuit block that is configured as a serial output communication port, reducing device programming and increasing performance.

Moreover, the exemplary programmable digital device 200 includes a signal bus for digitized analog signals, a clock bus, a system bus for programming the programmable digital circuit blocks 210A-210H, and a plurality of global data buses for transmitting data to/from the programmable digital circuit blocks 210A-210H.

Figure 18:
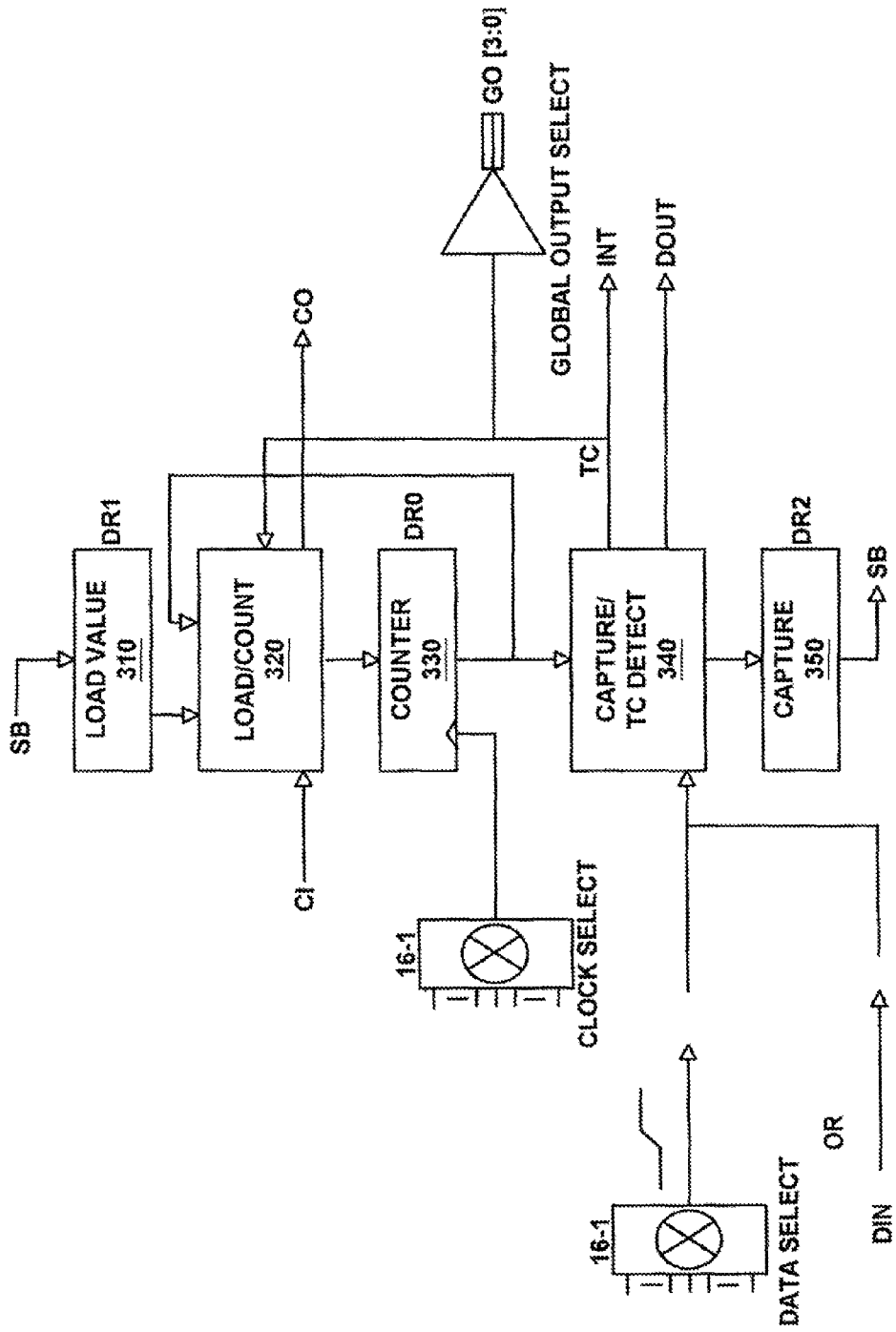
FIG. 18 illustrates a block diagram of a timer configuration of a programmable digital circuit block in accordance with an embodiment of the present invention.

FIG. 18 illustrates a block diagram of a timer configuration of a programmable digital circuit block in accordance with an embodiment of the present invention. FIG. 4 illustrates a block diagram of a counter configuration of a programmable digital circuit block in accordance with an embodiment of the present invention. FIG. 5 illustrates a block diagram of a pulse width modulator (PWM) configuration of a programmable digital circuit block in accordance with an embodiment of the present invention.

Figure 19:
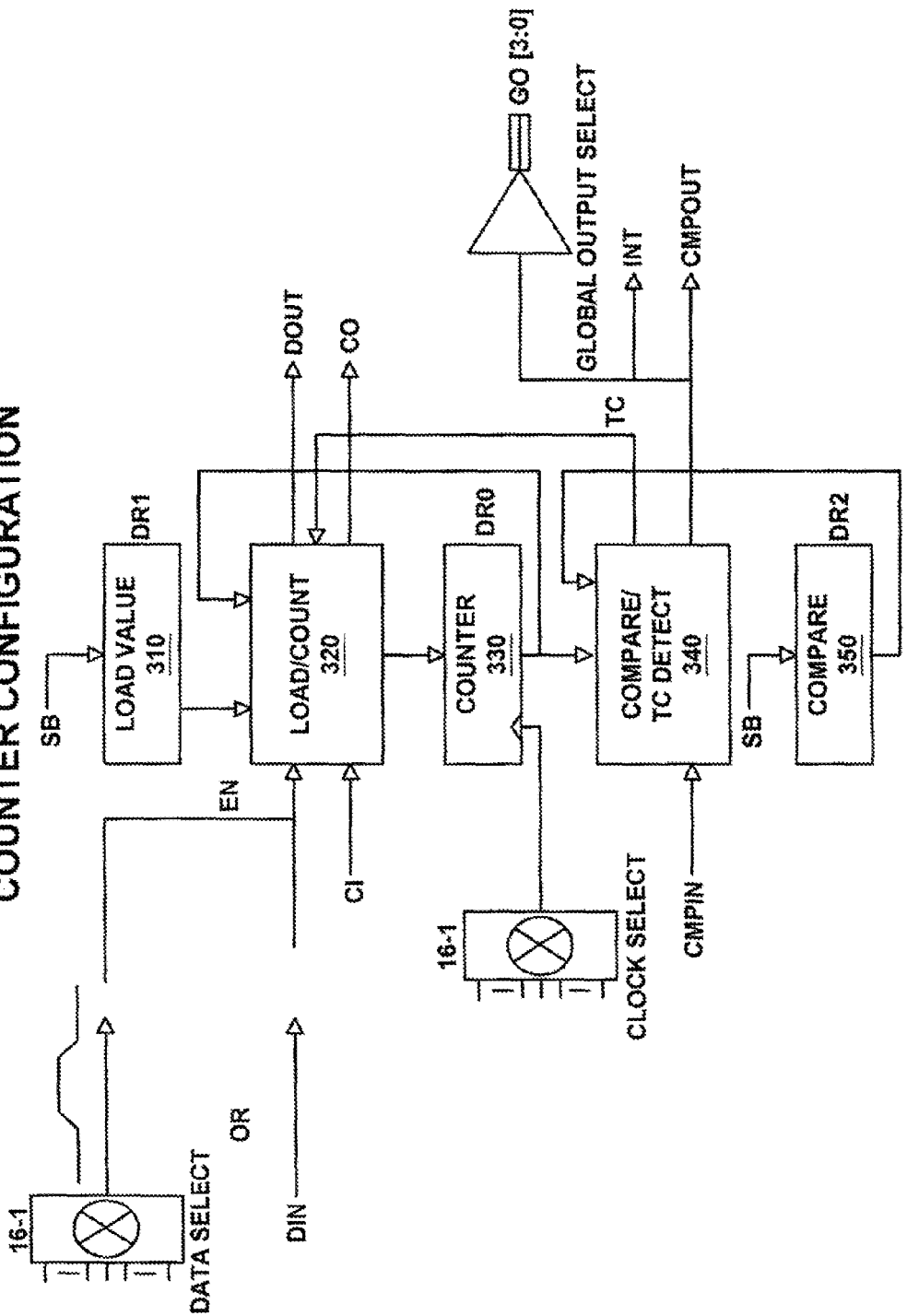
FIG. 19 illustrates a block diagram of a counter configuration of a programmable digital circuit block in accordance with an embodiment of the present invention.
Figure 20:
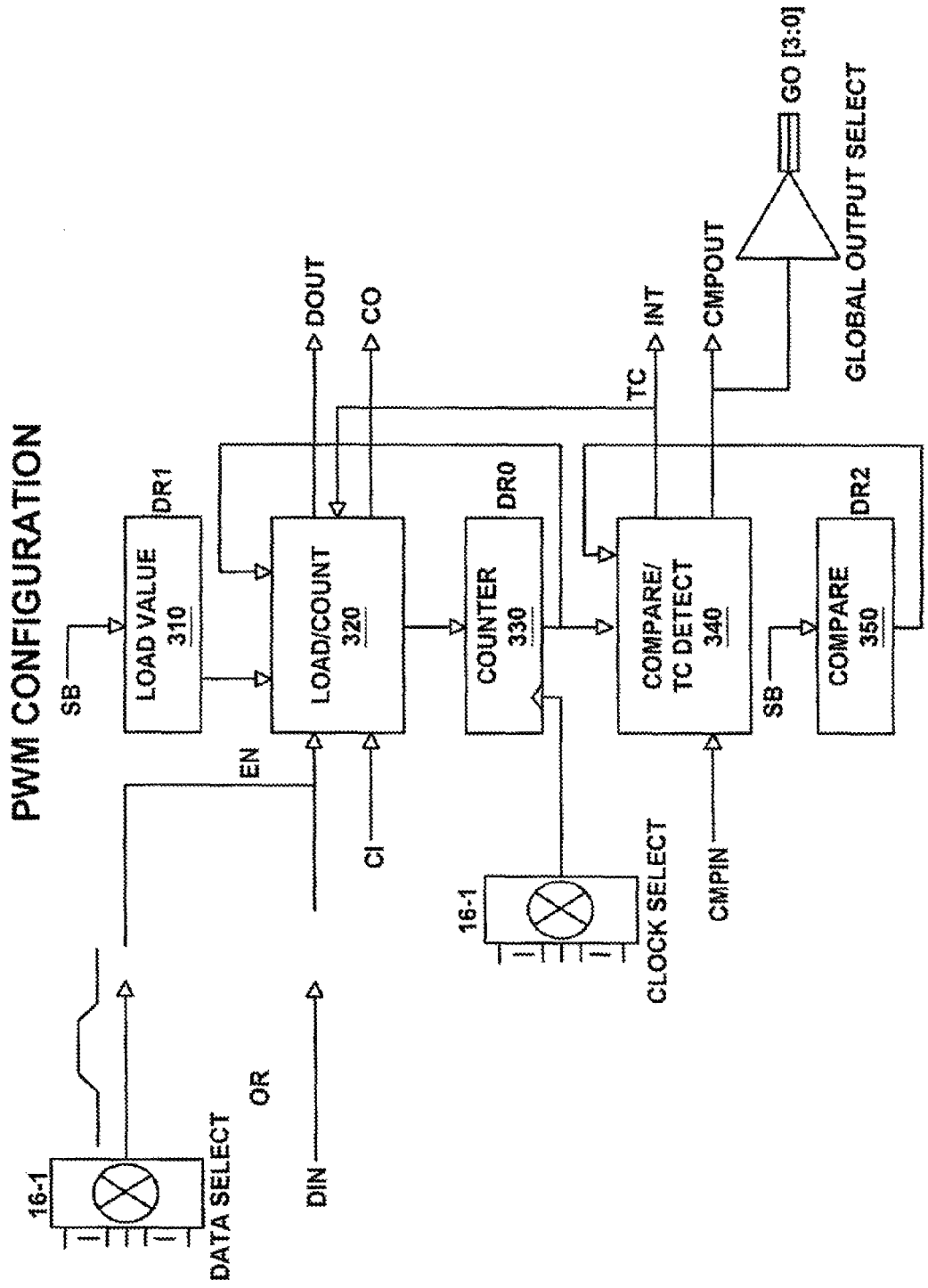
FIG. 20 illustrates a block diagram of a pulse width modulator (PWM) configuration of a programmable digital circuit block in accordance with an embodiment of the present invention.

As illustrated in FIGS. 18-20, the selectable logic circuits 320 and 340 are reused for the timer, counter, and PWM configurations. Moreover, the first data register 310, the second data register 330, and the third data register 350 of the programmable digital circuit block are reused for the timer, counter, and PWM configurations. In essence, the configuration data loaded onto the configuration registers determines how the data registers 310, 330, and 350 are to be used, what operation is to be performed on the data by the selectable logic circuits 320 and 340, where the input data is selected from (e.g., system bus (S8), signal bus, global bus, etc.), where the output data is transmitted, what clock signal is to be used, what are the cascade inputs (e.g., DIN, CI, etc.) from other programmable digital circuit blocks, what are the cascade outputs (e.g., DOUT, CO, etc.) to other programmable digital circuit blocks, when to generate an interrupt (INT), and what is the data flow within the programmable digital circuit block so that the programmable digital circuit block can properly perform anyone of the predetermined digital functions.

Figure 21:
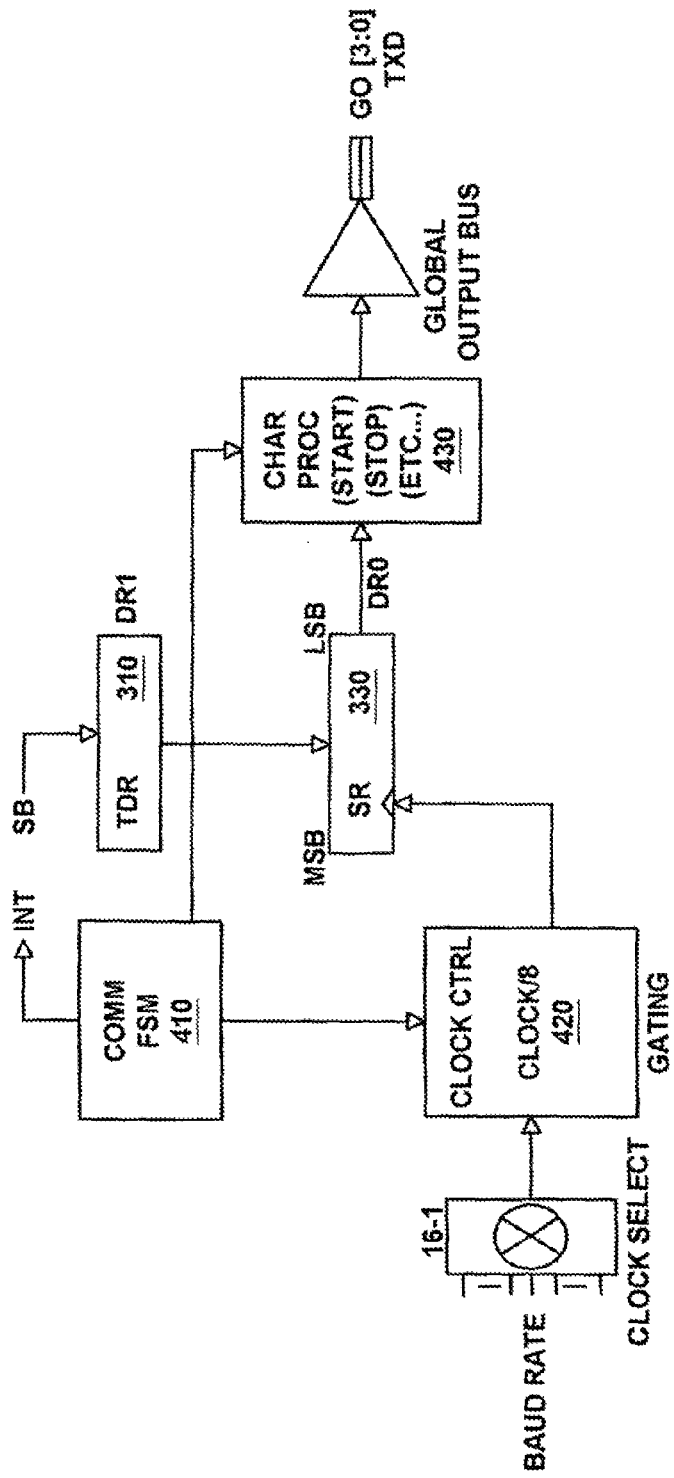
FIG. 21 illustrates a block diagram of a UART transmitter configuration of a programmable digital circuit block in accordance with an embodiment of the present invention.
Figure 22:
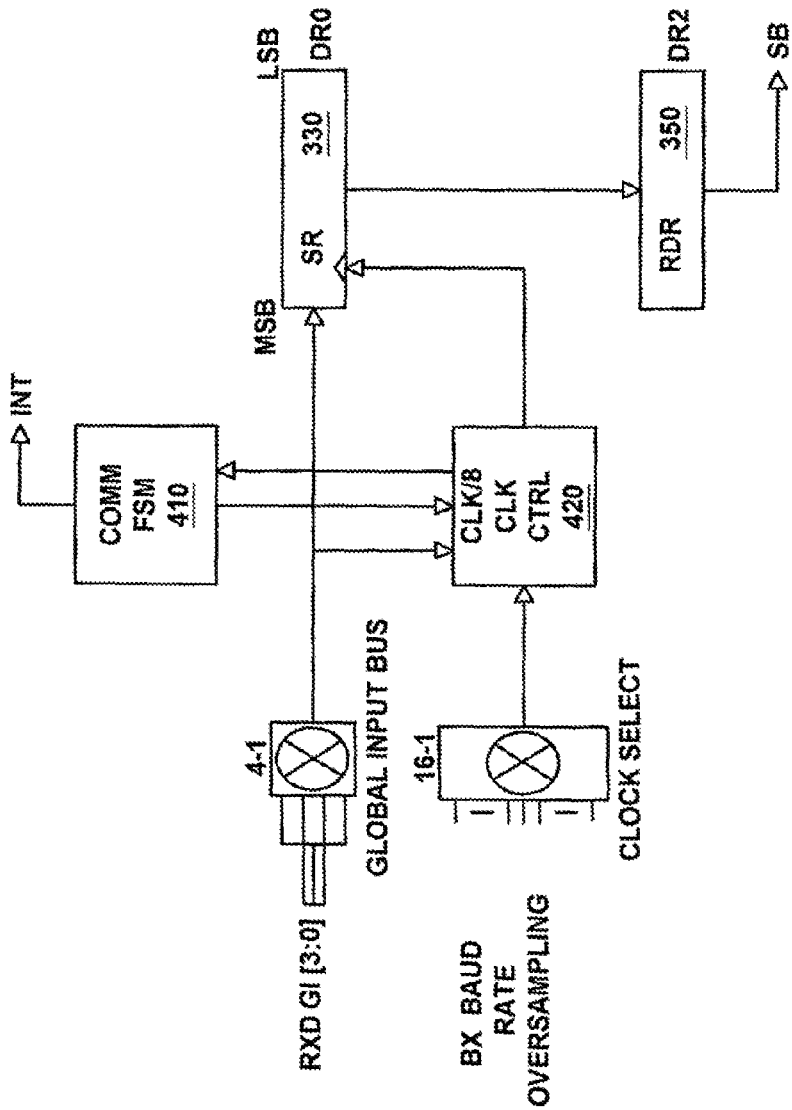
FIG. 22 illustrates a block diagram of a UART receiver configuration of a programmable digital circuit block in accordance with an embodiment of the present invention.
Figure 23:
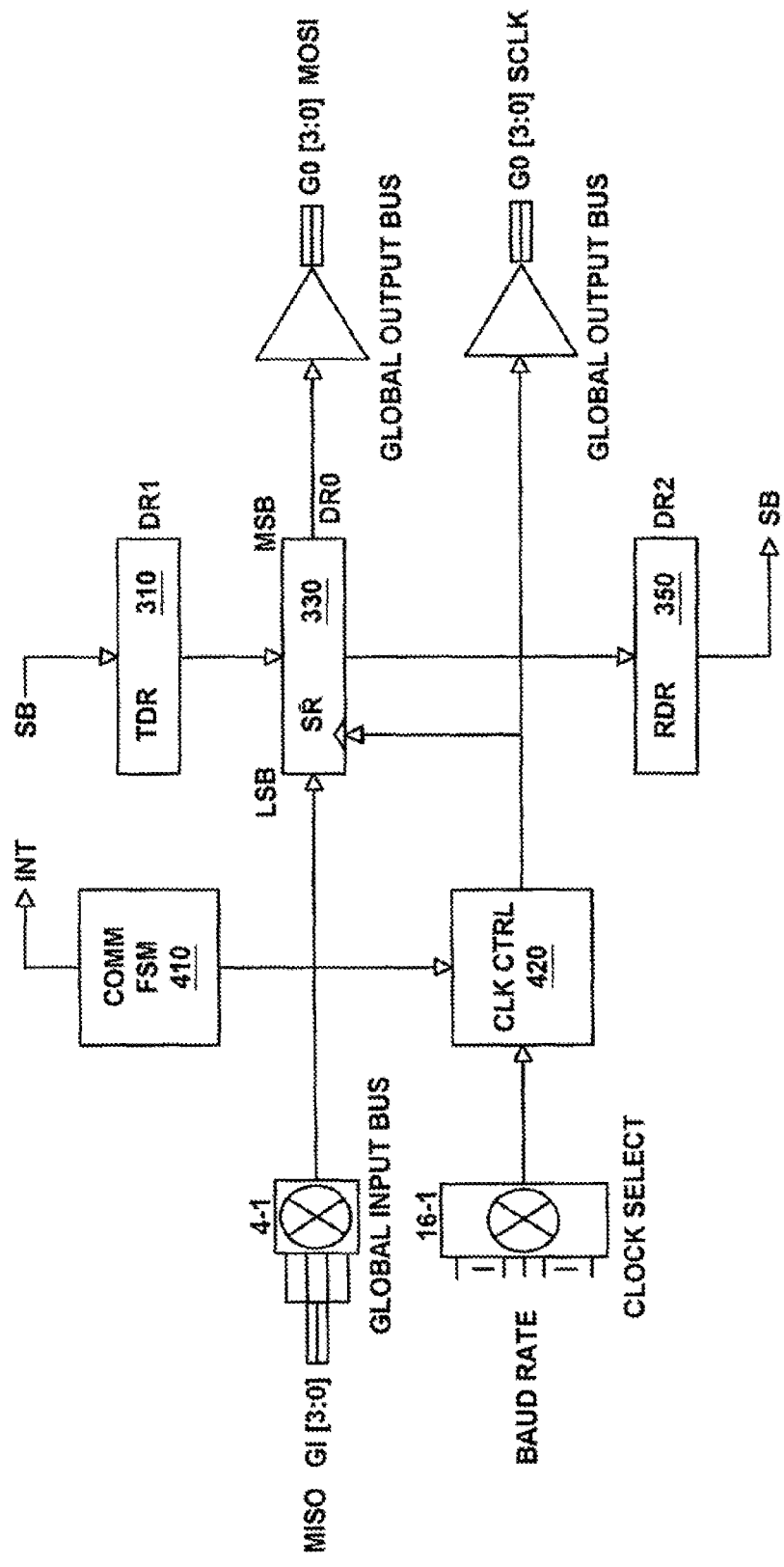
FIG. 23 illustrates a block diagram of a SPI Master configuration of a programmable digital circuit block in accordance with an embodiment of the present invention.
Figure 24:
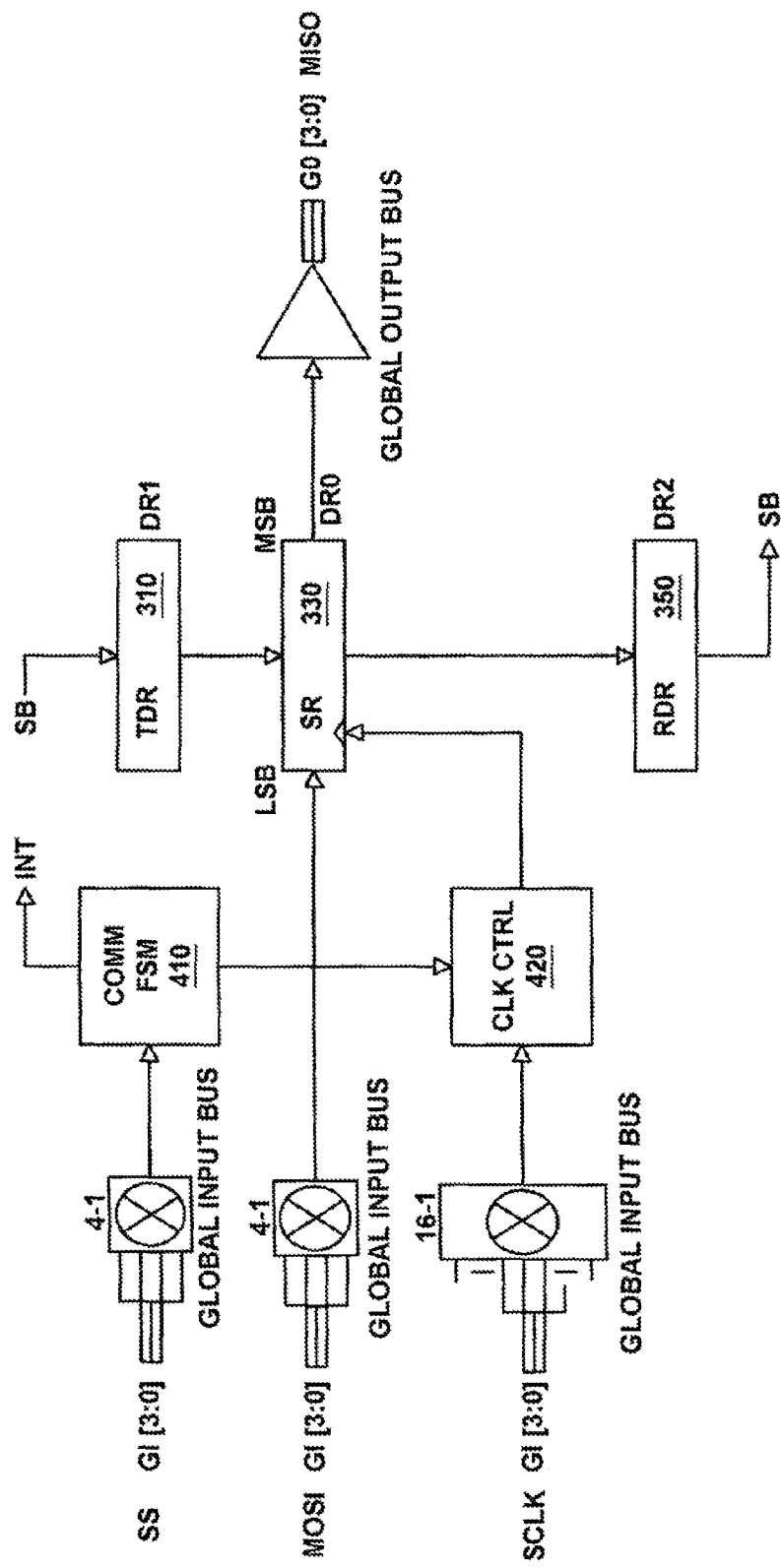
FIG. 24 illustrates a block diagram of a SPI Slave configuration of a programmable digital circuit block in accordance with an embodiment of the present invention.

FIG. 21 illustrates a block diagram of a UART transmitter configuration of a programmable digital circuit block in accordance with an embodiment of the present invention. FIG. 22 illustrates a block diagram of a UART receiver configuration of a programmable digital circuit block in accordance with an embodiment of the present invention. FIG. 23 illustrates a block diagram of a SPI Master configuration of a programmable digital circuit block in accordance with an embodiment of the present invention. FIG. 24 illustrates a block diagram of a SPI Slave configuration of a programmable digital circuit block in accordance with an embodiment of the present invention.

As illustrated in FIGS. 21-24, the selectable logic circuits 410 and 420 are reused for the UART transmitter, the UART receiver, the SPI Master, and the SPI Slave configurations. Moreover, the first data register 310, the second data register 330, and the third data register 350 of the programmable digital circuit block are reused in several of the UART transmitter, the UART receiver, the SPI Master, and the SPI Slave configurations. However, the selectable logic circuit 430 is used in the UART transmitter configuration of FIG. 21 since the UART protocol requires that particular protocol bits (e.g., start bits, stop bits, etc.) to be generated by the UART transmitter.

FIGS. 18-24 illustrate that the programmable digital circuit block can be configured fast and easily. Furthermore, FIGS. 18-24 illustrate that the programmable digital circuit block is highly efficient in terms of die area.

In a programmable digital circuit according to one embodiment, at least three programmable digital circuit blocks are coupled in series and/or in parallel. Each programmable digital circuit block is (i) controlled by an n-bit register or look-up table containing programming information including a cascading bit and (ii) configured to provide at least one of a plurality of mathematical functions, wherein the cascading bit determines whether a particular programmable digital circuit block is coupled is series with an adjacent programmable digital circuit block, and when programmed, the programmable digital circuit provides at least one digital system function.

Exemplary Mapping & Configurability Functionality

The following co-pending US application is hereby incorporated herein by reference, Ser. No. 09/953,423, by Warren Snyder, entitled "A Configurable Input/Output Interface For A Microcontroller," filed Sep. 14, 2001, and which is assigned to the assignee of the present invention.

One embodiment of the present invention provides a configurable input/output interface which allows designers to specify which resource on the microcontroller device will be accessible to a given I/O pin. Furthermore, embodiments of the present invention can access the rest of the microcontroller device functions through a configurable interface and can be reconfigured dynamically (e.g., per clock cycle). The present invention provides a configurable input/output interface which gives designers the flexibility to easily create customized configurations which incur no NRE and require no unusual design skills.

The present invention is an input/output (I/O) pin with a configurable interface to a microprocessor, and to a global mapping which determines access to functional units on the microcontroller. The I/O pin can be selectively coupled to the global mapping or to the microprocessor on each clock cycle. The mapping configuration selectively couples a different functional unit or units of the microcontroller to access the I/O pin on each clock cycle. The interface between the I/O pin and the rest of the system can be dynamically configured by software created or modified by a user, or by hardware. The present invention facilitates repositioning pin locations on a microcontroller because it is a software modification rather than a hardware modification. The present invention further enables the microcontroller functions to be configured by the user rather than by the microcontroller vendor.

Figure 25:
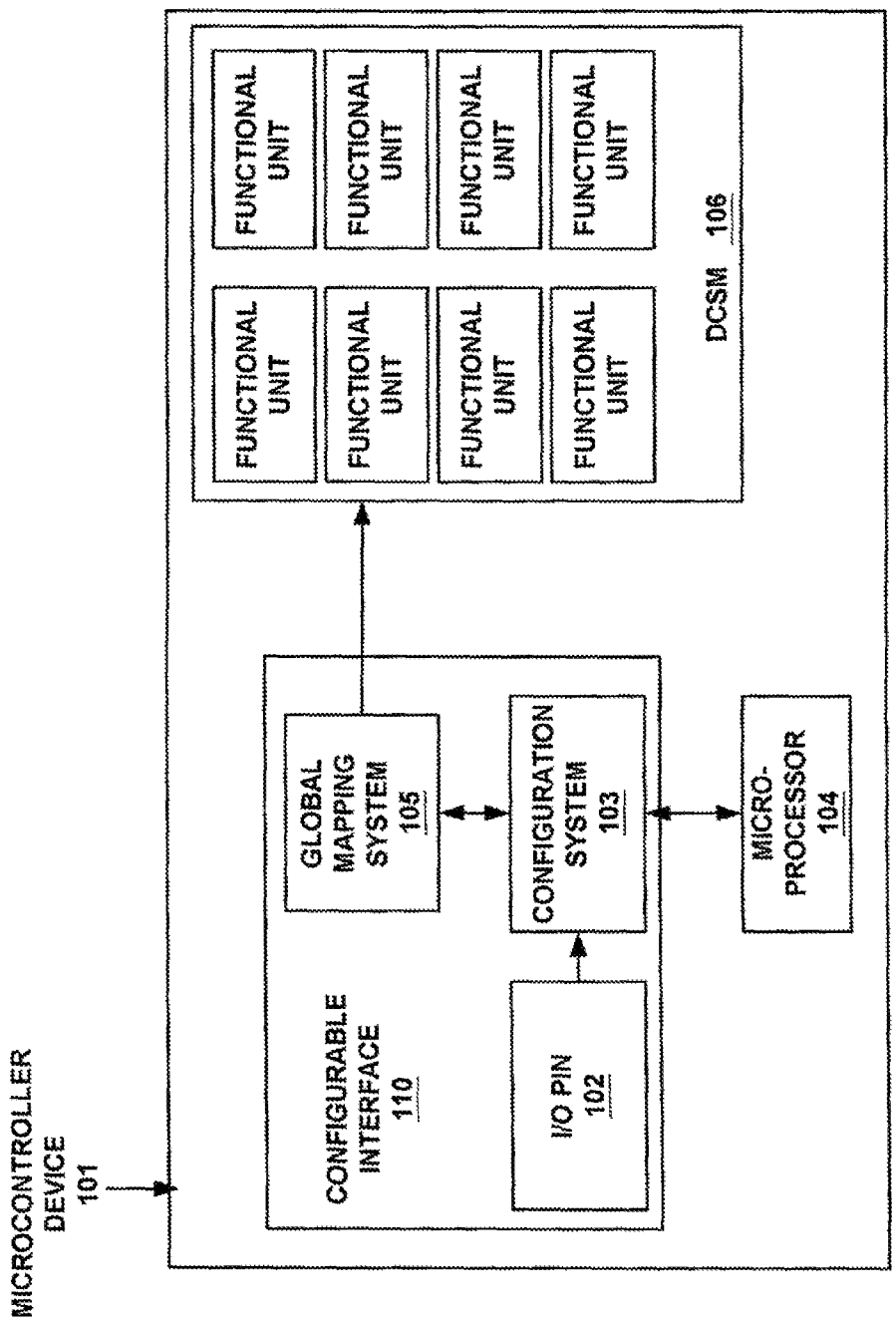
FIG. 25 is a block diagram of a microcontroller device with a configurable input/output interface as embodied by the present invention.

FIG. 25 is a block diagram showing a microcontroller device 101 having a configurable interface 110 consisting of input/output (I/O) pin 102, configuration system 103, and global mapping system 105. Configuration system 103 can, depending upon its configuration, selectively couple I/O pin 102 with either a microprocessor 104 or global mapping system 105. Global mapping system 105 is coupled with a plurality of functional units of Digital Configurable System Macro (DCSM) 106. Global mapping system 105 selectively couples I/O pin 102 with a selected functional unit or units of DCSM 106.

The functional units of DCSM 106 are programmable digital and analog units which can be configured and connected by a user as needed to create a customized microcontroller device. The digital units can be timers, controllers, serial communications units, Cycle Redundancy Check (CRC) generators, Universal Asynchronous Receiver/Transmitters (UARTs), etc. For functions that require higher precision or counting, the digital units can be combined. The analog units are programmable operational amplifier circuits which can be interconnected to create a desired amplifier circuit. Typical peripherals that can be created are amplifiers, programmable gain, digital to analog converters, analog to digital converters, analog drivers, and high-, low-, and band-pass filters, etc. Higher order user modules such as modems, complex motor control, and complete sensor signal chains can be created from these building blocks. The ability to program microcontroller device 101 to suit a particular application necessitates a reconfigurable 1/0 interface which is provided by the present invention.

FIG. 26 is a block diagram of a configurable input/output interface 200 for a microcontroller as embodied by the present invention. For purposes of clarity, the following discussion will utilize the block diagram of FIG. 26 with flow chart 300 of FIG. 27, to describe one embodiment of the present invention.

In one embodiment, I/O pin 102 and configuration system 103 are integrated into a pin unit. A plurality of these integrated pin units are combined to create a port. However, each of the pin units in a port is still operable to be addressed individually by global mapping system 105. In one embodiment, 8 of these integrated pin units comprise each port. However, while the present embodiment recites an 8-pin port, the present invention is well suited to utilize ports with other numbers of pins as well. An 8 pin port is recited so that disproportionate amounts of addressing resources are not used by the I/O interfaces.

Figure 27:
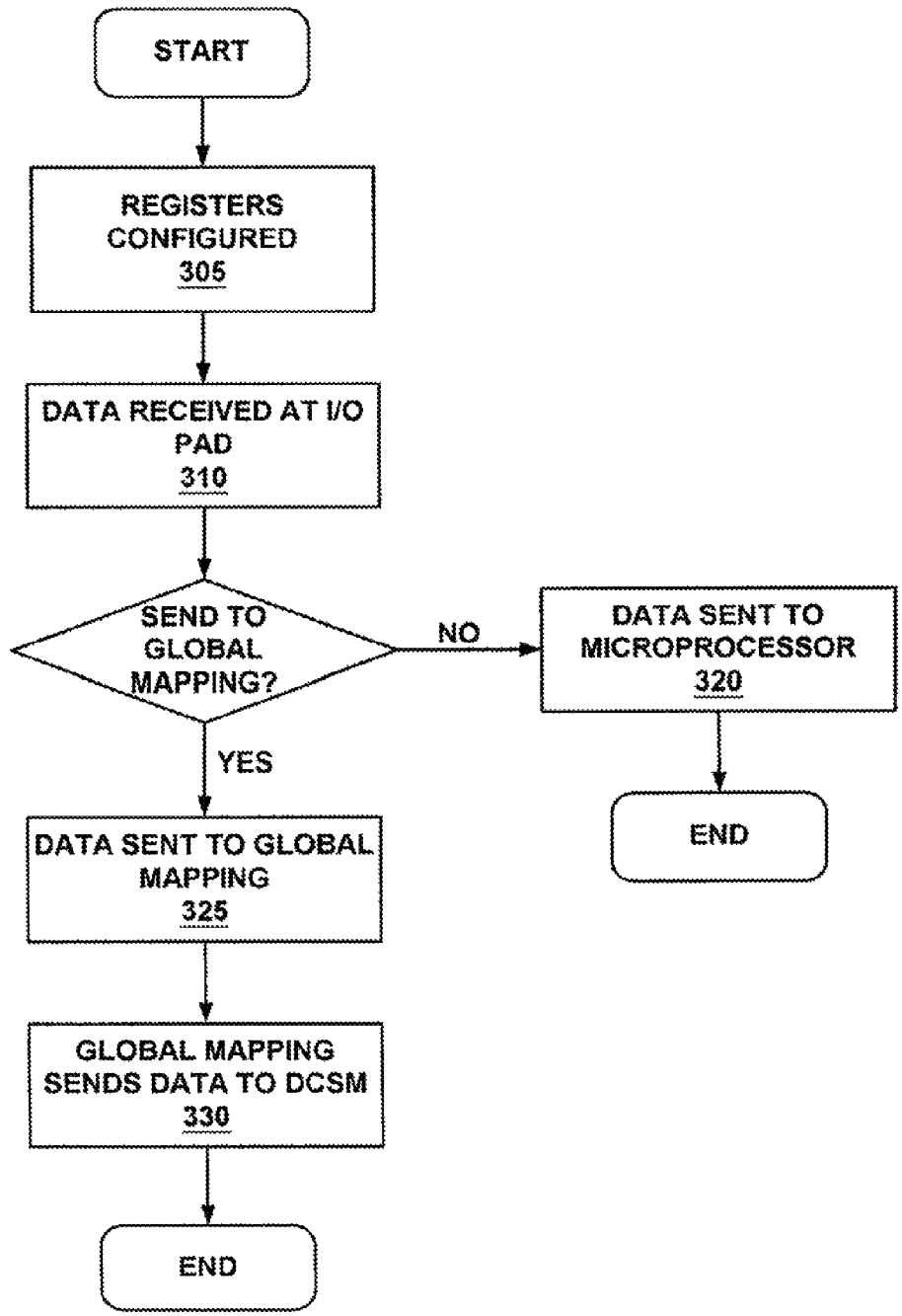
FIG. 27 is a flowchart of a process 300 for using a configurable input/output interface for a microcontroller to input data as embodied by the present invention.

With reference to FIG. 26 and to step 305 of FIG. 27, the registers of configuration system 103 and global mapping system 105 are configured. For an input operation, these registers are in logic decoder 205 and the input global mapping 211. This configuration information can be sent from microprocessor 104 (shown in FIG. 265). However, the configuration of the global mapping is not exclusively limited to the microprocessor. Other mechanisms on microcontroller 101 which are capable of changing the configuration bits, such as a state machine, flash bits, or static RAM, can be used to change the configuration.

Global mapping system 103 is maintained by a control program which supplies the logic to selectively couple I/O pin 102 with functional units of DCSM 106. The programming of the control program is done by the user which allows greater flexibility than using a pre-determined mapping scheme provided by a silicon vendor. The control program also facilitates reconfiguring pin assignment because it is now a software modification rather than a hardware modification.

Customer firmware initializes a particular mapping by writing the configuration to registers associated with the global map. The configuration of the mapping can be changed at any time (e.g., per clock cycle). The global mapping system allows, for example, 4 separate functional units on DCSM 106 to send 4 different signals through the same I/O pin by coupling a particular signal from a functional unit of the DCSM to the 110 pin from cycle to cycle. In another example, a single clock signal can be simultaneously coupled to 4 different I/O pins. This facilitates interfacing with resources on microcontroller device 101 in multiple ways, either from a single or multiple pin configuration.

With reference to FIG. 26 and to step 310 of FIG. 27, data is received at I/O pad 218, and directed through receiver driver 203 by way of input bus 201.

With reference to FIG. 26 and to step 315 of FIG. 27, a logic operation is performed to determine whether data is sent to global mapping system 105 or to microprocessor 104. Depending on the configuration of logic decoder 205 done in step 305, the data is sent either to input global mapping 211 of global mapping system 105 or to microprocessor 104. A signal from control bus 217 indicates to logic decoder 205 which bus driver to enable.

With reference to FIG. 26 and to step 320 of FIG. 27, the data is sent to microprocessor 104 and process 300 ends at this point. Bus driver 206 couples I/O pad 218 to data bus 208, thus giving microprocessor 104 access to the circuit.

With reference to FIG. 26 and to step 325 of FIG. 2700, data is sent to input global mapping 211. This is the result of logic decoder 205 being configured by the control program to send the data to global mapping system 105 in step 305. Bus driver 207 couples I/O pin 102 to global input bus 209 and thus to input global mapping 211.

With reference to FIG. 26 and to step 330 of FIG. 27, input global mapping 211 sends the data to the DCSM 106 and process 300 ends at this point. Global mapping 211 is configured by the control program in step 305 to send the data to a specific functional unit or units of DCSM 106.

Figure 28:
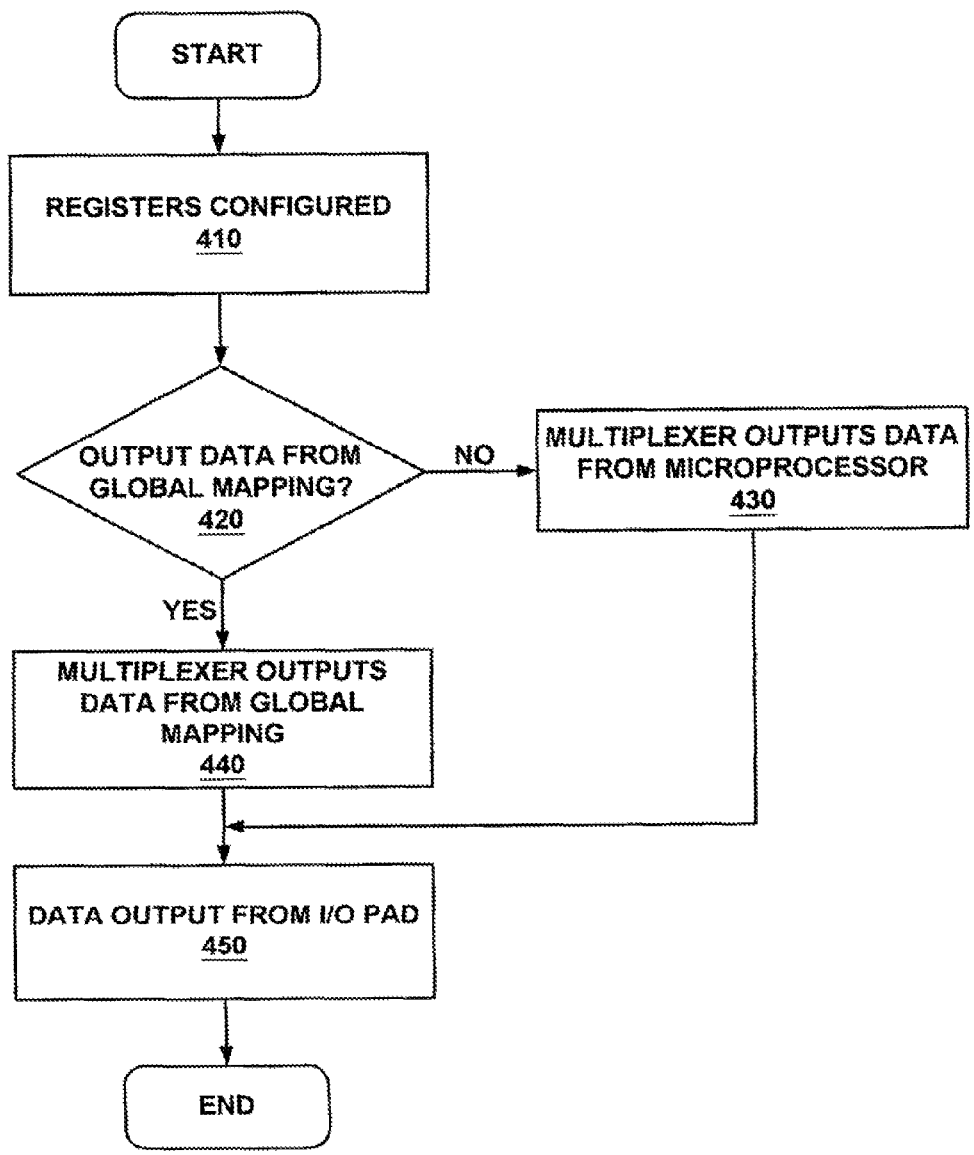
FIG. 28 is a flowchart of a process 400 for using a configurable input/output interface for a microcontroller to output data as embodied by the present invention.

FIG. 28 is a flowchart of a process 400 for using a configurable input/output interface for a microcontroller to output data as embodied by the present invention. For purposes of clarity, the following discussion will utilize the block diagram of FIG. 26 with flow chart 400 of FIG. 28, to describe one embodiment of the present invention.

Referring to FIG. 26 and to step 410 of FIG. 28, the registers of configuration system 103 and global mapping system 105 are configured. For an output operation, the registers are the configuration registers 216 and the output global mapping 212 registers. Again, a control program configures configuration registers 215 and output global mapping 212 to selectively couple I/O pin 102 with a functional unit or units of DCSM 106 or with microprocessor 104. The configuration can be done by microprocessor 104, or any mechanism on microcontroller 101 which is capable of changing the configuration bits, such as a state machine, flash bits, or static RAM, and can be changed at any time (e.g., per clock cycle).

Configuration registers 216 can also be configured to provide a variety of system functions for the I/O interface of the present invention and which can be reconfigured at any time (e.g., per clock cycle). For example, configuration registers 216 provide the capability for programmable pull-up or pull-down resistors, programmable interrupts per pin (e.g., positive edge triggered, negative edge triggered, or triggered on any change), programmable interrupt polarities and modes, and programmable drive strength. In one embodiment of the present invention, there are 8 configuration registers for each I/O pin allowing a maximum of 256 functions which could be defined for each pin. However, 2 or more registers can be used to control a particular pin function. For example, 2 registers can be used for the I/O driver to provide 4 drive strength levels, 2 registers used for interrupt polarity, etc. Thus the present invention is well suited to various register configurations to provide more or less system functions as needed.

Referring to FIG. 26 and to step 420 of FIG. 28, a logic operation takes place where multiplexer 215 reads the configuration information held in configuration registers 216 and selectively couples data from either microprocessor 104 or output global mapping 212 to output bus 202.

With reference to FIG. 26 and to step 430 of FIG. 28, multiplexer 215, as a result of the configuration of registers 216, couples data register 214 to output bus driver 204 and output bus 202. In so doing, data held in data register 214 from microprocessor 104 will be output later in process 400. A signal from control bus 217 will enable data register 214 to shift the data out to multiplexer 215.

With reference to FIG. 26 and to step 440 of FIG. 26, multiplexer 215, as a result of the configuration of registers 215, couples output global mapping 212 to output bus 102 through bus driver 213. This allows data from a functional unit or units of DCSM 106 to be output later in process 400. Global output bus 210 couples output global mapping 212 with output bus driver 213, and multiplexer 215.

With reference to FIG. 26 and to step 450 of FIG. 28, data selected at step 420 of FIG. 28 is output from I/O pad 218 and process 400 ends at this point.

A global routing matrix (e.g., global mapping system 105; FIG. 26) is configured to couple the I/O blocks to the programmable digital and programmable analog circuit blocks. Further, a system macro routing matrix (e.g., intra-block routing channels 1002, configuration system 103; FIGS. 2, 26, respectively) is configured to couple a subset of the programmable digital circuit blocks to the programmable analog circuit blocks.

Exemplary Circuit and System

Exemplary Circuit

It is appreciated that an exemplary circuit (e.g., circuit 10; FIG. 1A) incorporating an embodiment of the present invention herein may be an integrated circuit of any type, such as microcontrollers. Such a circuit will have a microprocessor (e.g., CPU 14; FIG. 1A), and a number of programmable analog circuit blocks (e.g., analog blocks 20; FIG. 1B). The circuit will also have some number of programmable digital circuit blocks (e.g., digital blocks 100; FIG. 1B) coupled, directly or indirectly, to at least one of the programmable analog circuit blocks. Further, the analog and digital blocks are coupled, directly or indirectly, to the microprocessor, for example, via a system bus (e.g., bus 11; FIG. 1A, 1B). The exemplary circuit will have at least one of its programmable digital circuit blocks configured to provide at least one of a number of mathematical functions, and at least one of its analog circuit blocks configured to provide at least one of some number of analog functions.

In the exemplary circuit, at least one of the programmable digital circuit blocks is coupled to at least one of another of the digital circuit blocks. Further, in the exemplary circuit, at least one of the programmable analog circuit blocks is coupled to at least one of another of the analog circuit blocks. This enables the exemplary circuit to effectuate at least one analog and/or digital system function.

A programmable memory (e.g., flash ROM 16, registers 50; FIGS. 1B, 16, respectively), coupled therein to the programmable analog and digital circuit blocks contains data for programming at least one of the programmable digital circuit blocks and at least one of the analog circuit blocks. The programmable memory may be effectuated in registers and/or latches (e.g., registers 50: FIG. 16), within the analog and digital blocks and elsewhere, such as in programmable interconnects between the circuit blocks, and in programmable I/O pin arrays. Programmable memory is also available in the exemplary circuit herein within a program memory, such as flash ROM (e.g., flash ROM 16; FIG. 1). This programmable memory is erasable, which may be executed electrically.

A number of input and/or output blocks (e.g., pin by pin configurable I/O transducers 18; FIG. 1B) are coupled directly or indirectly to at least one of the programmable memory, the digital circuit blocks, the analog circuit blocks, and the microprocessor. At least one of the input and/or output blocks sends signals to the microprocessor. At least one of the input and/or output blocks sends signals to the analog and to the digital circuit blocks. At least one of the input and/or output blocks (I/O blocks) sends signals to the programmable memory. Further, at least one of the analog circuit blocks sends signals to at least one of the digital circuit blocks. At least one of the I/O blocks sends signals to the programmable memory, and at least one of the I/O blocks sends signals to the microprocessor.

In the present exemplary circuit, a number of registers is configured to store programming data for the programmable digital circuit blocks. Some number of latches is configured to store programming data for the programmable analog circuit blocks.

A global routing matrix (e.g., global mapping system 105; FIG. 26) is configured to couple the I/O blocks to the programmable digital and programmable analog circuit blocks. Further, a system macro routing matrix (e.g., intra-block routing channels 1002, configuration system 103; FIGS. 2, 26, respectively) is configured to couple a subset of the programmable digital circuit blocks to the programmable analog circuit blocks.

Programmable digital blocks may programmatically communicate with other programmable digital blocks. Programmable analog blocks may programmatically communicate with other analog blocks. Further, programmable digital blocks and programmable analog blocks may programmatically intercommunicate.

The programmable analog circuit blocks may, in one embodiment, be constituted by a matrix of n by m analog configurable system macros, n and m independently being an integer of at least two. Each of said analog configurable system macros is configured to provide one or more analog functions, which may include gain functions, comparator functions, switched capacitor functions, filter functions, analog-to-digital conversion functions, digital-to-analog conversion functions, and amplifier functions, among others. The programmable analog circuit, constituted by a matrix of n by m number of programmable analog circuit blocks, each coupled to an adjacent block and configured to provide at least one of a plurality of analog functions. In the exemplary circuit herein, at least two of the number of programmable digital circuit blocks are coupled in series to provide a digital system function.

In the programmable digital circuit according to one embodiment, at least three programmable digital circuit blocks are coupled in series and/or in parallel. Each programmable digital circuit block is (i) controlled by an n-bit register or look-up table containing programming information including a cascading bit and (ii) configured to provide at least one of a plurality of mathematical functions, wherein the cascading bit determines whether a particular programmable digital circuit block is coupled is series with an adjacent programmable digital circuit block, and when programmed, the programmable digital circuit provides at least one digital system function.

Exemplary System

Thus, an exemplary system (e.g., system 10; FIG. 1A, 18) is effectuated by the exemplary circuit herein. The exemplary system is constituted by a microcontroller (e.g., as effectuated by bus 11, SRAM 12, ROM 16, and microprocessor 16, etc.; FIG. 1A, 18), a subsystem constituted by a functionality (e.g., SoC blocks 25; FIG. 1A; 18) coupled (e.g., via system bus 11; FIG. 1A, 18) to the microcontroller, and a coupling mechanism (e.g., pin by pin configurable I/O transceivers 18; FIG. 1B) coupled to the subsystem. The functionality is configurable to selectively execute a first function (e.g., analog and/or digital) according to an input of a first type (e.g., a function-designating configuration setting). The coupling mechanism is configurable to implement a connectability state for the system by which the system is connectable to an external entity according to an input of a second type (e.g., a pin activation/deactivation, and/or pin function designating program). The functionality, as configured herein, may perform digital function, an analog function, or a mix of analog and digital functions.

The system is further constituted by an interconnecting mechanism, and the functionality further constituted by a first sub-functionality (e.g., analog SoC blocks 20; FIG. 1B, 1C) performing the analog functions and a second sub-functionality (e.g. digital SoC blocks 100; FIG. 1B, 1C) performing the digital functions. The interconnecting mechanism is configurable to interconnect the first sub-functionality and the second functionality according to an input of a third type, e.g., an intrafunctionality (e.g., within SoC block 25; FIG. 1A, 1B, 1C) interconnection configuring program.

Further, the exemplary system herein is constituted in part by a timing functionality (e.g., system timing block 19; FIG. 1B), which is configurable to generate a number of time bases according to an input of a fourth type (e.g., a time base selection configuration setting).

Exemplary Method of Configuration of Functions

Figure 29:
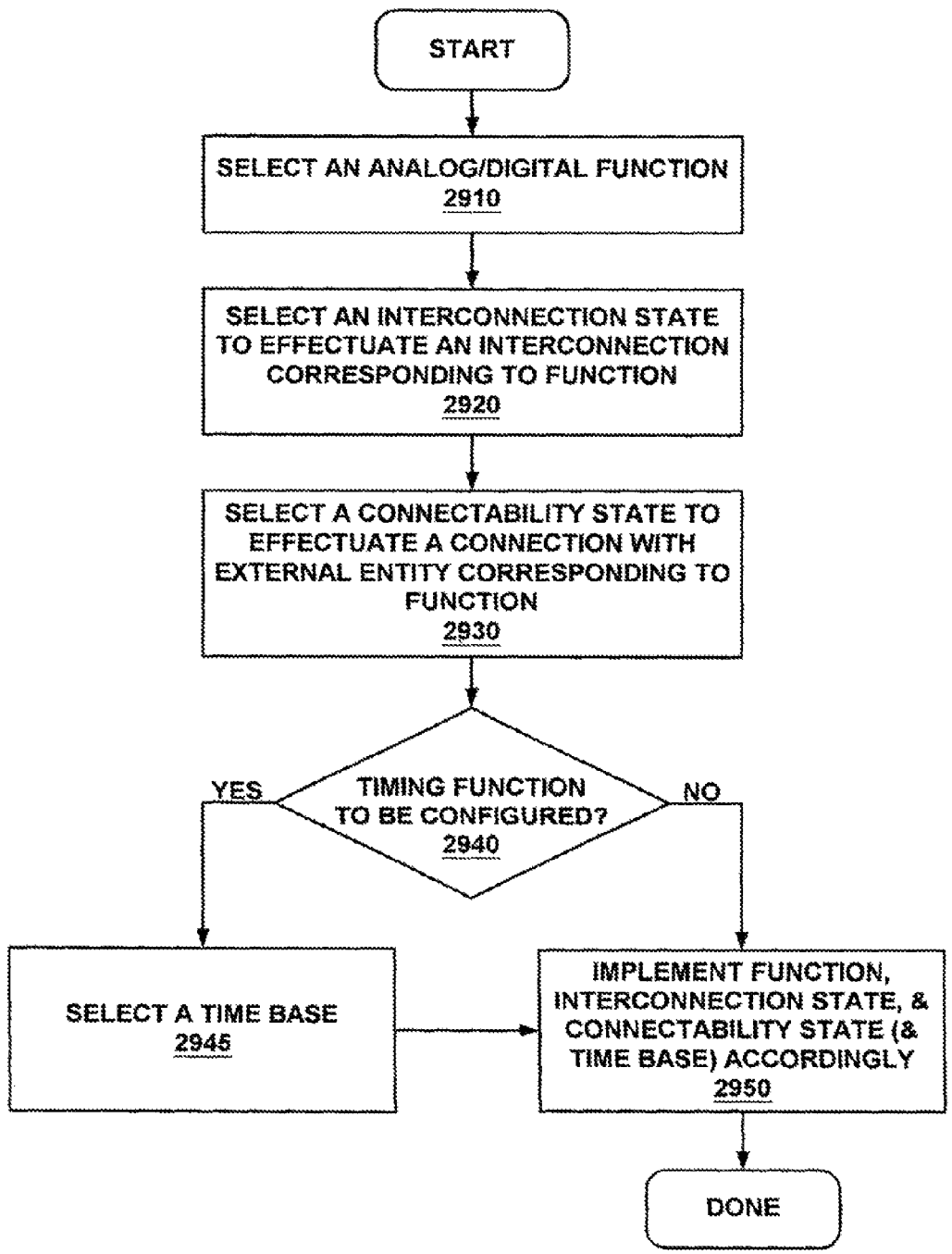
FIG. 29 is a flowchart of a process 2900 for configuring a system, in accordance with one embodiment of the present invention.

With reference to FIG. 29, a process 2900 for configuring a system (e.g., system 10; FIG. 1B) is described. Beginning in step 2910, an analog and/or digital function is selected. This function may be effectuated in part by one or more functional units, e.g., functionalities, which may, in one embodiment, be analog and digital functionalities (e.g., analog and digital SoC blocks 20 and 100, respectively; FIG. 1B).

In step 2920, an interconnection state between analog and digital functionalities, and between the functionalities and the rest of the system, including an integrated circuit, which in one embodiment may be a microcontroller, is selected. The interconnection state is one capable of effectuating the selected function. The interconnection state may be set within a programmable interconnecting mechanism (e.g., programmable interconnect 1002; FIG. 18).

A connectability state is then selected; step 2930. The connectability state is one capable of effectuating a functional connection with an external entity, which can be any other system, electronic device, communication medium, or any other functional entity outside of the system. The connectability state may be set within a programmable, e.g., configurable, electrical and/or communicative coupling mechanism (e.g., pin by pin configurable 110 transceivers; FIG. 1B). In one embodiment, an exemplary connectability state may be achieved by activating certain connection pins, ports, and/or other mechanism components by coupling them to particular signal sources, such as the analog and digital functionalities, within the system. In one embodiment, an exemplary connectability state may be achieved by activating certain connection pins, ports, and/or other mechanism components, and deactivating others.

In step 2940, it is determined whether or not a timing function is to be configured. Process 2900 proceeds as determined by the outcome of this decision.

If in step 2940, it is decided that a timing function is to be configured, a time base is selected in step 2945. The time base, in one embodiment, may be any of a myriad of possible timing and/or other periodic signals of various waveforms, generated by a system timing functionality (e.g., system timing block 19; FIG. 1B). The time base may be provided for use by any of the analog and digital functionalities in performance of their configured function, wherein the selected function requires a timing reference of a particular frequency, period, amplitude, and/or waveform.

For example, in certain functional situations, a digital functionality may be configured to perform a UART function, which would require a particular time base input from the system timing functionality. In another example, an analog functionality may be configured to perform a conversion and/ or modulation function, which would also require a particular time base input from the system timing functionality.

After selection of a time base (step 2945), or if it was determined in step 2940 that no timing function was to be configured, process 2900 proceeds via step 2950, wherein the selected function, interconnection state, and connectability state (and time base, if selected in step 2945) are implemented. The implementation of the function, interconnection state, and connectability state (and time base, if selected in step 2945) may, in one embodiment, be implemented simultaneously. In another embodiment, the may be implemented sequentially. In yet another embodiment, they may be implemented by a combination of simultaneous and sequential actions. Process 2900 is complete upon full, successful execution of step 2950.

Process 2900 may be implemented by any effective mechanism for effectuating a user input upon the system, including, but not limited to, generation and transmission of appropriate electrical, electronic, optical, digital, analog, and/or any other communicative signals provided to the system by any effective external agent, such as a computer system or any other signal generating and inputting system. Thus, process 2900 may be implemented by a programmed agent operating automatically and executing a program to effectuate process 2900 and its corresponding purposes.

In summary, the present invention provides an integrated system with a microcontroller and integrated circuits (IC), on a single chip to effectuate a system on a chip, including analog and digital functionality, and a method of configuring such an integrated system. The present invention also provides a system on a chip, which has sufficient flexibility to function in a very wide range of multiple applications, including applications wherein integrated analog functionalities are required. Further, the present invention provides a method of programming and dynamically reconfiguring a system on a chip, and a system on a chip, which is so programmable and dynamically reconfigurable. Further still, the present invention provides a system on a chip, which achieves the foregoing advantages and yet is relatively inexpensive and simple to configure, apply, use, and reconfigure.

Embodiments of the present invention are directed to a microcontroller device having a microprocessor, programmable memory components, and programmable analog and digital blocks. The programmable analog and digital blocks are configurable based on programming information stored in the memory components. Programmable interconnect logic, also programmable from the memory components, is used to couple the programmable analog and digital blocks as needed. The advanced microcontroller design also includes programmable input/output blocks for coupling selected signals to external pins. The memory components also include user programs that the embedded microprocessor executes. These programs may include instructions for programming the digital and analog blocks "on-the-fly," e.g., dynamically. In one implementation, there are a plurality of programmable digital blocks and a plurality of programmable analog blocks.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

An embodiment of the present invention, a microcontroller programmable system on a chip is thus described. While the present invention has been described in particular embodiments, it should be appreciated that the present invention should not be construed as limited by such embodiments, but rather construed according to the below claims.

What is claimed is:

1. An integrated circuit comprising:
   a plurality of programmable analog blocks;
   a plurality of programmable digital blocks;
   a programmable interconnect coupled to at least one of the programmable analog blocks and at least one of the programmable digital blocks;
   a programmable Input/Output (I/O) interface coupled to the programmable interconnect and
   a plurality of configuration register bits coupled to the programmable I/O interface.

2. The integrated circuit of claim 1, further comprising a programmable system timing block coupled to the programmable interconnect.

3. The integrated circuit of claim 2, wherein the programmable system timing block is configured to provide a clock signal to at least one programmable analog or programmable digital block.

4. The integrated circuit of claim 1, further comprising a temperature sensor coupled to at least one programmable analog block.

5. The integrated circuit of claim 1, wherein the plurality of programmable analog blocks comprise a first programmable analog block type and a second programmable analog block type.

6. The integrated circuit of claim 5, wherein the first programmable analog block type comprises a switched capacitor circuit and the second programmable analog block type comprises a continuous time circuit.

7. The integrated circuit of claim 1, wherein the programmable I/O interface comprises an input bus and an output bus.

8. The integrated circuit of claim 1, wherein the operation of the plurality of programmable analog blocks is controlled by the plurality of programmable register bits.

9. The integrated circuit of claim 1, wherein the operation of the plurality of programmable digital blocks is controlled by the plurality of programmable register bits.

10. The integrated circuit of claim 1, wherein the connectivity of the programmable interconnect is controlled by the plurality of programmable register bits.

11. A method of configuring an integrated circuit comprising:
    providing a plurality of programmable analog blocks of a first type;
    providing a plurality of programmable digital blocks;
    providing a programmable interconnect coupled to at least one of the programmable analog blocks and at least one of the programmable digital blocks;
    providing a programmable Input/Output (I/O) interface coupled to the programmable interconnect;
    providing a plurality of configuration register bits coupled to the programmable I/O interface and
    configuring the plurality of programmable register bits to control the operation of the integrated circuit.

12. The method of claim 11, further comprising providing a programmable system timing block and coupling the programmable system timing block to the programmable interconnect.

13. The method of claim 12, further comprising configuring the programmable system timing block to provide a clock signal to at least one programmable analog or programmable digital block.

14. The method of claim 11, further comprising providing a temperature sensor and coupling the temperature sensor to at least one programmable analog block.

15. The method of claim 11, further comprising providing a plurality of programmable analog blocks of a second type.

16. The method of claim 11, further comprising providing an I/O input bus and an I/O output bus within the I/O interface.

17. The integrated circuit of claim 11, further comprising loading at least some of the programmable register bits with data retrieved from a non-volatile memory.

18. A system comprising:
 a microprocessor coupled to a system bus;
 a plurality of programmable analog blocks;
 a plurality of programmable digital blocks;
 a programmable interconnect coupled to at least one of the programmable analog blocks and at least one of the programmable digital blocks and to the system bus;
 a programmable Input/Output (I/O) interface coupled to the programmable interconnect and
 a plurality of configuration register bits coupled to the system bus.

19. The system of claim 18, further comprising a non-volatile memory coupled to the microprocessor, wherein the microprocessor is configured to retrieve configuration data from the non-volatile memory and load the configuration data into the plurality of configuration register bits.

20. The system of claim 18, further comprising a system timing block coupled to the programmable interconnect and configured to provide a clock signal to at least one programmable digital or programmable analog block.

* * * * *